United States Patent
Williams et al.

[11] Patent Number: 6,078,090
[45] Date of Patent: Jun. 20, 2000

[54] TRENCH-GATED SCHOTTKY DIODE WITH INTEGRAL CLAMPING DIODE

[75] Inventors: Richard K. Williams, Cupertino; Shekar S. Malikarjunaswamy, Santa Clara; Jacek Korec, San Jose; Wayne B. Grabowski, Los Altos, all of Calif.

[73] Assignee: Siliconix Incorporated, Santa Clara, Calif.

[21] Appl. No.: 08/832,012

[22] Filed: Apr. 2, 1997

[51] Int. Cl.[7] .......................... H01L 27/095; H01L 29/48
[52] U.S. Cl. ........................... 257/476; 257/655; 257/334
[58] Field of Search ................................. 257/475, 471, 257/476, 480, 481, 482, 655, 656, 603, 264, 483, 330, 331, 334

[56] References Cited

U.S. PATENT DOCUMENTS

| | | | |
|---|---|---|---|
| 4,982,260 | 1/1991 | Chang et al. | 257/475 |
| 5,241,195 | 8/1993 | Tu et al. | 257/155 |
| 5,365,102 | 11/1994 | Mehrotra et al. | 257/475 |

FOREIGN PATENT DOCUMENTS

| | | | |
|---|---|---|---|
| 2-137368 | 5/1990 | Japan | 257/475 |
| 3-24767 | 2/1991 | Japan | 257/475 |

*Primary Examiner*—Donald L. Monin, Jr.
*Attorney, Agent, or Firm*—Skjerven, Morrill, MacPherson, Franklin & Friel LLP; David E. Steuber; James E. Parsons

[57] ABSTRACT

A trench-gated Schottky diode of the kind described in U.S. Pat. No. 5,365,102 is provided with an integral clamping diode which protects the gate oxide from damage from high electric fields and hot carrier generation when the device is reverse-biased. The clamping diode is arranged in parallel with the normal current path through the Schottky diode and comprises a PN junction created by a diffusion of opposite conductivity to the semiconductor material of the Schottky diode. In a preferred embodiment, the clamping diode is selected to prevent significant impact ionization near the trenched gate during either steady state- or deep depletion-induced avalanche breakdown.

66 Claims, 51 Drawing Sheets

TRENCH-GATED SCHOTTKY DIODE WITH INTEGRAL CLAMPING DIODE

BACKGROUND OF THE INVENTION

Schottky diodes are employed as rectifiers in numerous power and small signal applications where the forward conduction or switching characteristics of the diode are important. Conventional silicon PN junction diodes have a number of disadvantages, including: (i) a large voltage drop of approximately 700 mV or higher (depending on the level of operating current) when the diode is in its forward conducting state, and (ii) the diode's characteristic of storing a large number of minority carriers when it is in the forward conducting condition, which slows the diode's turn off time and leads to numerous problems relating to diode reverse recovery such as increased power loss, heating, noise and reduced circuit efficiencies.

FIGS. 1a and 1b illustrate the basic reverse recovery problem in conventional silicon PN diodes. FIG. 1a illustrates a common circuit configuration leading to forced diode "reverse" recovery losses, while FIG. 1b describes the voltage and current waveforms which occur during switching operation. During interval $\Delta t_1$ the diode D1 is forward biased to some predetermined current density and forward voltage drop. During interval $\Delta t_2$ some device in series with the diode (such as a MOSFET M1) diverts the current from the current source I1 and causes the current through the junction of diode D1 to decrease at a predetermined slew rate dI/dt. Eventually, in interval $\Delta t_3$ the polarity of the current in diode D1 reverses because its cathode has become more positive than its anode. Since the charge that was stored in diode D1 has not fully been removed, however, diode D1 continues to conduct (in a reverse direction) even though it is reverse-biased. Eventually, the stored charge will be removed (either by recombination or diffusion) and diode D1 will "recover", i.e. stop conducting. The term "reverse recovery" refers to this temporary operating condition wherein current is flowing in a device biased into an reverse polarity.

At the onset of interval $\Delta t_4$, magnitude of the reverse current through diode D1 reaches a peak and begins to decline. At the same time, the reverse voltage across diode D1 begins to rise sharply. The simultaneous presence of substantial voltage and conduction current in diode D1 leads to a power loss and undesirable heating in the diode itself. In a actual application heat generated in the diode is lost power no longer available to do work in the system, and a decrease in efficiency results. The rapid change in voltage likewise produces electrical noise which can be coupled into other parts of the circuit or system. Finally, during interval $\Delta t_5$, as a result of stray inductance the voltage across diode D1 overshoots the supply voltage $V_{CC}$. This can lead to oscillations, noise, further power loss or even avalanche breakdown.

In an actual application, the current source I1 may be an inductor as long as the switching frequency is fast relative to the natural R/L time constant of the system. Such a configuration occurs, for example, any time a push-pull driver stage drives an inductor in a switch-mode technique such as a PWM (pulse width modulated) motor driver or switch mode power supply (e.g. in a DC/DC converter).

FIG. 2 illustrates the benefits obtained by reducing the quantity of charge stored in a diode. Both the magnitude of peak reverse recovery current ($I_{peak}$) and the duration of the reverse recovery period ($t_{rec}$) are reduced in the "low charge" diode. In practice, fast recovery times are achieved in high voltage PIN diodes by reducing minority carrier lifetime through irradiation or platinum doping and in lower voltage applications (below 100V) using a metal-to-silicon Schottky barrier diode instead of a PN junction. At low voltages, the Schottky diode is preferred to the PN junction diode because of its lower forward voltage drop. FIGS. 3a and 3b illustrate the I-V characteristics on both linear and semi-logarithmic graphs. The current I is normalized by area and is represented as the variable J having units of amps/ $cm^2$. FIGS. 3c and 3d illustrate cross-sections of a PIN diode and a Schottky diode, respectively, having the above-mentioned electrical characteristics. The Schottky diode tends to offer a faster reverse recovery time than the PN junction diode, even when lifetime reduction techniques are employed.

The major disadvantage of the Schottky diode is its relatively high offstate leakage current, which is typically orders of magnitude higher than the leakage current of a PN junction diode. Moreover, the leakage current in a Schottky diode is strongly dependent on voltage, as a consequence of reverse-voltage-induced barrier-lowering at the rectifying metal-semiconductor interface (sometimes referred to as the "Schottky interface"). Unfortunately, using a different Schottky barrier metal to adjust the barrier height and thereby reduce current leakage increases the on-state forward voltage drop across the diode, resulting in a difficult tradeoff between on-state and off-state characteristics. The well known equation $$J_r = -AT^2 e^{\frac{-q\phi_b}{kT}}$$

where the work function as given by $$\Delta\phi_b = \left(\frac{3qN_D(V_{bi} + V_r)}{8\pi^2\varepsilon_s^3}\right)^{1/4}$$

highlights the tradeoff since the work function is a function of the reverse-voltage Vr. In this equation, q is the charge of an electron ($1\times10^{-19}$ coulombs), $N_D$ is the net doping, $V_{bi}$ is the built-in potential of the metal/semiconductor interface, $V_r$ is the applied reverse bias, $\varepsilon_s$ is the permittivity of the semiconductor.

Recently attempts have been made to circumvent this tradeoff by employing a new structure of Schottky diode having a trenched gate. The trench-gated Schottky barrier diode, described in U.S. Pat. No. 5,365,102 to Baliga et al., is shown in cross-section in FIG. 4. Diode 40 is formed in an N+ substrate 42 on which an N-epitaxial layer 44 is deposited. Trenches 46 are created in the top surface of N-epi layer 44 and are lined with an oxide layer 47 and filled with a Schottky barrier metal 48, which also extends over the surface of N-epi layer 44. Diode 40 uses the trenched gate to electrostatically shield the Schottky interface from barrier lowering. In the presence of a reverse voltage, the MOS structure pinches off, i.e. fully depletes, the regions between the trenches before the barrier lowering has a pronounced effect on leakage.

While the concept of the trench gated Schottky barrier diode reduces the tradeoff between forward and reverse currents, it complicates the device by introducing new failure modes. In particular, each trench gate is an etched silicon region lined with a gate quality oxide and filled with a gate electrode material. The gate oxide is therefore subject to strong electric fields while in its off state.

This is evident from FIG. 5, which shows a cross-sectional view of a trench gated Schottky barrier diode at the onset of avalanche breakdown. The substantially horizontal lines are voltage contours, and the spacing between adjacent voltage contours indicates the strength of the electric field. The shaded regions indicate regions of especially high electric fields which are generally located in the vicinity of the trench. These strong electric fields can damage or rupture the gate oxide, particularly during switching transients where inductive loads may drive the device into breakdown. The vertical lines on the left side of the figure represent current flow in avalanche emanating from the bottom of the lefthand trench. To avoid undue complexity the current flows from the other trenches are not shown.

In avalanche breakdown, the generated carriers gain high energies accelerated by the high local electric fields. Such carriers are known as "hot" because their kinetic energy is high compared to their surroundings. The generation rate G (in units of hot carrier pairs generated per cm$^3$ per second) is an indirect indicator of the energy of the carriers. The shaded portions of FIG. 6 illustrate the regions where G is the highest, and it is evident that this condition occurs near the trench corners. Near an interface a hot carrier may surmount the interface barrier (here a silicon:silicon-dioxide barrier) and become trapped in the dielectric or the interface, altering the charge balance and redistributing the electric field contours. Repeated charge injection subsequently leads to gate oxide wearout and permanent damage to the device. FIG. 6 includes the equipotential and current flow lines that are shown in FIG. 5.

Another form of reliability risk to the trench gate occurs during a voltage transient. The silicon/gate oxide/gate electrode combination acts as an MOS capacitor. Unless a source of carriers is present in a MOS capacitor, a voltage transient resulting in depletion of the silicon can produce a depletion region which extends wider than the equilibrium value $$X_{dmax} = \sqrt{\frac{2\epsilon_s(2\phi_f + V_r)}{qN_D}}$$

where $V_r$ is the bias across the capacitor, $\epsilon_s$ is the permittivity of silicon (equal to 3.9(8.854×10$^{-14}$ F/cm$^2$), q is the unit charge of an electron (1.6×10$^{-19}$ coulombs), and $N_D$ is the doping level of the silicon. The Fermi potential also reflects the doping by the relation $$\Phi_f = \frac{kT}{q}\ln\frac{N_D}{n_i}$$

where $n_i$ is the intrinsic carrier concentration (around 1.4× 10$^{10}$ cm$^{-3}$ for silicon), and k is the Boltzmann constant.

During the transient, carriers needed to form the inversion layer must be generated thermally within the space charge region. In hyper-pure long lifetime semiconductor material, this time constant can be much longer than the time of the voltage transient. Without the inversion layer, and in order to maintain charge neutrality, the depletion region must continue to expand till the charge-capacitance relationship is satisfied. Such a capacitor is said to be in "deep depletion", the same principle by which CCDs (charge coupled devices) operate. At its full extent, the depletion region in the silicon can go into avalanche temporarily. Since the peak field is at the interface, the avalanche will be located at the worst possible location-against the gate oxide. The resulting avalanche is known as a deep depletion induced avalanche. While the charge injection into the gate oxide is temporary, its effect on the life of the gate oxide is cumulative and eventually can lead to failure.

Bulucea et al., in an article entitled "Field Distribution and Avalanche Breakdown of Trench MOS Capacitors Operated in Deep Diffusion", IEEE Transactions On Electron Devices, Vol. 36, No. 11 (November 1989), analyzed the phenomenon of deep depletion transient avalanche in planar and later in trench shaped MOS capacitors and showed the effect includes both gate oxide thickness and background doping effects. FIG. 7a, taken from the Bulucea et al. article, shows the deep-depletion breakdown voltage $V_{B(WIDE)}$ of a wide-trench MOS capacitor operated in deep depletion versus the background impurity concentration $N_B$ and the gate oxide thickness $t_{ox}$. FIG. 7b, also taken from the Bulucea et al. article, shows the deep-depletion breakdown voltage $V_B$ of a narrow-trench MOS capacitor, normalized to $V_{B(WIDE)}$, versus the trench half-width w/2 and background impurity concentration $N_B$. Since the field plate effect is more pronounced for thinner gate oxides, the onset of breakdown varies in proportion to the gate oxide—the thinner the oxide the lower the breakdown. The breakdown dependence on background doping exhibits a more complex U-shaped dependence. The breakdown minimum of any curve represents the worst case (i.e. lowest breakdown) concentration where the electric fields are high but the mean free path of the carriers is relatively long. Specifically, in avalanche carriers collide with atoms within the crystal, giving up their kinetic energy and occasionally breaking the crystal bond of the atom with which they collide. If the speed of the carriers is high because they have traveled sufficiently far to accelerate to an energy capable of breaking bonds, then more electron hole pairs are generated and the critical field of breakdown drops.

If the dopant concentration is increased to a high enough value, collisions between the carriers and the ionized dopant atoms become so likely that only a few carriers ever accelerate to high speeds. Consequently fewer bonds are broken, fewer electron hole pairs are generated and the avalanche process starves for carriers, thereby increasing the critical electric field and breakdown voltage despite higher electric fields.

In summary, increasing the impurity dopant concentrations in silicon raises the strength of the electric field but lowers carrier mobility (mean free path), leading to a minimum value for avalanche in a deeply depleted MOS capacitor. For concentrations below this minimum avalanche breakdown value, a decrease in doping leads to an improvement in breakdown because the electric fields are reduced. For concentrations above the minimum avalanche breakdown value, the adverse effect of the field increase is more than compensated for by the reduced mean free path of the carriers. The ionization coefficient, a figure of merit of how easily the excited carriers form more carriers, is thereby reduced, and the breakdown increases. Since the value of fields in the silicon are determined by the capacitive "voltage divider" represented by the MOS oxide capacitor and the silicon depletion region, a thicker gate oxide demands that more voltage be applied to reach the avalanche condition, and the value of the transient breakdown increases. Some values of the maximum concentration which meets a given breakdown (from FIG. 7a) are included in the table below for convenience. Concentrations lower than 10$^{16}$ are probably not useful because of the series resistance of the diode.

| Gate ox thickness | Minimum MOS Transient Breakdown | | | | | |
| --- | --- | --- | --- | --- | --- | --- |
| | 10V | 20V | 40V | 60V | 100V | 200V |
| 100 Å | $8 \cdot 10^{17}$ | $3 \cdot 10^{16}$ | $4 \cdot 10^{15}$ | $1.8 \cdot 10^{15}$ | $5.5 \cdot 10^{14}$ | $1.5 \cdot 10^{14}$ |
| 200 Å | | $5 \cdot 10^{16}$ | $4.8 \cdot 10^{15}$ | $2 \cdot 10^{15}$ | $6.5 \cdot 10^{14}$ | $1.8 \cdot 10^{14}$ |
| 500 Å | | | $1 \cdot 10^{16}$ | $3.3 \cdot 10^{15}$ | $1 \cdot 10^{15}$ | $2.3 \cdot 10^{14}$ |
| 1000 Å | $1 \cdot 10^{18}$ | | $2.5 \cdot 10^{16}$ | $5.2 \cdot 10^{15}$ | $1.2 \cdot 10^{15}$ | $3 \cdot 10^{14}$ |
| 2000 Å | | $1 \cdot 10^{18}$ | | $2 \cdot 10^{16}$ | $2 \cdot 10^{15}$ | $4 \cdot 10^{14}$ |
| 5000 Å | | | $1 \cdot 10^{18}$ | | | $7 \cdot 10^{14}$ |
| 10000 Å | | | | $1 \cdot 10^{18}$ | $1 \cdot 10^{18}$ | $2 \cdot 10^{15}$ |

From this table we can see that unless a method is employed to prevent transient deep depletion avalanche in the trench Schottky, the device is limited to operation with voltages below 100V. If thin gate oxides (e.g. 1000 Å or below), the prior art device is practically limited to operation only at 40V.

While U.S. Pat. No. 5,072,266 to Bulucea addresses the issue of protecting the gate of a trench-gated power MOSFET, the above-mentioned U.S. Pat. No. 5,365,102 does not discuss hot carrier effects or their implications on the reliability of the trench. In regards to sustained avalanche of the trench Schottky diode, U.S. Pat. No. 5,365,102 also fails to address or discuss the energy absorbing capability of the trench-gated Schottky diode. In the circuit shown in FIG. 8, for example, a diode 80 must clamp the positive voltage excursion caused by interrupting the current in the inductive load 82 or parasitic inductance. When the current is interrupted (at time $t_1$), the entire energy stored in inductive load 82 ($0.5LI^2$) will be dumped into diode 80. FIG. 8 shows the behavior of the voltage and current when this happens. The duration of this event depends on the parasitic series resistance of the circuit. The high avalanche surge current, in addition to generating hot carriers which may damage the gate oxide lining the trench can also affect the metal-silicon Schottky interface, particularly considering that a trench-gated Schottky diode is normally designed to operate at higher current densities than a conventional Schottky diode. Electromigration of the Schottky barrier metal and localized heating during large avalanche surge currents can burn the device out in hundreds of milliseconds.

Another problem during avalanche occurs in low voltage diodes where the doping is large. Such is the case if the trench gate runs into an N+ layer, for example, as shown in the cross-sectional view of FIG. 9. If the doping of the N+ layer 90 is sufficiently high that there is only a small voltage drop across the silicon of the trench MOS capacitor, then the gate oxide 92, which sees almost the entire voltage across the device, may rupture instantly. In other words, there is practically no energy absorbing capability whatsoever before the onset of device damage.

Yilmaz et al. suggested in U.S. Pat. No. 5,168,331 modifying the dopant concentration at the bottom of the trench using a counterdoping well implant into the trench to minimize impact ionization in its vicinity. This method, while it does reduce the impact ionization some at the onset of breakdown, does not improve the overall energy absorbing capability of the diode and in deep avalanche (whether transient or steady state) cannot protect the trench gate from hot carriers traveling across the counterdoped region to damage the gate oxide. Making the counterdoped region wider will also increase the diode's series resistance, thereby mitigating one of the beneficial aspects of the trench-gated Schottky diode.

What is needed is a method to protect a trench-gated Schottky diode damage arising from avalanche breakdown or hot carrier generation and to categorically prevent the electric field across the gate oxide from reaching dangerous levels.

SUMMARY OF THE INVENTION

In accordance with this invention, an integral clamping diode is formed in parallel with the rectifying metal-semiconductor interface in a trench-gated Schottky diode. The Schottky diode is formed in a semiconductor body which typically comprises silicon and includes an epitaxial layer deposited over a substrate the surface of the epitaxial layer forming the surface of the semiconductor body. The diode includes first and second trenches formed at a surface of the semiconductor body, the trenches being separated by a mesa which is doped with atoms of a first conductivity type. A gate electrode material is disposed in the trenches, which are lined with a dielectric layer to insulate the gate electrode from the mesa. A metal layer overlies a surface of the mesa, and a rectifying (or Schottky) barrier is formed at the junction between the metal later and the surface of the mesa. When the Schottky diode is forward biased, a current flows vertically through the mesa.

To protect the trenched gate, in particular the dielectric layer lining the trench, from hot carrier damage or high electric fields when the device is reverse biased, a clamping diode is formed at a PN junction between a region of first conductivity type in the semiconductor body and a diffusion of second conductivity type opposite to the first conductivity type. The clamping diode is fabricated in parallel to the current path through the mesa and is designed to experience avalanche breakdown at a reverse voltage which is lower (in terms of absolute value) than the reverse voltage at which the rectifying metal-semiconductor breaks down. In a preferred embodiment the clamping diode is selected to prevent significant impact ionization near the trenched gate during either steady state- or transient- (deep depletion) induced avalanche.

Since the forward voltage drop across the PN junction in the clamping diode is greater than the forward voltage drop across the rectifying metal-semiconductor interface, practically no current flows through the clamping diode when the device is forward biased, and therefore practically no charge is stored in the clamping diode. This avoids the reverse recovery problems described above.

Thus, in effect the diode formed at the rectifying metal-semiconductor interface "clamps" the clamping diode when the device is forward-biased, and the clamping diode clamps the rectifying metal-semiconductor interface when the device is reverse-biased.

In its preferred form, the trench is formed in an epitaxial layer, and doping of the epi layer is reduced in the vicinity of the trench but increases, either gradually or with a step transition, at a depth below that of the trench such that the clamping diode extends into the higher doped region but the trench does not. The clamping diode is also chosen to prevent the maximum electric field across the gate oxide from exceeding 4 to 5 MV/cm, or roughly 50% of the strength of a field which will cause avalanche breakdown in a silicon dioxide gate.

In the preferred embodiment, the trench forms a plurality of diode cells arrayed in a lattice arrangement of stripes, squares, rectangles, hexagons, or any other polygon, and a plurality of such clamping diodes are distributed at regular intervals throughout the lattice.

The metal-semiconductor Schottky interface may extend trench-to-trench across the entire width of the mesa, or it may be limited to a portion of the width of the mesa by a separate contact mask. The Schottky metal may coat the entire device or be defined locally by a mask.

In one embodiment, the trench-gated Schottky diode is formed in a stripe arrangement, with the clamping diodes distributed at regular intervals. In another embodiment, the PN junction clamping diode is formed at the edge of the diode to provide a PN junction termination.

The Schottky diode of this invention includes an trenched-gate region which may be filled with the Schottky metal itself, with doped polysilicon or with any other conductive material. The Schottky metal may be any metal that forms a Schottky barrier with medium or lightly-doped silicon and preferably which forms a non-rectifying or only slightly rectifying contact to heavily doped regions such as the diffusion which forms the clamping diode. Examples of acceptable Schottky metals include titanium disilicide or platinum disilicide. In one embodiment, the Schottky interface has its barrier height adjusted by an ion-implanted layer. In another embodiment, the doping concentration of the epi layer is made non-uniform either by counterdoping the region around the trenched gate or by graded doping of the epitaxial layer during deposition to form a multiresistivity structure.

The Schottky metal may be coated with another metal such as aluminum or any top metal. The top metal may likewise be formed of a sandwich construction.

This invention also includes apparatus and methods for forming such voltage-clamped trench-gated Schottky barrier diodes

BRIEF DESCRIPTION OF THE DRAWINGS

In FIG. 10a the vertical axis is the current per unit area on an linear scale; in FIG. 10b the vertical axis is the current per unit area on a logarithmic scale.

DESCRIPTION OF THE INVENTION

As described above, the trench-gated Schottky diode known to the prior art is susceptible to damage resulting from avalanche breakdown. Regardless of whether the avalanche is caused by a steady state breakdown condition such as an overvoltage or as a consequence of transient-induced deep depletion avalanche, permanent damage may occur any time carriers, i.e. electrons or holes, are injected into the gate oxide. The solution to both of these problems is the subject of this invention, a PN junction diode clamp preferably introduced at regular intervals throughout the trench Schottky diode. Adding a parallel diode does not in itself guarantee that the Schottky will be protected. To be effective, the diode must fulfill the role of clamping the voltage during avalanche so that a "substantial" avalanche current is not carried in the vicinity of the trench. In cases where the Schottky diode is operated at voltages which are above the voltage at which the gate MOS capacitor experiences deep depletion avalanche, the junction also serves as a source of carriers and thereby prevents deep depletion from ever occurring. In both cases, the regularity at which the junction diode is placed throughout the Schottky diode lattice determines its effectiveness as an avalanche clamp. Depending on the magnitude of clamping desired, the clamping diode may occupy more than half of the active (nontrench) area of the Schottky diode or as little as a few percent of the active area.

To investigate the behavior of trench-gated Schottky diodes, we calibrated a MEDICI 2D device simulation to the measured characteristics of a conventional planar Schottky diode. Introduction of the trenched-gate was found to decrease reverse-bias leakage by minimizing the aforementioned barrier lowering effect but to increase the on-state voltage drop, since the trench reduced the active Schottky area (in the simulation by a factor of 2). By increasing the doping of the epitaxial layer, the leakage of the trench-gated Schottky diode increased somewhat, but the forward drop was rapidly reduced. Our studies showed that, by optimizing the doping of the epi layer, the leakage current was reduced by roughly two orders of magnitude, and the current density could simultaneously be increased by a factor of 3.

Figure 10A:
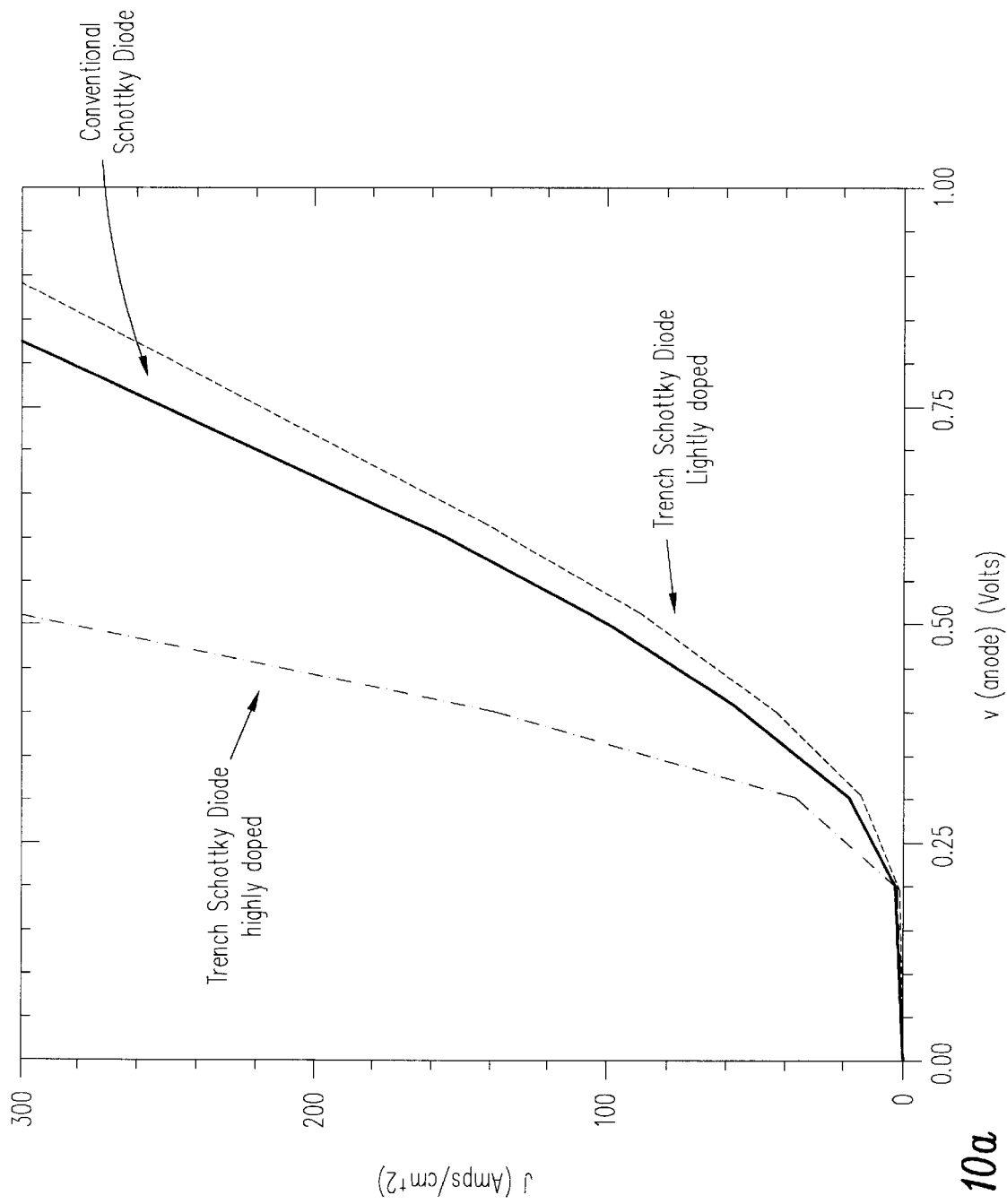
FIGS. 10a and 10b are graphs illustrating a comparison of measured forward (FIG. 10a) and reverse (FIG. 10b) current-voltage characteristics of a conventional planar Schottky diode and two trench-gated Schottky diodes having different epitaxial doping concentrations.
Figure 10B:
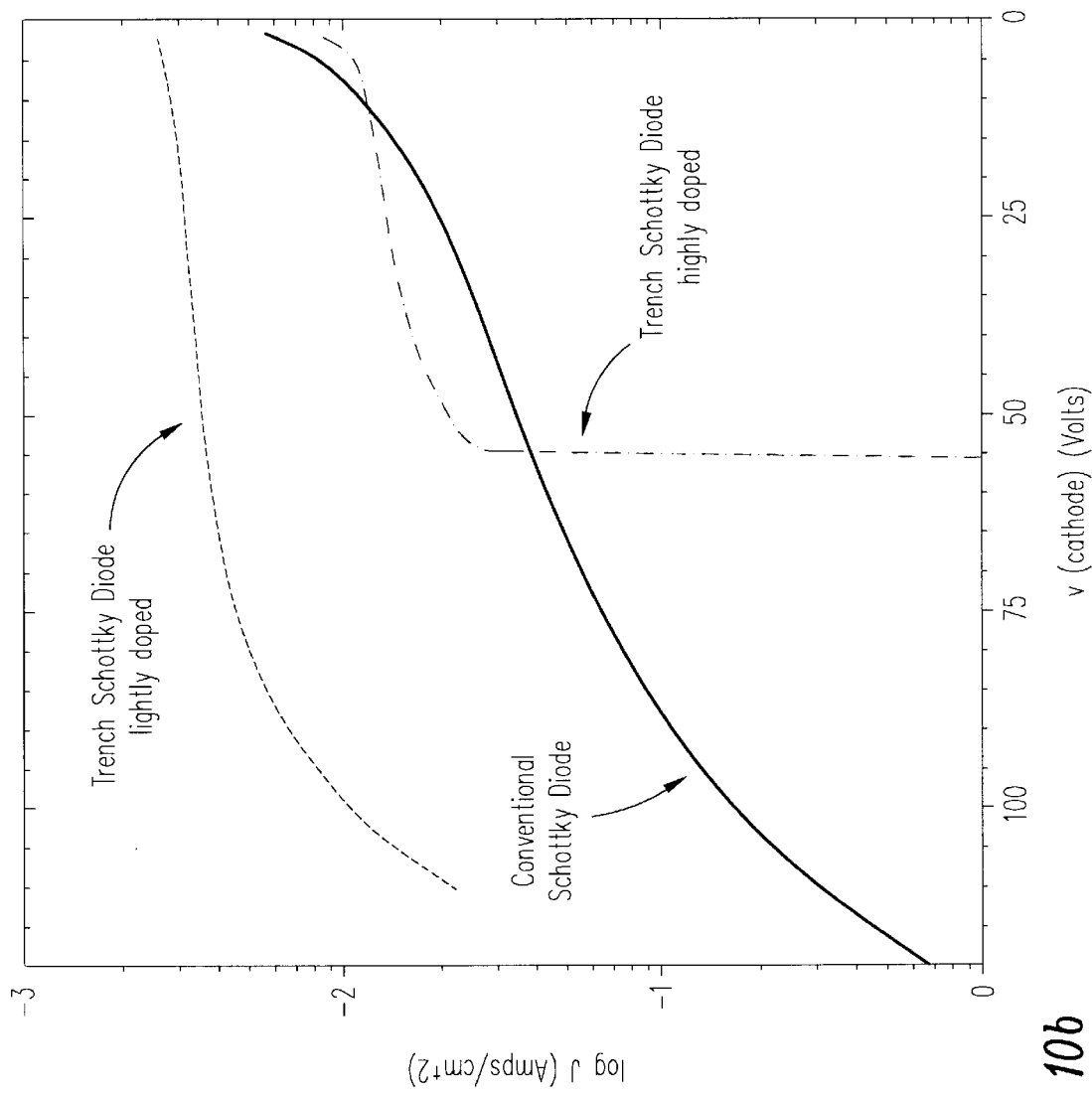

FIGS. 10a and 10b illustrate the current-voltage characteristics of a conventional planar Schottky diode, a conventional lightly doped trench-gated Schottky diode, and a highly doped trench-gated Schottky diode in accordance with this invention. Note that in Quadrant I (FIG. 10a) the highly doped trench-gated Schottky diode of this invention conducts at a slightly higher voltage than a conventional planar Schottky diode, but the current then increases very rapidly with increasing voltage so that voltage drop across the device is soon significantly lower than the voltage drop across either the conventional planar or lightly-doped trench-gated versions. In Quadrant III (FIG. 10b), the highly doped trench-gated Schottky diode of this invention has leakage characteristics which are about the same as those of the conventional Schottky diode but breakdown occurs in the clamping diode at a reverse bias of about 55 volts. The leakage current increases with increased doping concentration.

In other words, the increase in the forward voltage drop resulting from the loss of junction area due to the introduction of the trench is more than offset by doping of the epi layer at a higher level than in a conventional Schottky diode. At the same time, an acceptable leakage level is maintained. Through proper adjustment of the doping concentration and the mesa width a trade-off between the forward voltage drop and reverse leakage current superior to the results shown in FIGS. 10a and 10b can be obtained.

Moreover, the breakdown of the diode clamped trench-gated Schottky diode of this invention occurs at a specific voltage which can be controlled by adjusting the doping concentration of the deep diffusion. Thus the device of this invention is capable of absorbing energy in a relatively controlled and predictable manner. As shown in FIG. 10b, in a conventional Schottky diode the leakage current increases gradually with no clear "breakdown". This makes it difficult to predict how much energy the device can absorb without significant damage to the Schottky interface.

Figure 1A:
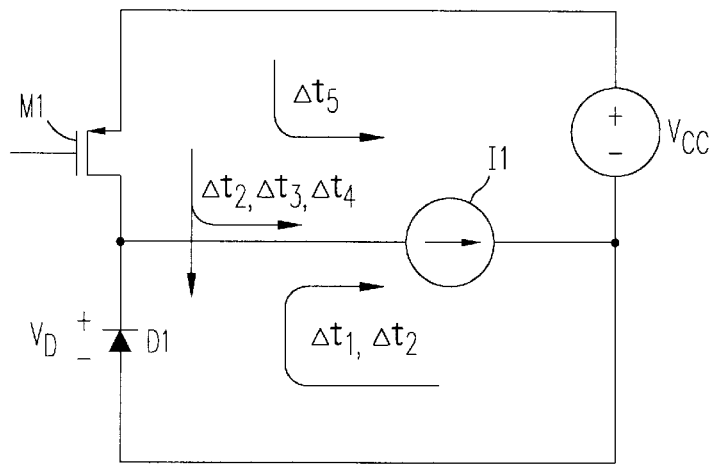
FIG. 1a is a circuit diagram used to illustrate the reverse recovery switching transients in silicon PN diodes.
Figure 1B:
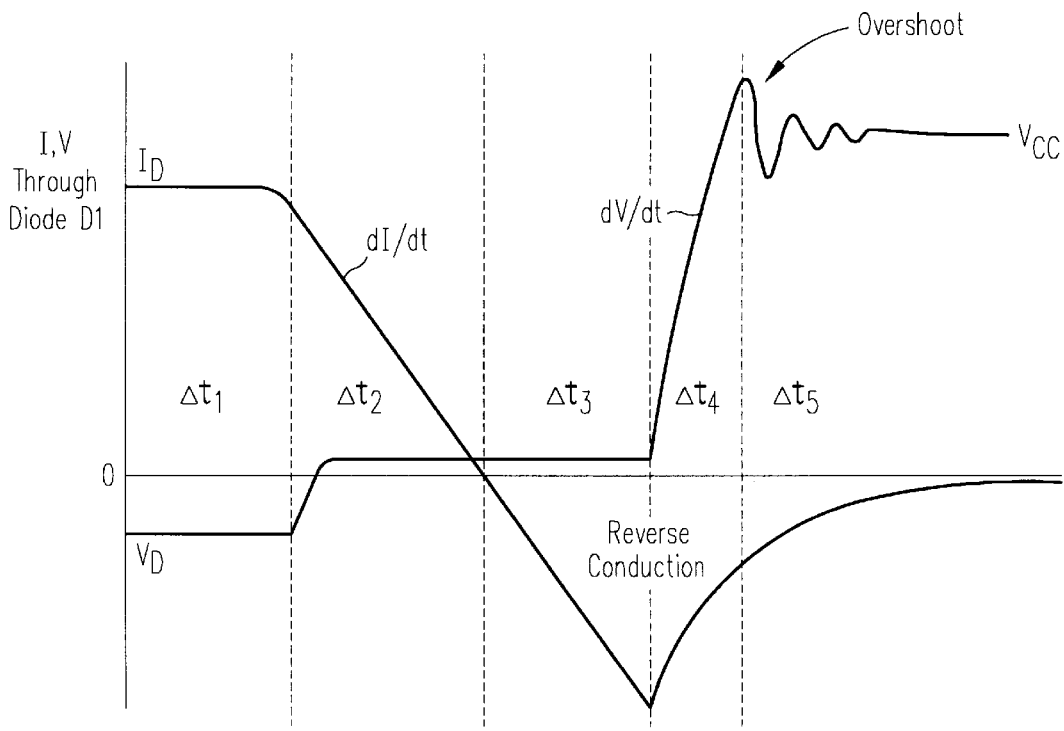
FIG. 1b is a graph of the voltage and current waveforms in a silicon PN diode when it is switched from a forward-conducting condition to a reverse biased condition.
Figure 2:
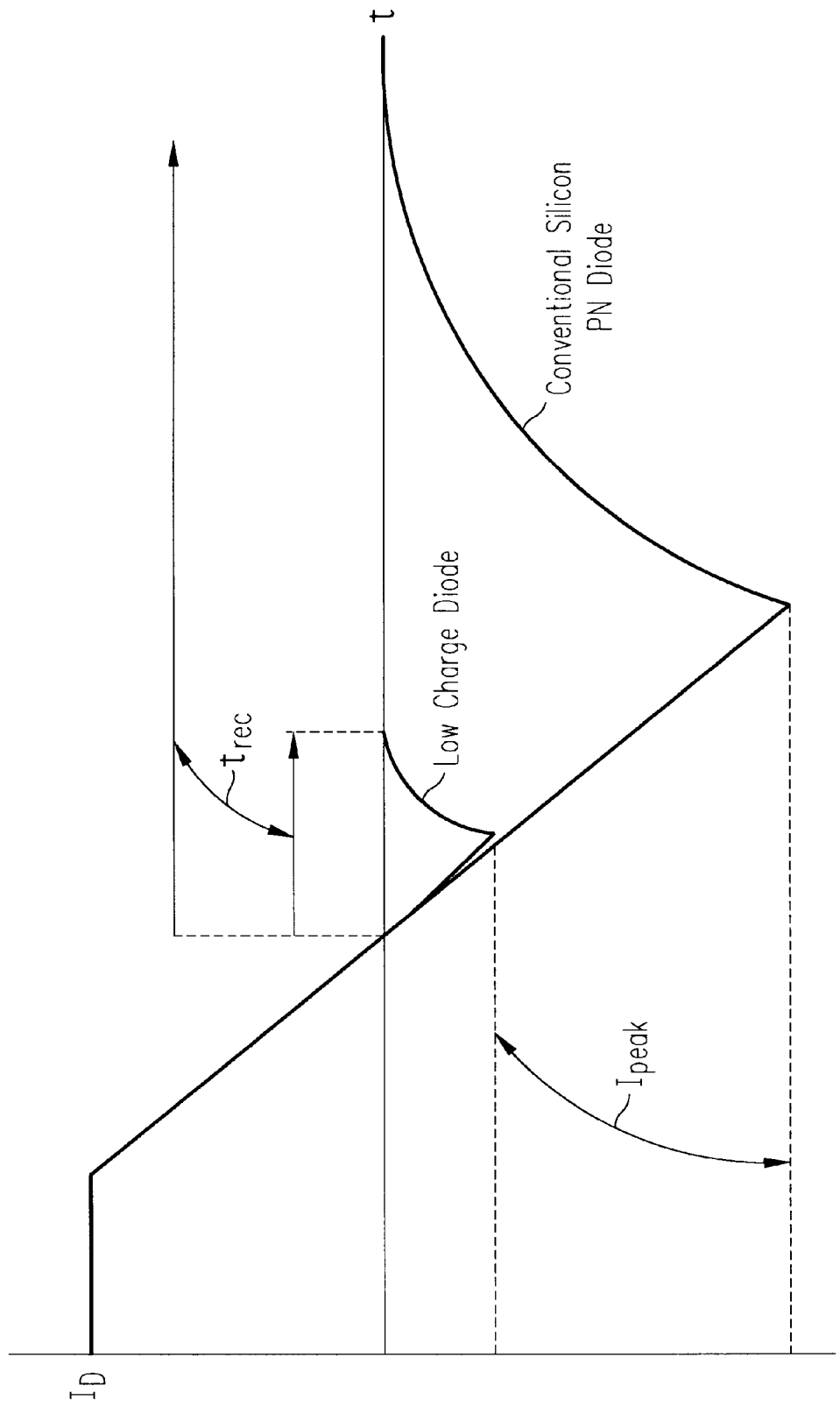
FIG. 2 is a graph showing how reducing the charge storage in a diode decreases the peak and duration of the reverse current.
Figure 3A:
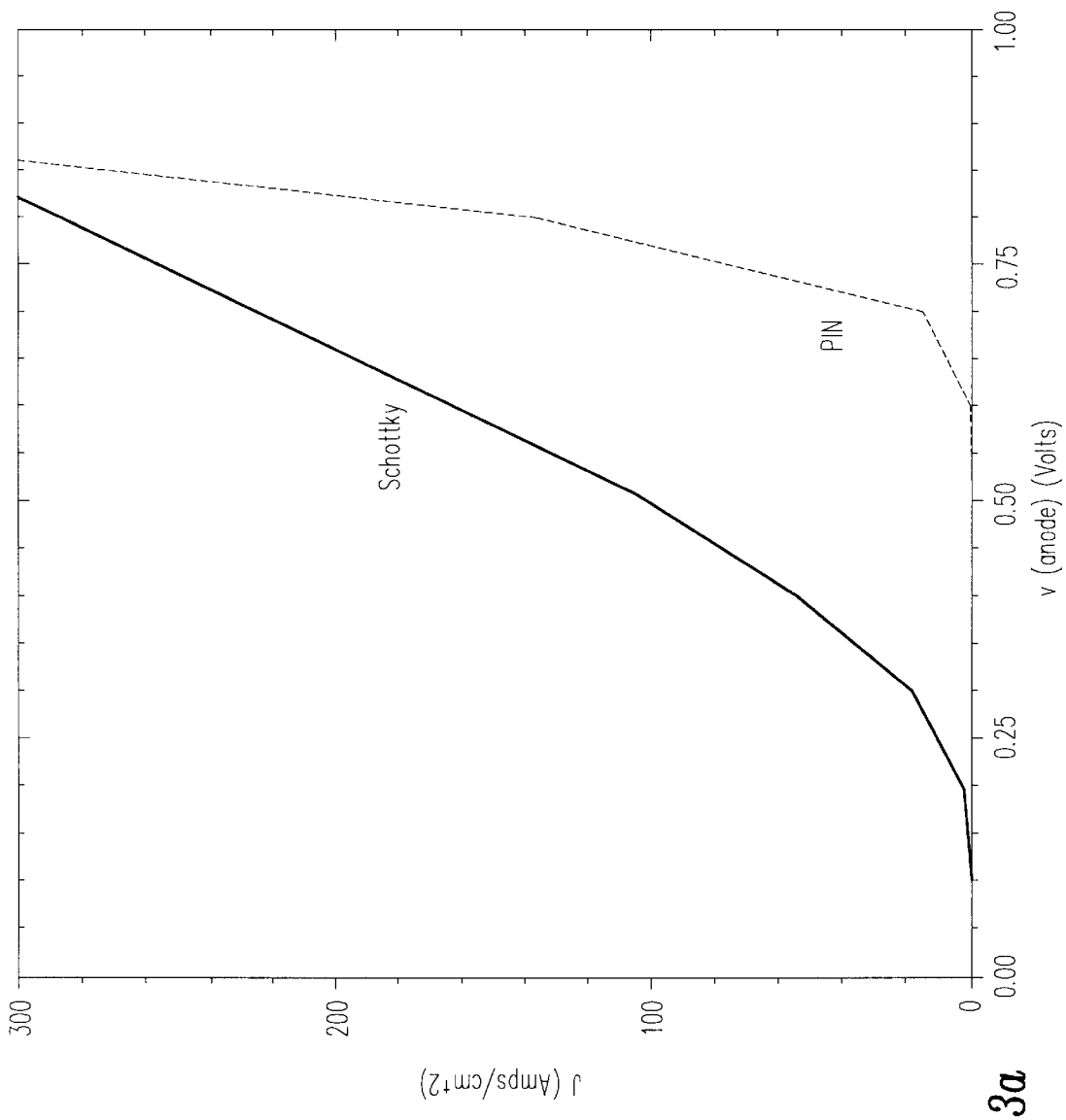
FIGS. 3a and 3b are graphs showing the forward conduction characteristics of Schottky and PN junction diodes, with the current (normalized by area) plotted on linear and logarithmic scales, respectively.
Figure 3B:
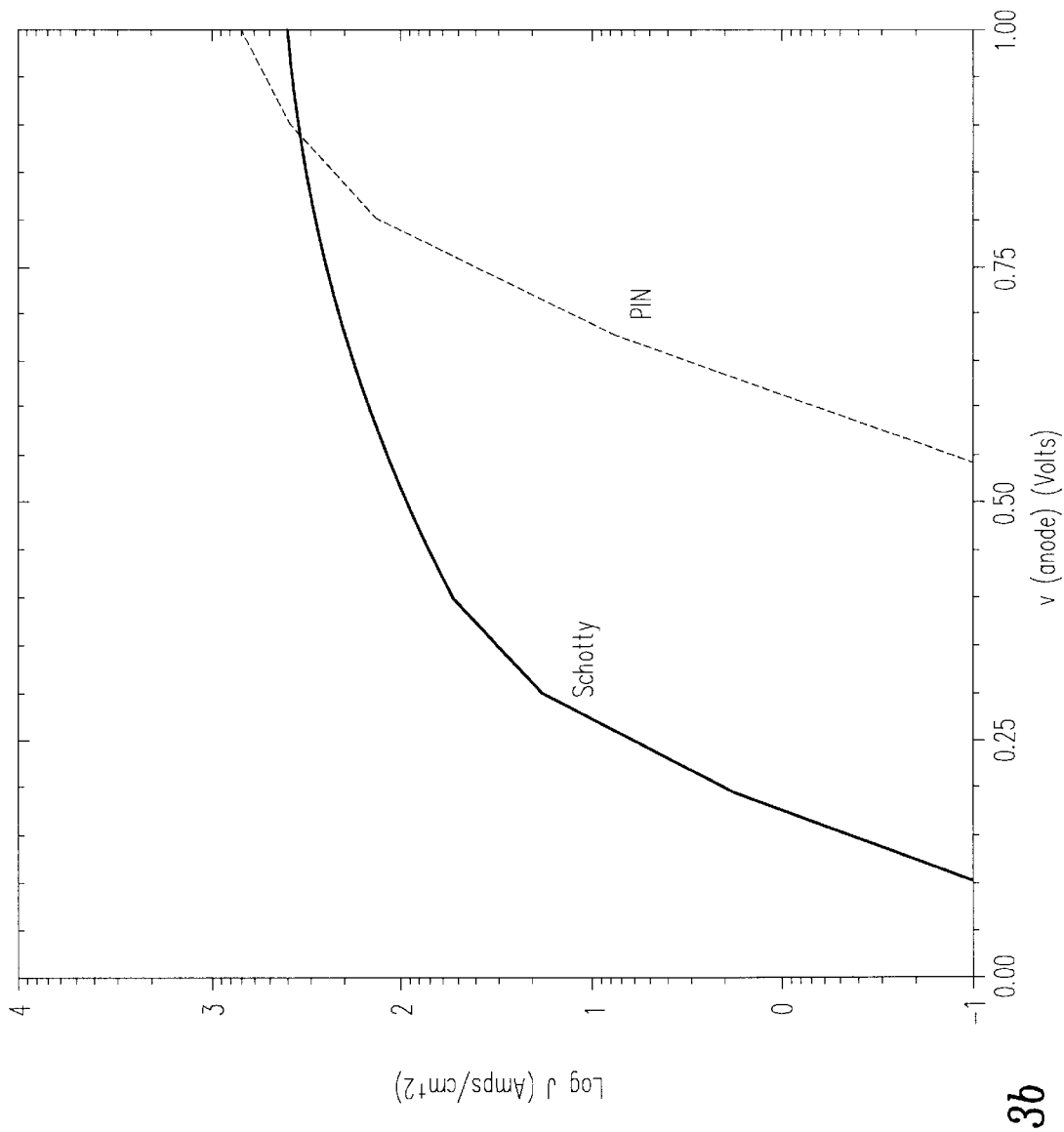
Figure 3C:
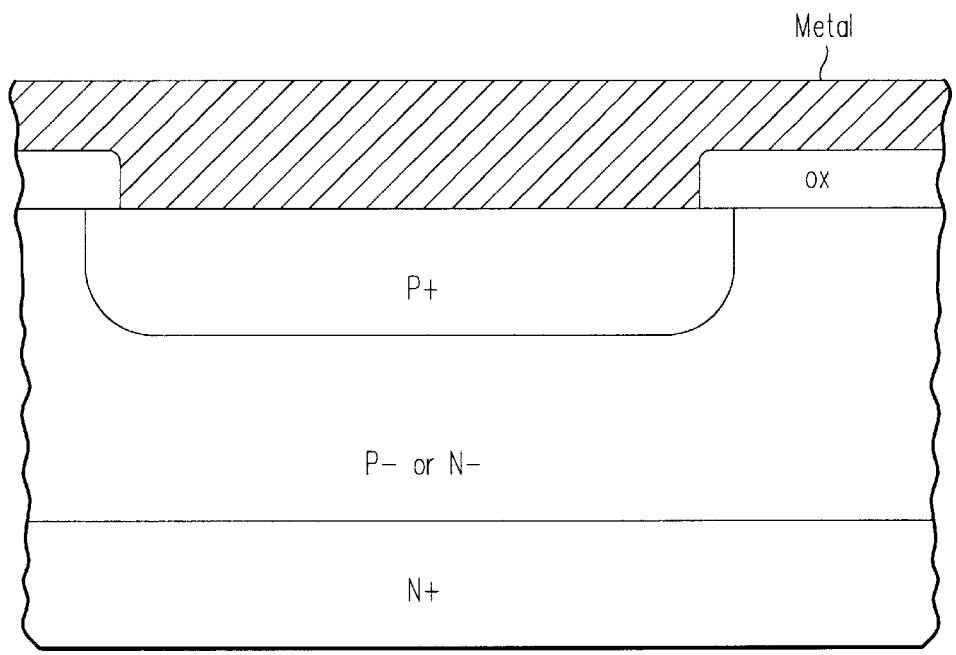
FIGS. 3c and 3d are cross-sectional views a of conventional PIN junction diode and planar Schottky diode, respectively.
Figure 3D:
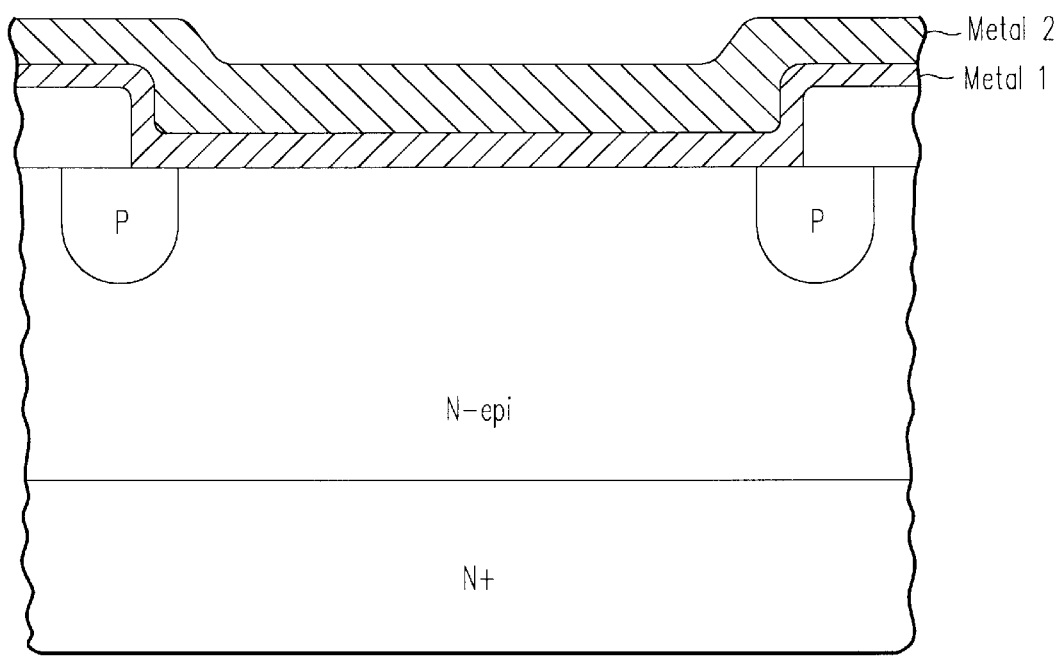
Figure 4:
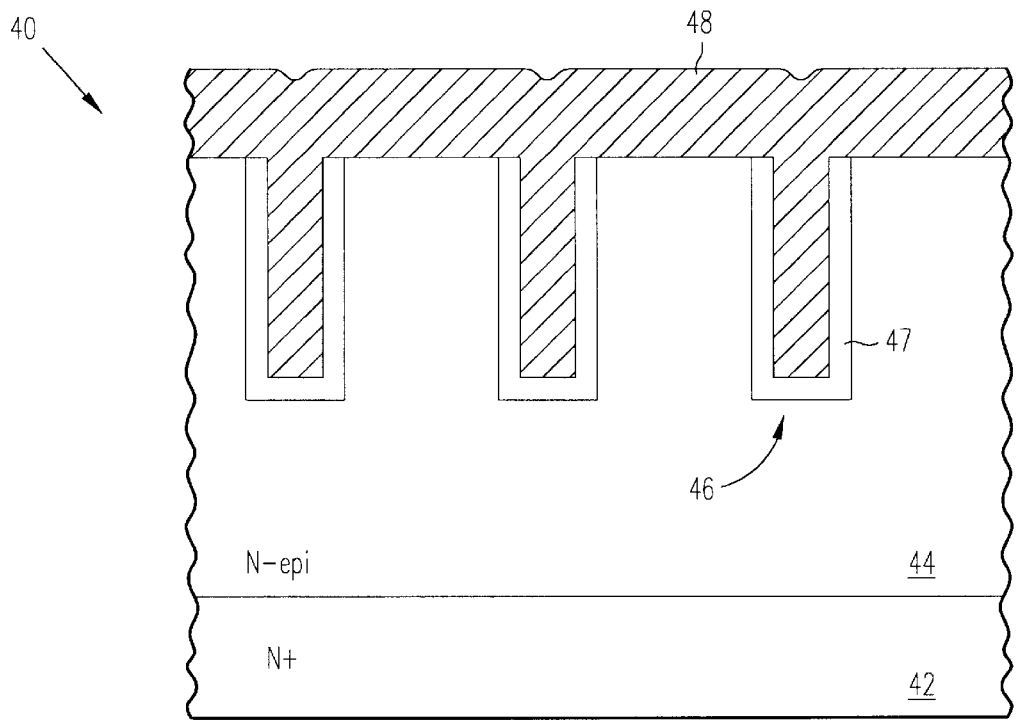
FIG. 4 is a cross-sectional view of a conventional trench-gated Schottky barrier diode.
Figure 9:
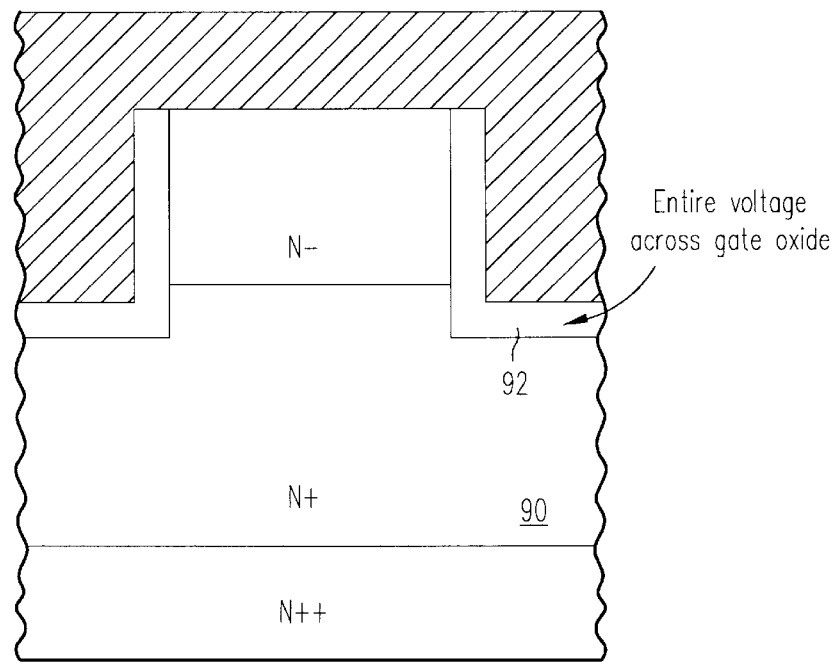
FIG. 9 is a cross-sectional view illustrating how a low-voltage trench-gated Schottky diode can experience high gate oxide fields when the gate trench extends into a heavily-doped region.
Figure 5:
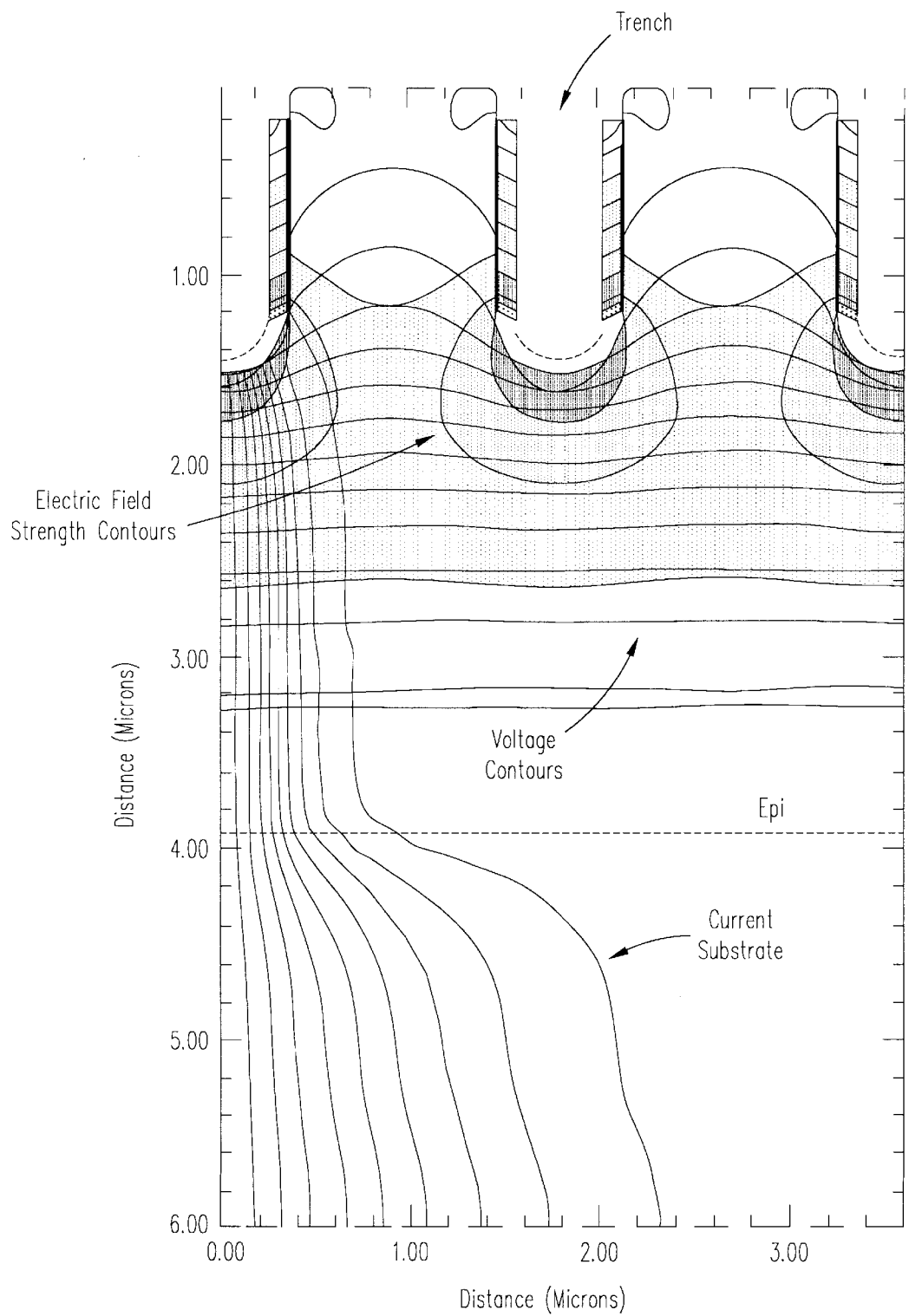
FIG. 5 is a cross-sectional view showing simulated voltage and electric field contours in a conventional trench-gated Schottky diode.
Figure 6:
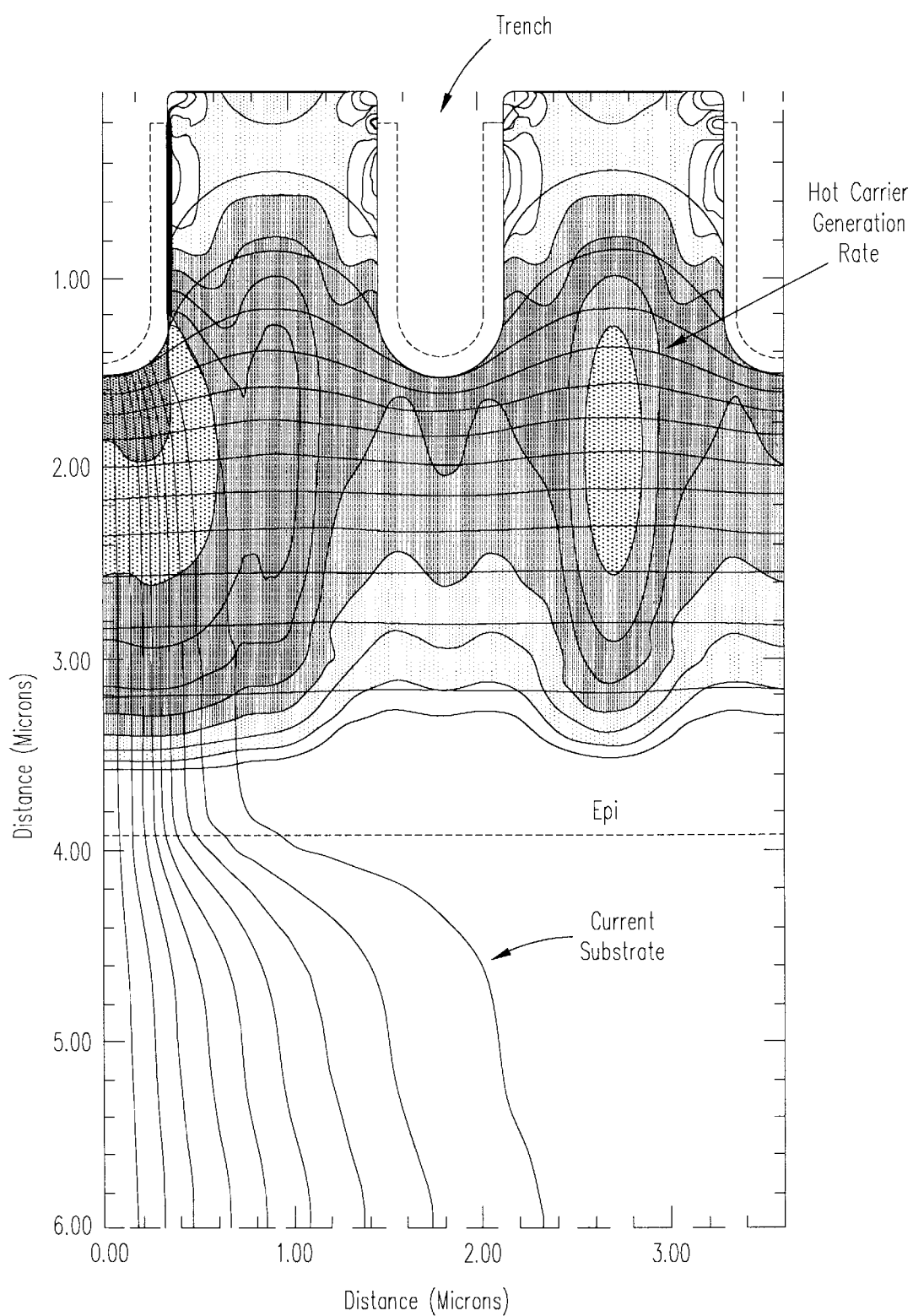
FIG. 6 is a cross-sectional view showing the carrier generation rate in a conventional trench-gated Schottky diode in avalanche breakdown.
Figure 7A:
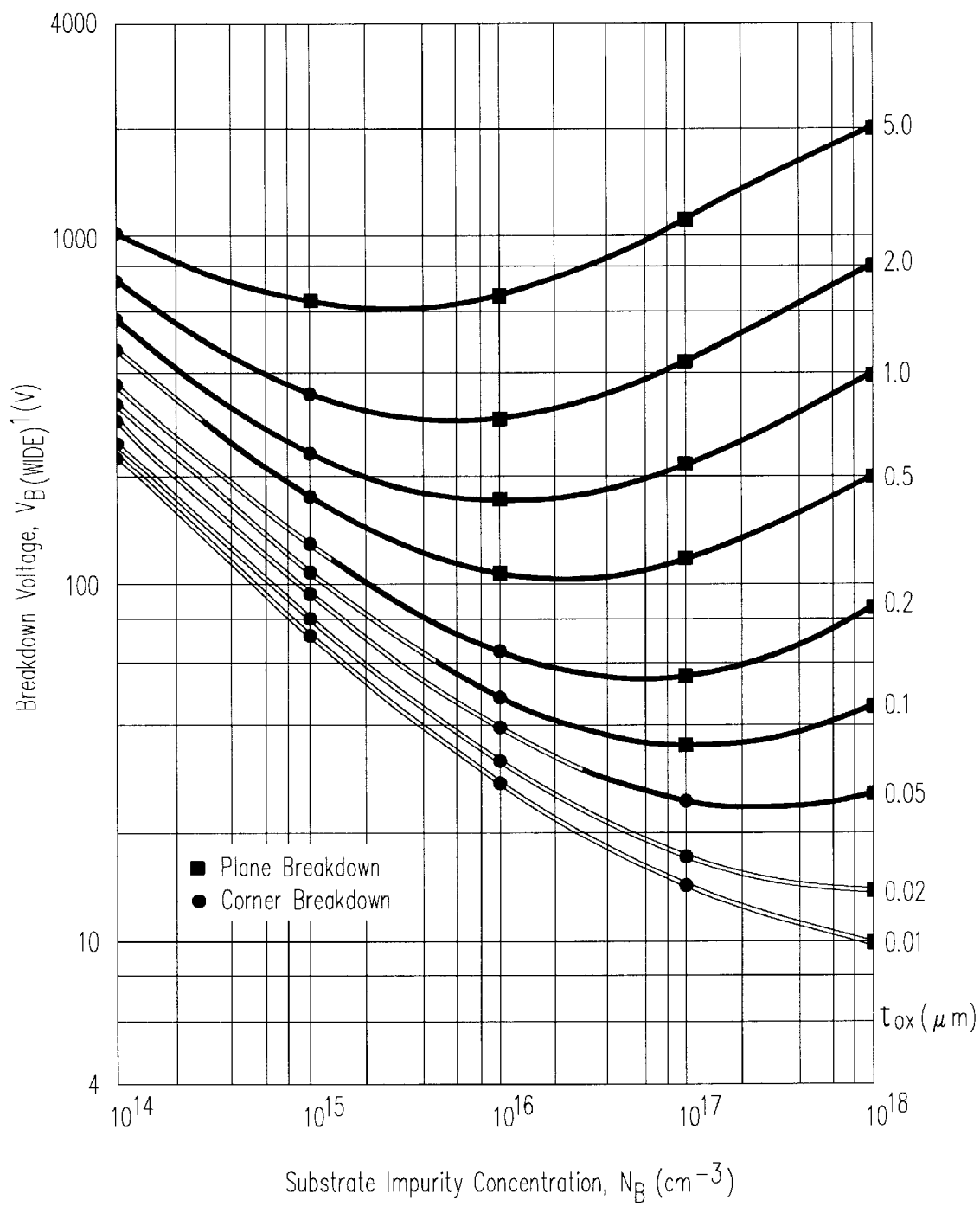
FIG. 7a is graph showing the breakdown voltage of a wide trench MOS capacitor operated in deep depletion versus the background impurity concentration and gate oxide thickness.
Figure 7B:
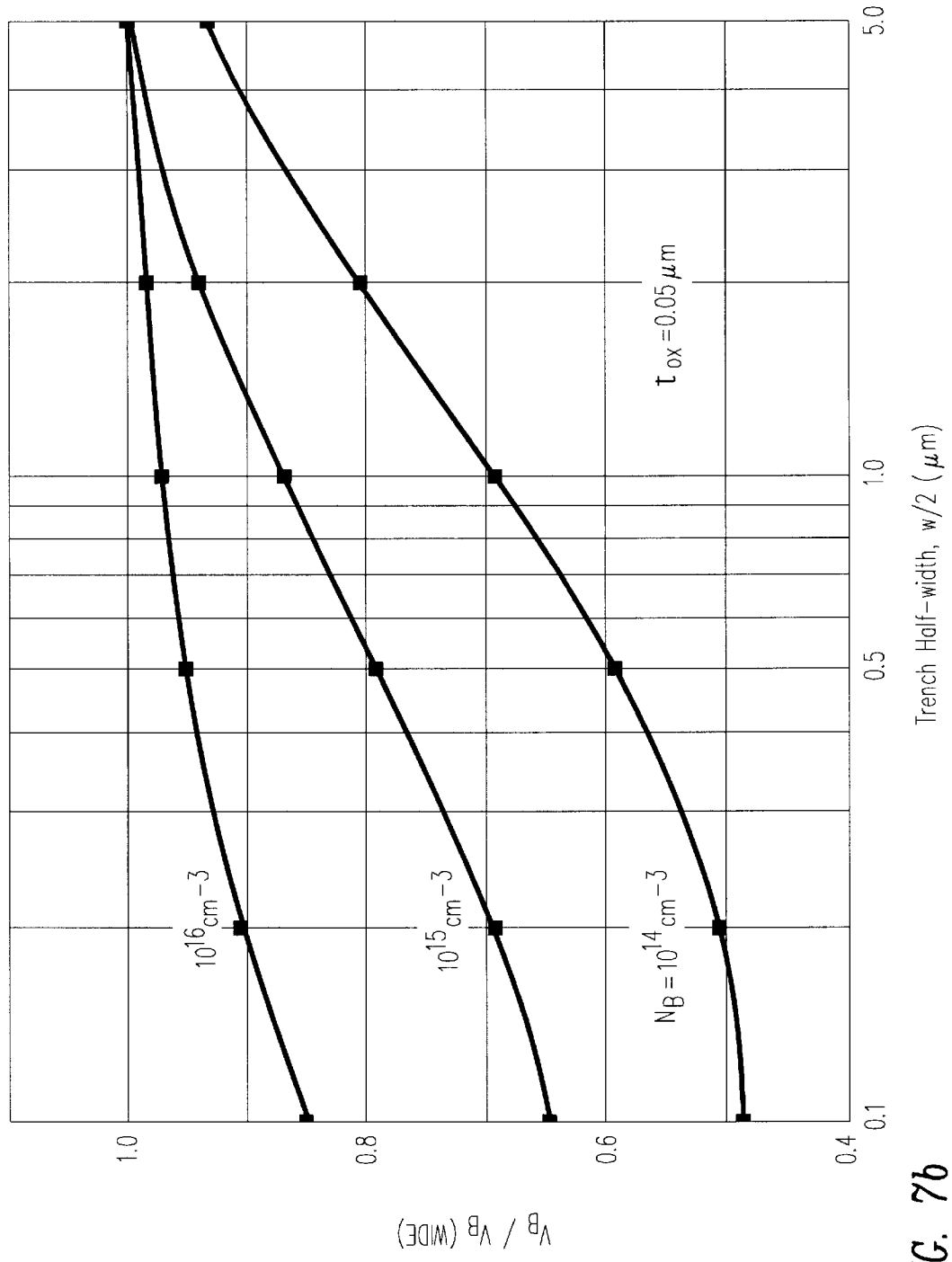
FIG. 7b is a graph showing the normalized breakdown voltage of a narrow trench MOS capacitor versus the trench half-width and background impurity concentration.
Figure 8:
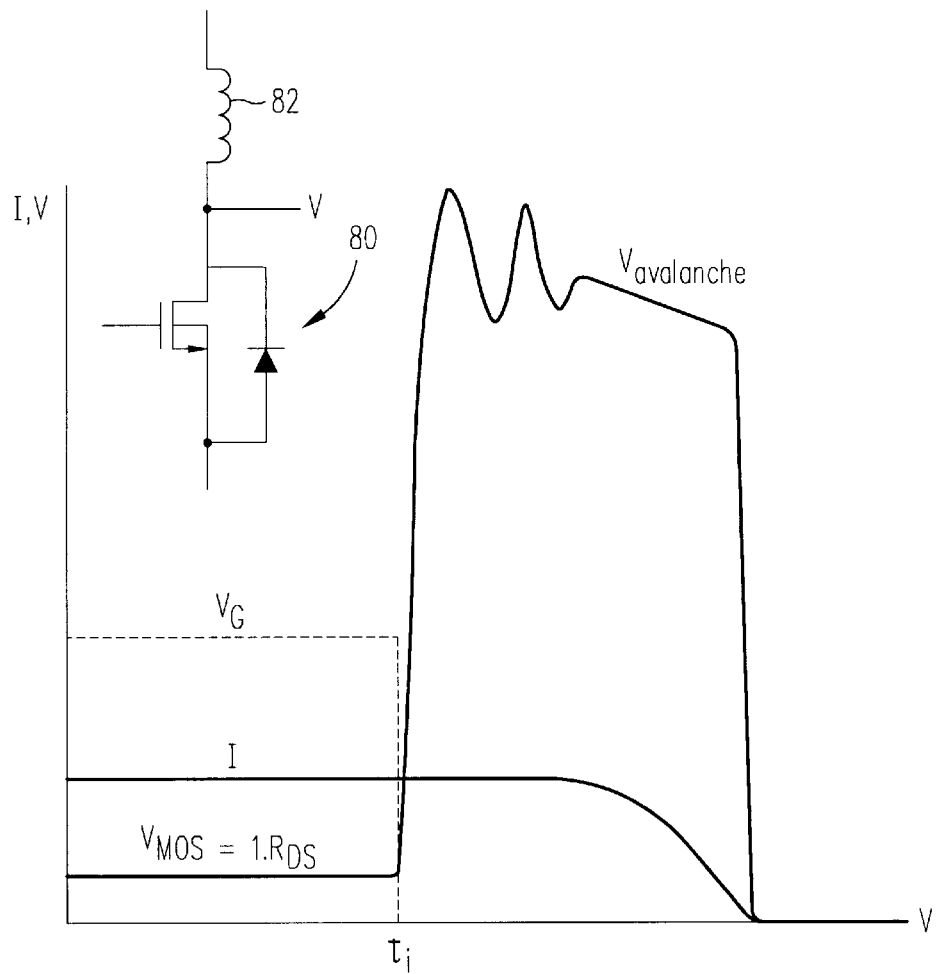
FIG. 8 is a graph illustrating the current and voltage characteristics of an unclamped rectifier diode while switching an inductive load.
Figure 12:
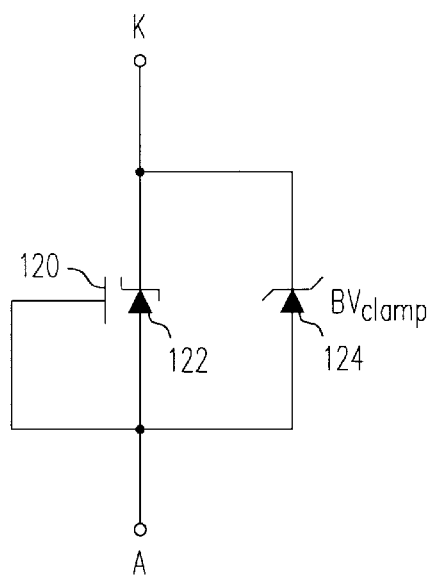
FIG. 12 is an equivalent circuit of the voltage-clamped trench-gated Schottky diode shown in FIG. 11.
Figure 11:
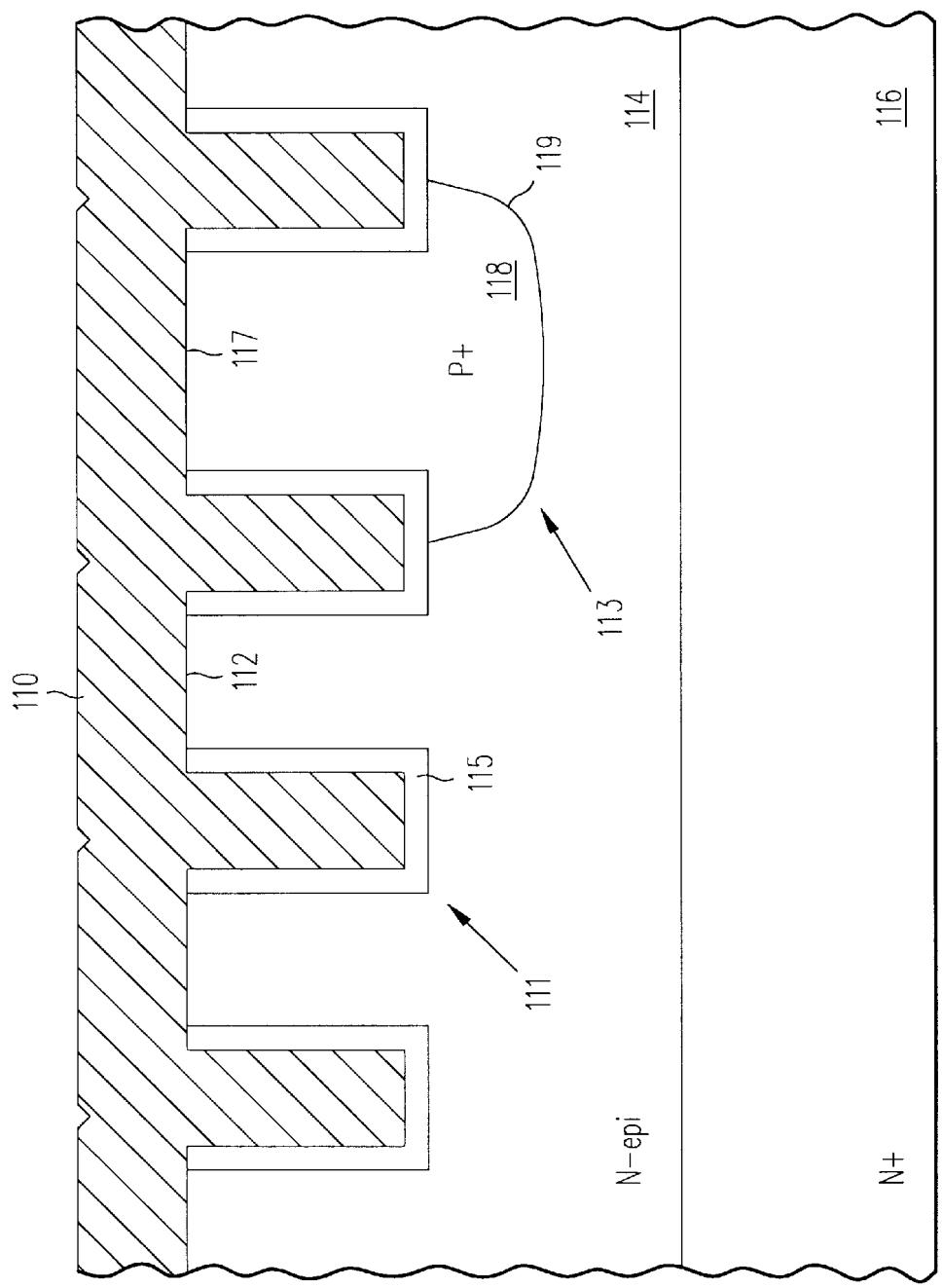
FIG. 11 is a cross-sectional view of a trench-gated Schottky diode having an integral voltage clamp in accordance with the invention.

FIG. 11 illustrates a cross section of a voltage-clamped trench-gated Schottky diode, and FIG. 12 illustrates an equivalent circuit comprising a gate 120, a Schottky diode 122 and a PN junction zener clamping diode 124. In the cross-sectional view of FIG. 11, the metal 110 (cross-hatched) provides a Schottky contact 112 to the lightly doped N-epitaxial layer 114, while it provides an "ohmic" contact 117 to a P+ diffusion 118 which forms a PN junction 119 with the N-epi layer 114. The PN junction 119 functions as a clamping diode 113. Metal 110 is used to fill the gate trenches 111, which are lined by gate oxide layers 115, forming an MOS "capacitor" at the sidewalls and floors of the trenches. In reality, the "Schottky" junction 112 can be slightly leaky but preferably should offer some built-in barrier height. The ohmic contact 117 to the heavily doped diffusion 118 need not be truly ohmic since the surface concentration of the diffusion 118 is sufficiently high that quantum mechanical "tunneling" conduction will occur even if the respective work functions of the metal and silicon result in an energy barrier. The gate trenches 111 surround the Schottky interfaces 112 at a well defined pitch to guarantee full depletion of the silicon between the trenches at high reverse biases. Pinch off (i.e. the full depletion) of the mesa between the facing MOS capacitors, electrostatically shields the Schottky interface from the barrier lowering effect. The MOS sandwich is like a dual gate JFET or a fully depleted SOI MOSFET. The entire device is constructed on top of a heavily doped substrate 116, in this case arsenic doped N++. In the cross section shown, since the Schottky metal 110 forms the gate electrode, a two terminal device is formed. The gate material need not be the same composition as the Schottky metal as long as it is conductive.

In FIG. 11 the clamping diode 113 (formed by P+ diffusion 118) clamps according to a reachthrough breakdown mechanism. Also known as a PIN diode, the doping of the uncompensated N-epi layer 114 is light (i.e. it behaves like undoped or intrinsic material) compared to the concentration of the down diffusing P+ diffusion 118 and the up diffusion of the heavily doped substrate 116. The electric field in the lightly doped N-epi layer 114 is relatively constant so that avalanche occurs over the entire region. Since carriers can build up speed before they collide with other atoms to form more carriers, the avalanche critical electric field of the PIN junction is lower than that of a PN junction and has a lower impedance of breakdown (since the non avalanching region is all heavily doped). Even so, any breakdown mechanism can be used to facilitate a zener voltage clamp. The most important criterion is that breakdown should occur in the PN junction before the MOS gate is damaged.

Figure 13A:
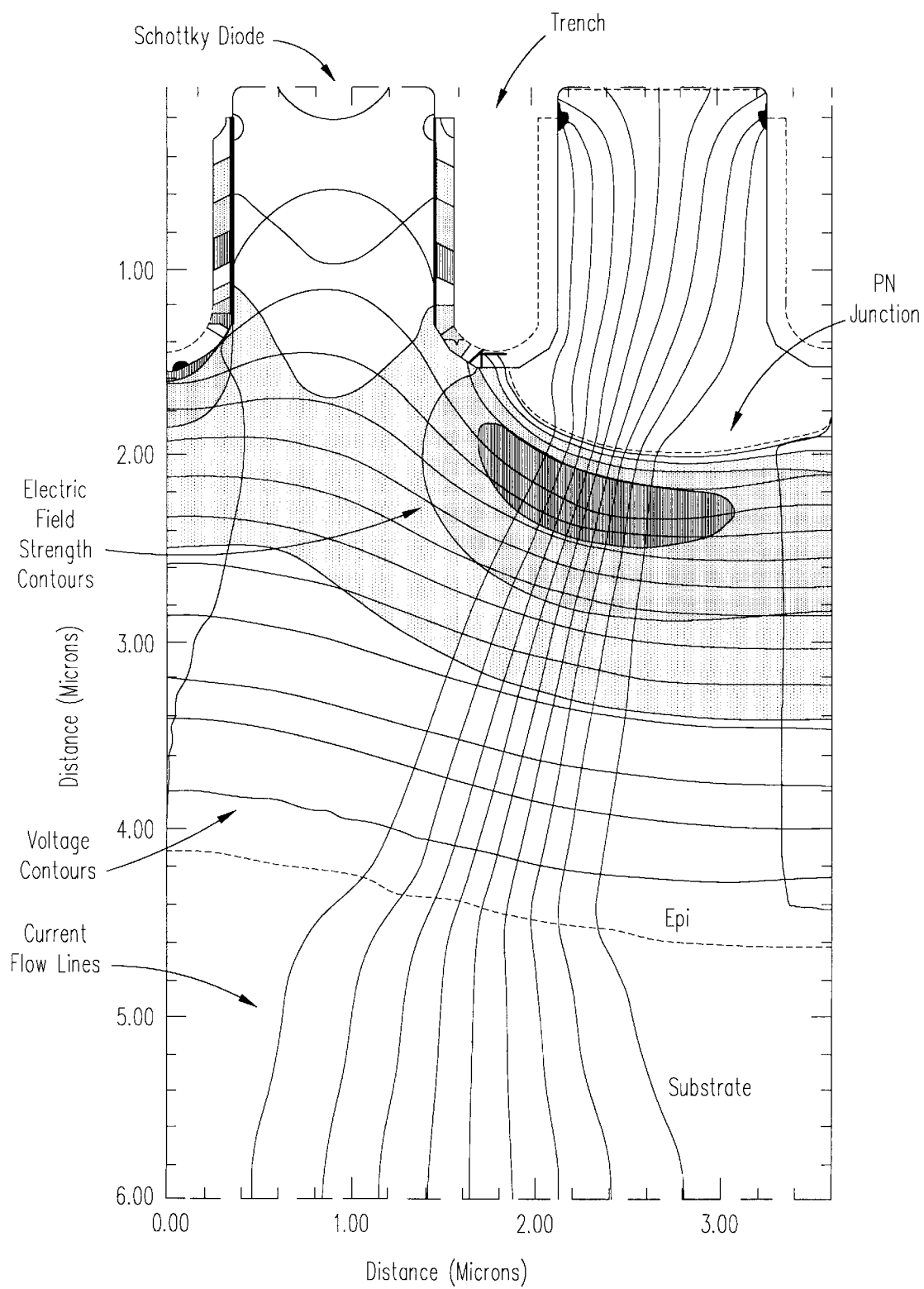
FIGS. 13a and 13b are cross-sectional views showing simulated equipotential lines and ionization contours in a voltage-clamped trench-gated Schottky diode during breakdown.

FIG. 13a shows a simulation of the voltage clamped trench Schottky in avalanche breakdown using the two-dimensional device simulator MEDICI. The substantially horizontal lines are equipotential lines and the substantially vertical lines are current flowlines. As shown by the equipotential lines and shaded regions, the peak field is located below the deep junction of the diode clamp rather than under the trench. The peak field is easily identified as located within the smallest heavily shaded region where the equipotential lines are most closely spaced. Notice that most of the avalanche current flows through the bottom of the diode away from the trench.

Figure 13B:
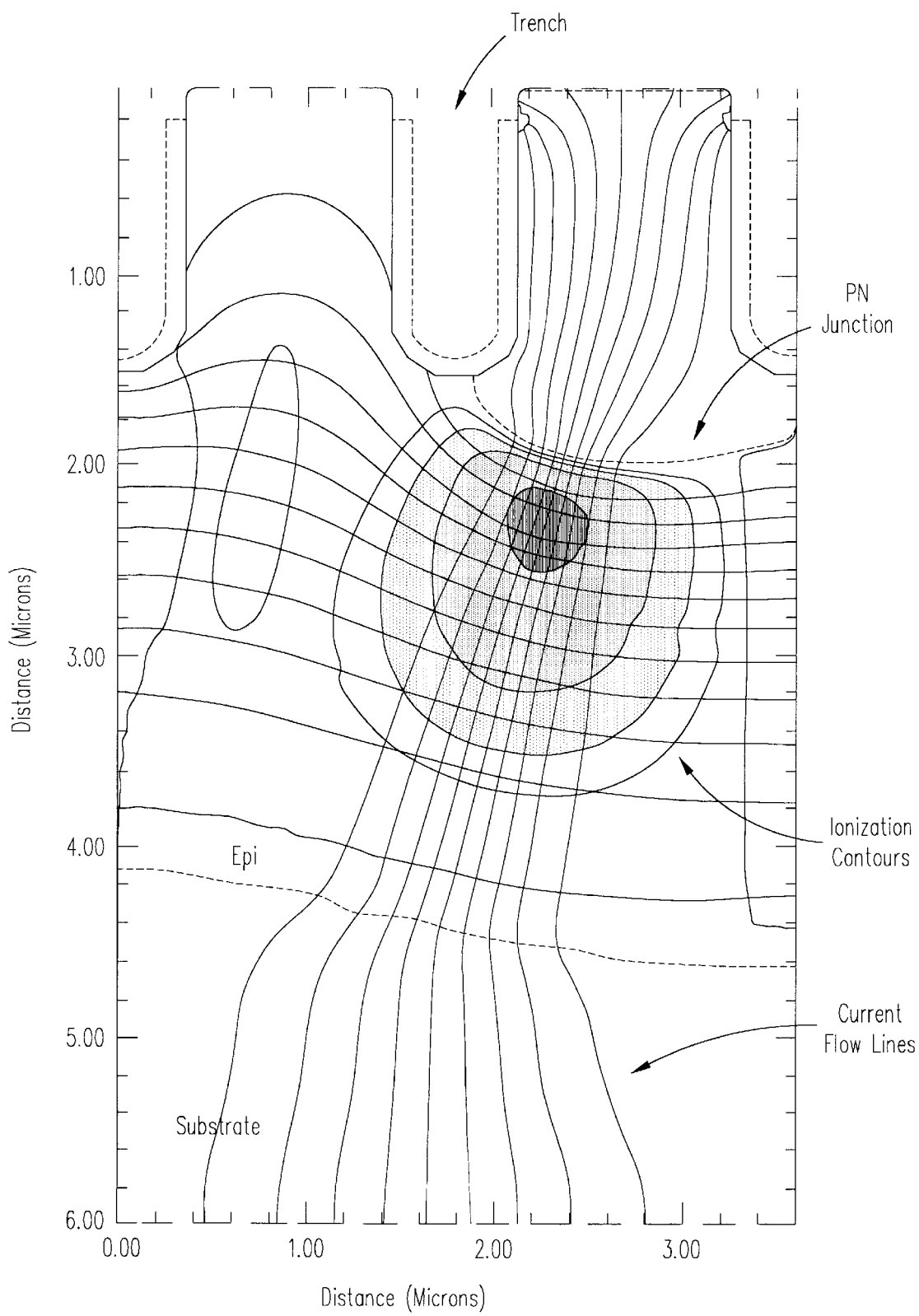

The shaded regions and ionization contours in FIG. 13b show the regions of greatest ionization (highest generation rate G) in the device. The ionization contours and shaded regions indicate that the location of breakdown is far away from the active gate trenches ill and does not extend through the Schottky interface 112.

The performance of the trench-gated Schottky diode depends on several design and process criteria, including: geometry, dopant profiles, gate material, clamping diode implementation, termination and packaging. Geometry describes the device layouts suitable for the trench-gated Schottky diode. A main criterion is the ability of adjacent MOS trench gates to deplete the intervening mesa in the off state at high biases. This criterion sets an upper limit on the trench-to-trench pitch and is addressed in the above-mentioned U.S. Pat. No. 5,365,102. Typical mesa widths range from 1.5 to 0.3 $\mu$m, with about 0.6 $\mu$m preferable. Widths of several $\mu$ms are possible but require very light epi concentrations to implement, thereby limiting the benefit of the trench-gated Schottky diode. Merging the Schottky diode with the PN junction clamping diodes creates more factors to consider. The trenched gates surround the cells of the Schottky diode and may also circumscribe the PN junction clamps. Unlike the Schottky diode cells, which rely on their interaction the trenched gates, the diode clamps do not need to be surrounded by trenches, although for convenience they can be.

Figure 14A:
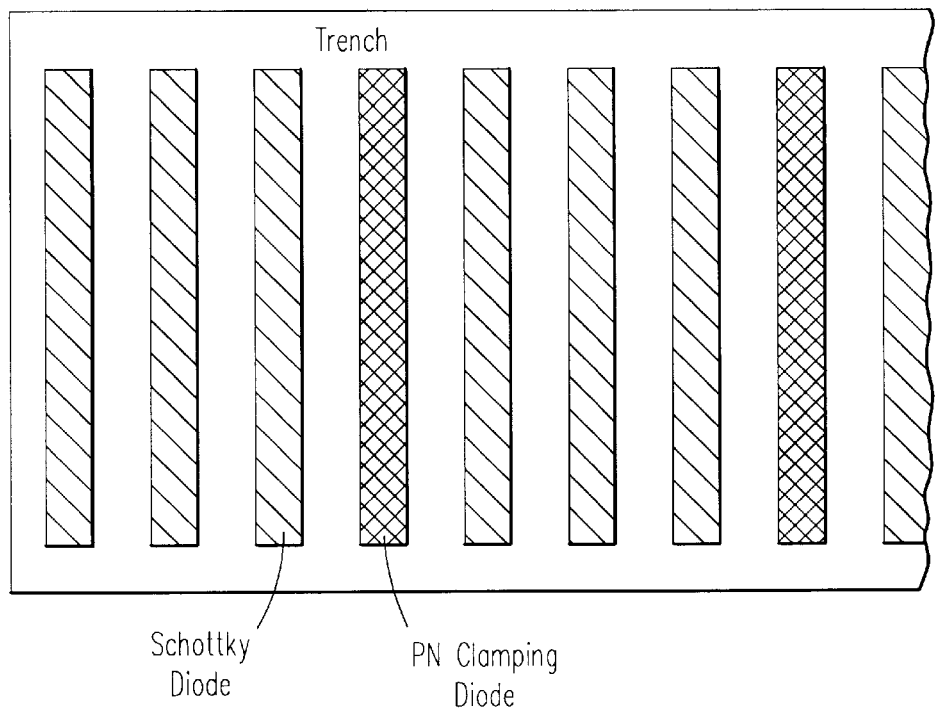
FIGS. 14a–14f are plan views showing various possible cell geometries of voltage-clamped trench-gated Schottky diodes.
Figure 14B:
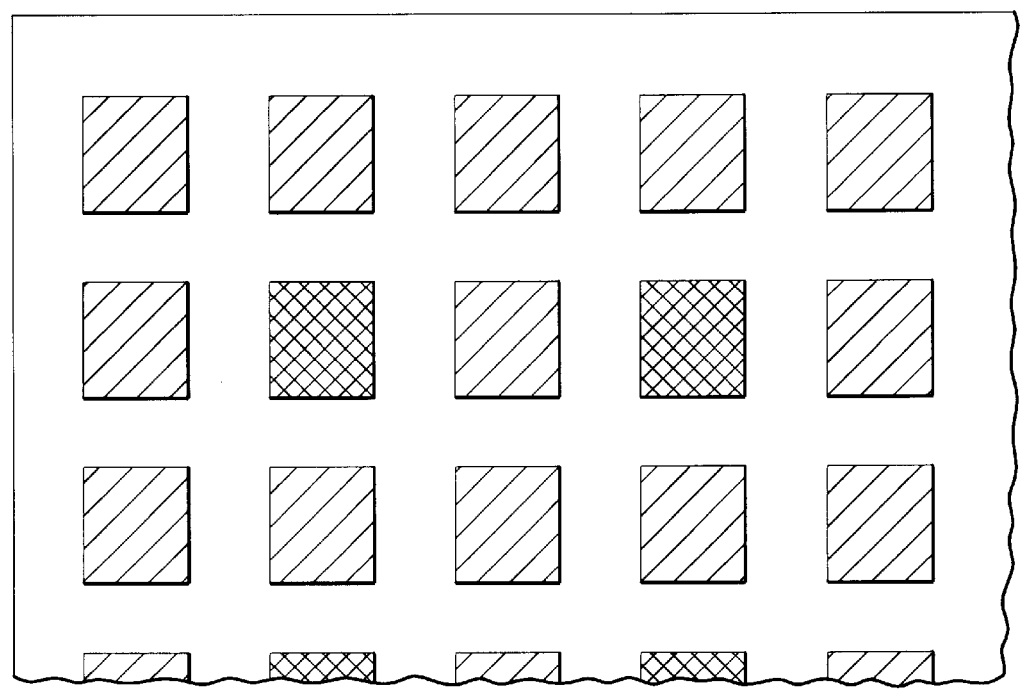
Figure 14C:
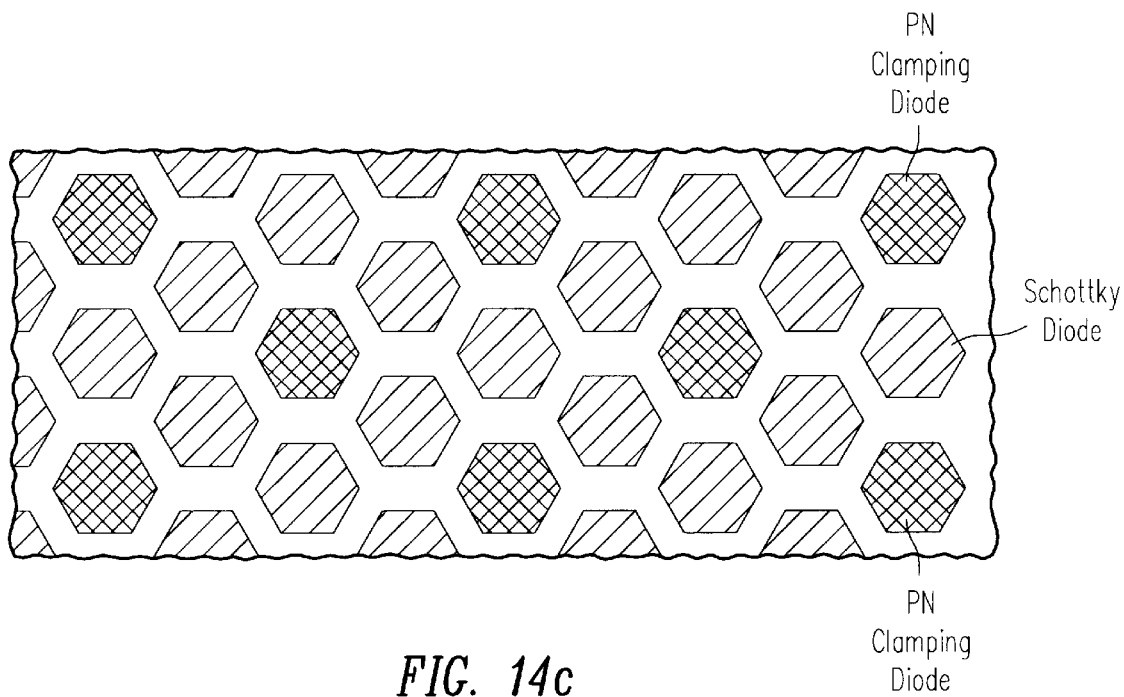
Figure 14D:
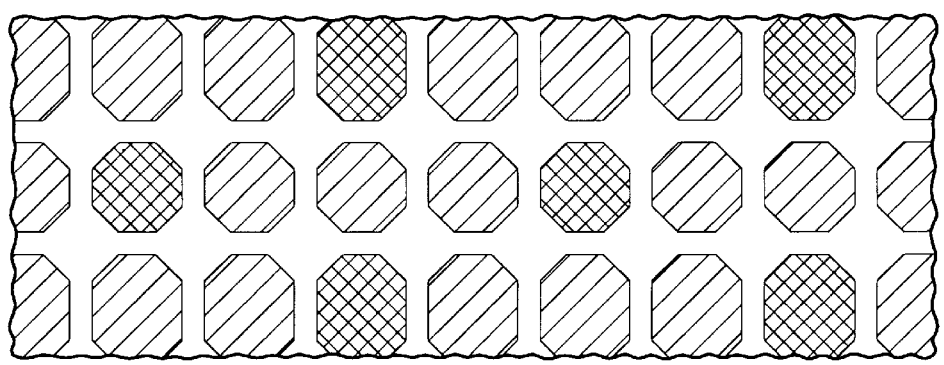

FIGS. 14a–14f are plan views which illustrate various geometries of voltage-clamped trench Schottky diodes, the Schottky diode cells being single cross-hatched and the PN diode cells being double cross-hatched. In FIG. 14a, the trench Schottky cells and the PN clamping cells are arranged in stripes. For every "n" stripes, where "n" is a variable, one cell contains a PN clamp and the remaining cells contain Schottky diodes.

This "1-of-n" diode clamp allows the designer to adjust the portion of the Schottky diode that is to be devoted to avalanche clamping. Including more clamping cells provides a stiffer voltage clamping action and a lower impedance of breakdown. Fewer clamping cells provides the opposite effect but improves the forward voltage drop of the Schottky diode. The proportion of clamping diode cells can range from 1 of every 2 cells to 1 of 126 cells or more, but more likely will be limited between 1-of-4 to 1-of-32 cells. As a compromise between off and on states, 1-of-16 is a likely candidate for a general purpose Schottky diode.

Figure 14E:
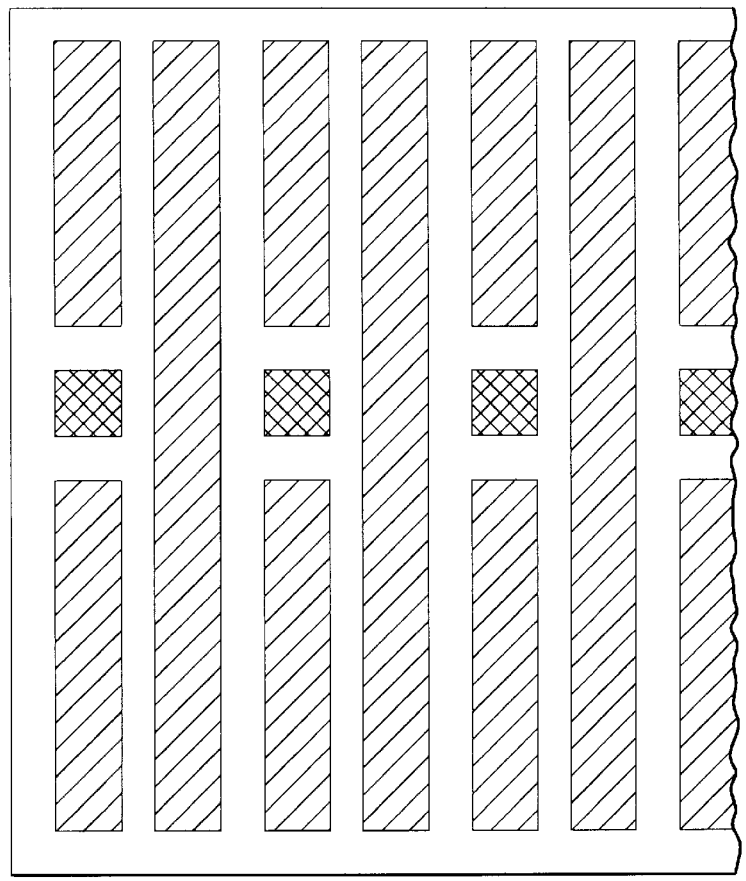
Figure 14F:
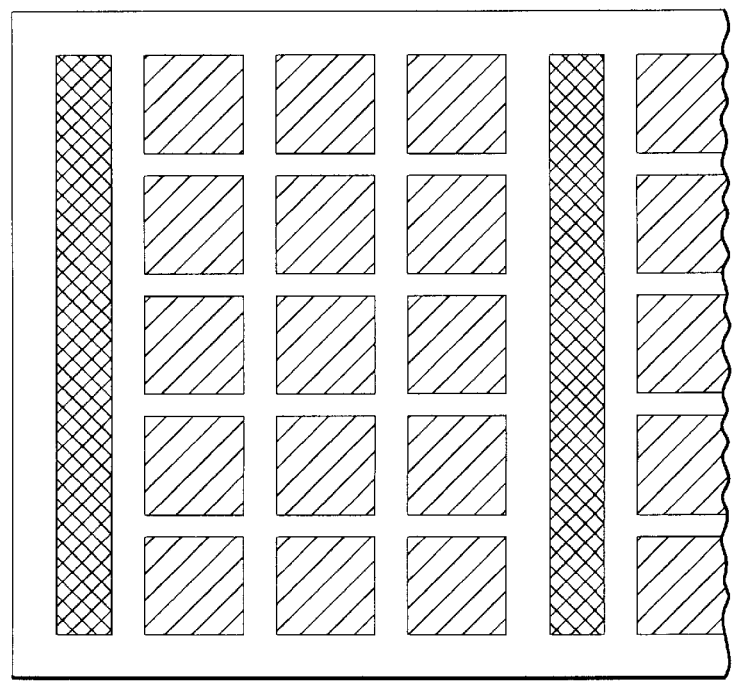

Aside from the stripe geometry of FIG. 14a, an array of square cells (FIG. 14b), hexagonal cells (FIG. 14c) and any other closed polygonal cells (FIG. 14d) may be used. Alternatively, striped and closed cells can be merged into one device. In FIG. 14e, regularly placed stripe-shaped trench Schottky diode cells are interspersed with cellular clamping diode cells. Such a layout maximizes the diode area. In FIG. 14f, stripe-shaped clamping diode cells are mixed with closed-cell Schottky diodes. Adjusting the relative portions of the surface area comprising Schottky cells and clamping diode cells, respectively, provides a design means by which to adjust the energy-absorbing capability of the diode in avalanche, i.e. its robustness, by sacrificing the forward voltage drop across the diode when it is conductive.

Figure 15A:
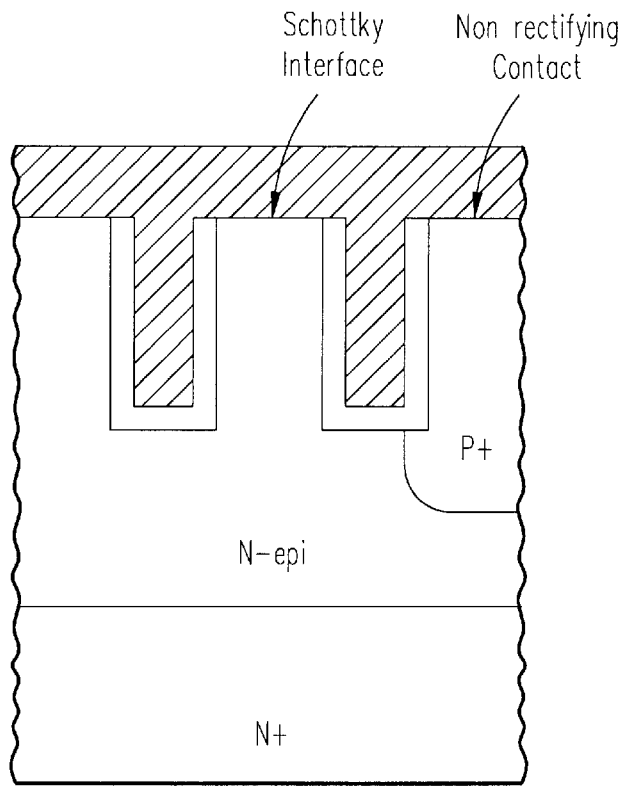
FIGS. 15a–15e are cross-sectional views showing various gate materials for voltage-clamped trench-gated Schottky diodes including: the Schottky metal itself (FIG. 15a), polysilicon contacting the Schottky metal (FIG. 15b), polysilicon contacting the Schottky metal, with an interconnect metal overlying the Schottky metal and shorting the clamping diode (FIG. 15c), interconnect metal (FIG. 15d) and polysilicon contacting only the interconnect metal (FIG. 15e).
Figure 15B:
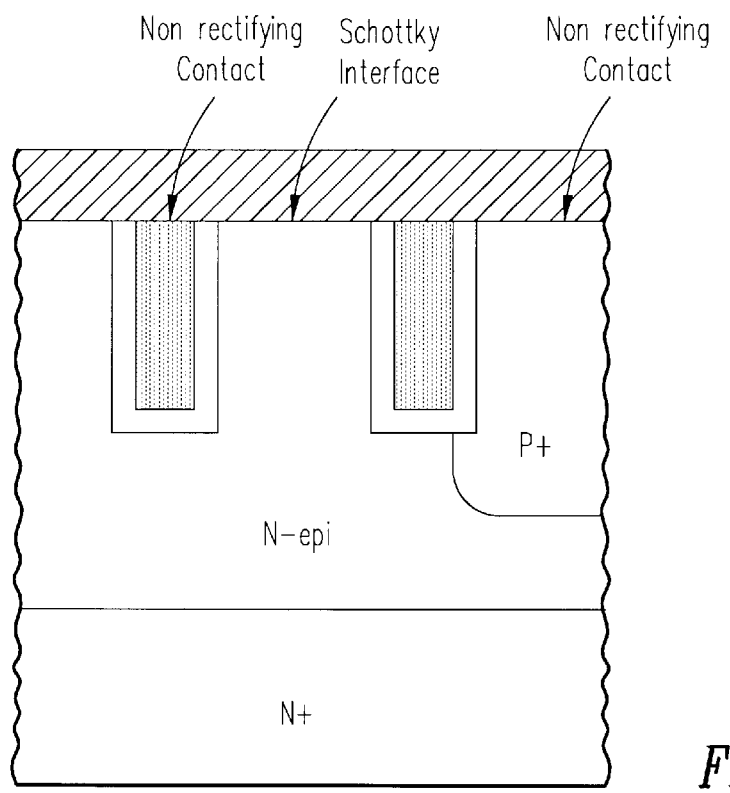
Figure 15C:
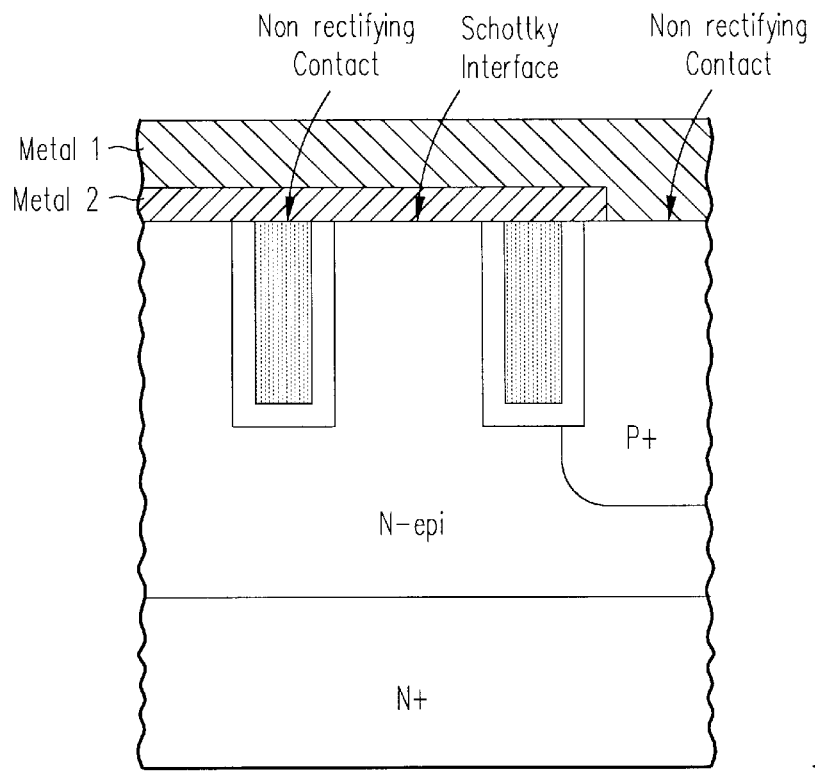
Figure 15D:
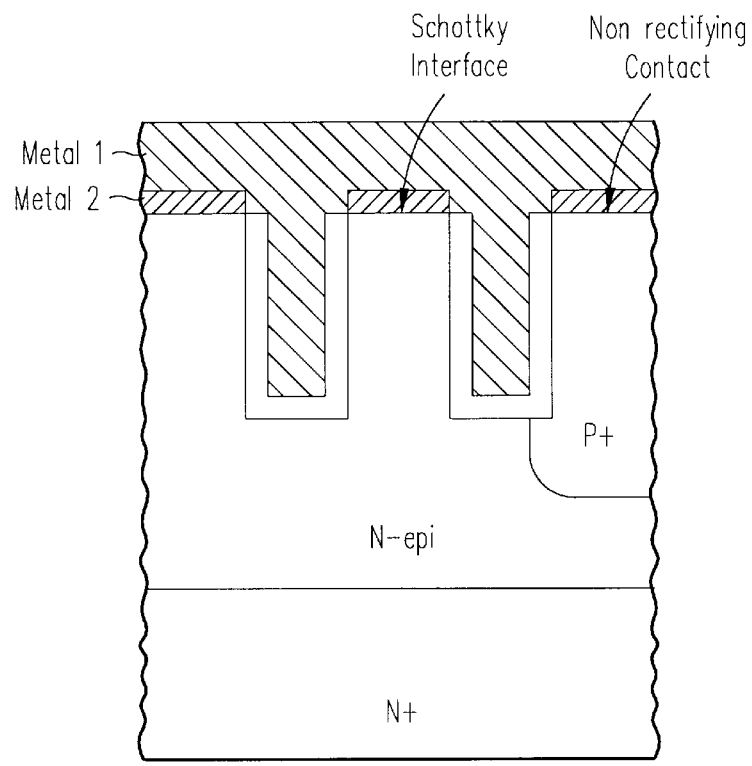
Figure 15E:
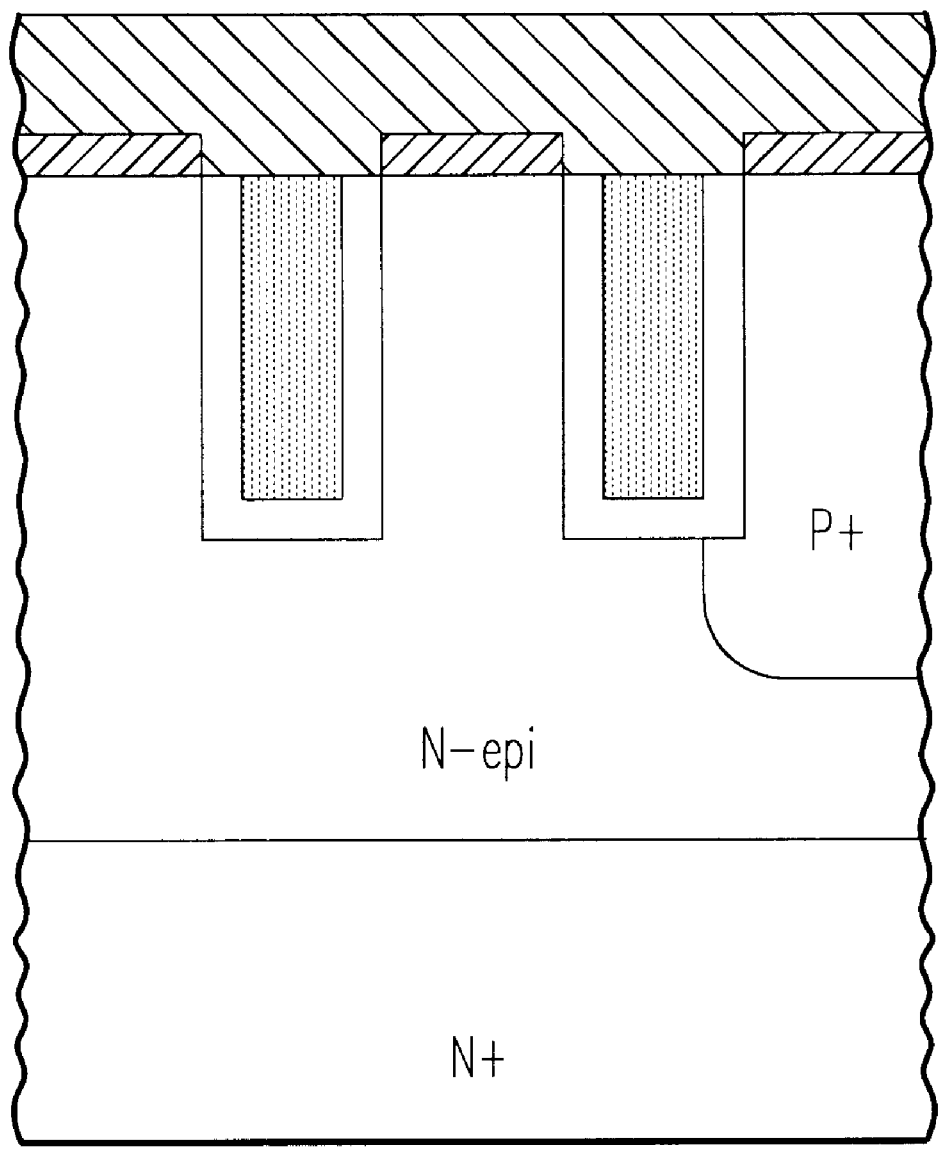

In FIGS. 15a–15e, various gate materials are used for the embedded gate of the voltage-clamped Schottky diode. The extent of depletion spreading in the mesa when the device is reverse-biased depends on the doping concentration and conductivity type of the silicon and the work function of the gate material. More depletion spreading due to the MOS capacitor's built in potentials increases the electrostatic shielding of the Schottky interface. For example, using an N-type epi layer and a gate electrode of the same conductivity type, i.e. N-type, tends to bend the bands along the sidewall of the trenched gate into depletion and away from accumulation making the mesa easier to pinch off. Similarly, for a P-epi layer, a P-type polysilicon gate exhibits an increase in depletion width. While this increased barrier height reduces off-state leakage, either P-type or N-type poly dopant type may be used. In a simpler process where polysilicon is not employed, the Schottky metal is used as the gate electrode (see FIG. 15a). In FIG. 15b polysilicon fills the trench and planarizes it and device relies on an ohmic contact between the Schottky metal and the polysilicon gate along with an ohmic contact to the clamping diode diffusion. FIG. 15c utilizes a polysilicon gate, but the clamping diode is shorted to the Schottky "metal 2" by an interconnect "metal 1" overlying the Schottky metal and the exposed polysilicon gate material. In FIG. 15d, an interconnect "metal 1", instead of the Schottky "metal 2" or polysilicon, fills the trench, giving the designer an extra degree of freedom in choosing the width of the MOS depletion region when the device is reverse-biased. By designing the device to have a wider depletion width, the trenches may be spaced farther apart, making manufacturing easier. The Schottky "metal 2" spans the distance between the gate trenches. FIG. 15e illustrates the use of a Schottky metal overlying all non-trench active areas (which might be formed using a self-aligned silicide process where silicide only grows on exposed silicon areas). The trench is filled with doped polysilicon, and the polysilicon gate and Schottky metals are shorted by an interconnect metal such as aluminum.

Figure 16A:
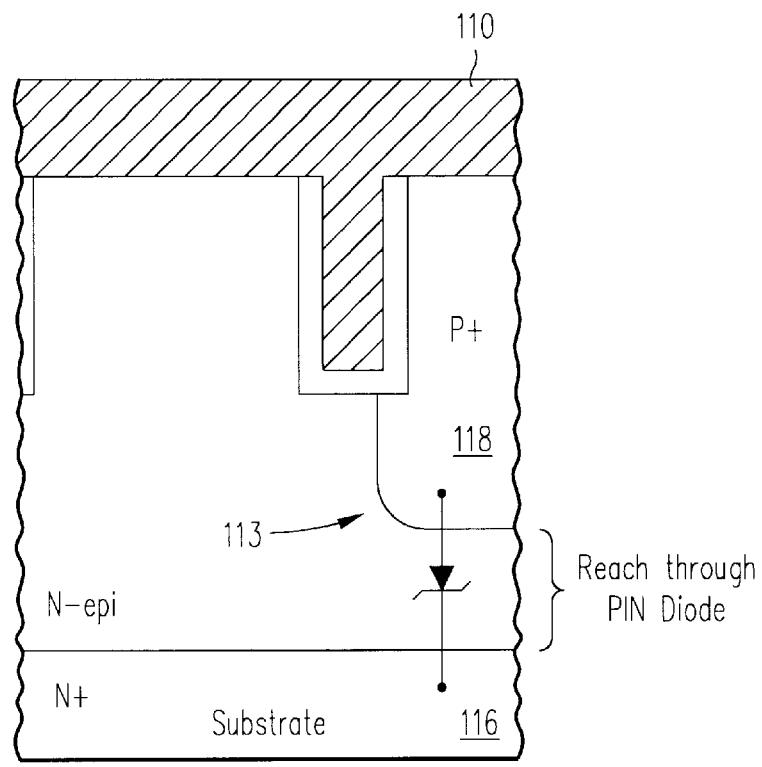
FIGS. 16a–16g are cross-sectional views of various types of clamping diodes, including: a PIN reachthrough diode with the epi as the intermediate layer (FIG. 16a), a PIN reachthrough diode with a heavily doped sublayer of the epi as the intermediate layer (FIG. 16b), a PN diode with a diffused localized dopant region as its cathode (FIG. 16c), a PN diode with an implanted localized dopant region as its cathode (FIG. 16d), a PN diode with a localized dopant region from a masked buried layer as its cathode (FIG. 16e), a PN lateral diode with localized dopant regions as its anode and cathode (FIG. 16f), and a PN diode whose breakdown voltage is determined by the radius of curvature of its PN junction (FIG. 16g).

FIGS. 16a–16g illustrate in cross-section various types of PN clamping diodes. As described previously, one means to clamp the maximum voltage is by an epi reachthrough breakdown mechanism as shown in the FIG. 16a. Assuming a very heavily doped P+ diffusion 118 and N+ substrate 116, the characteristics of clamping diode 113 can be set by a combination of epi-layer doping (which also influences the Schottky performance) and epi-layer thickness. In general the breakdown of a PIN type diode is approximately equal to the breakdown voltage of the PN junction when the thickness of the intermediate layer ($W_{epi}$) is equal to zero (typically 7V to 20V), plus the voltage across the epi, roughly (20 to 25V/$\mu$m)·$W_{epi}$. The target thickness can be chosen to meet a given breakdown using the reachthrough curves of FIG. 17a. In the implementation of FIG. 16a the deep P+ is preferably deeper than the trench to minimize impact ionization in the vicinity of the trench.

Figure 16B:
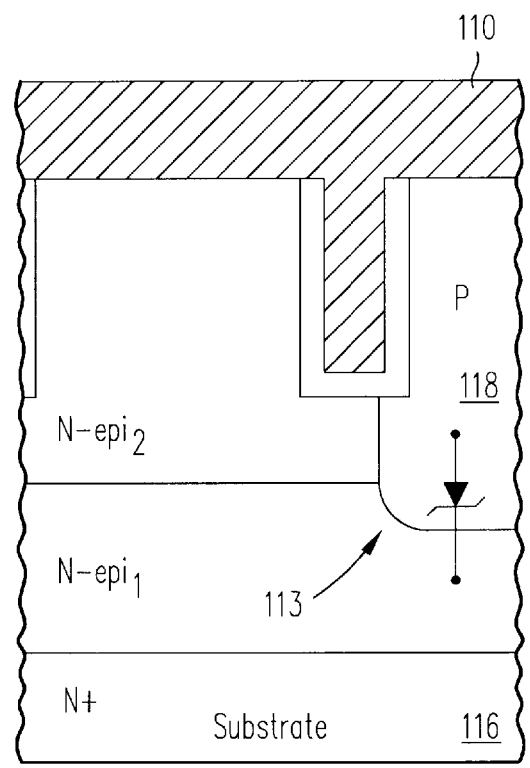
Figure 17A:
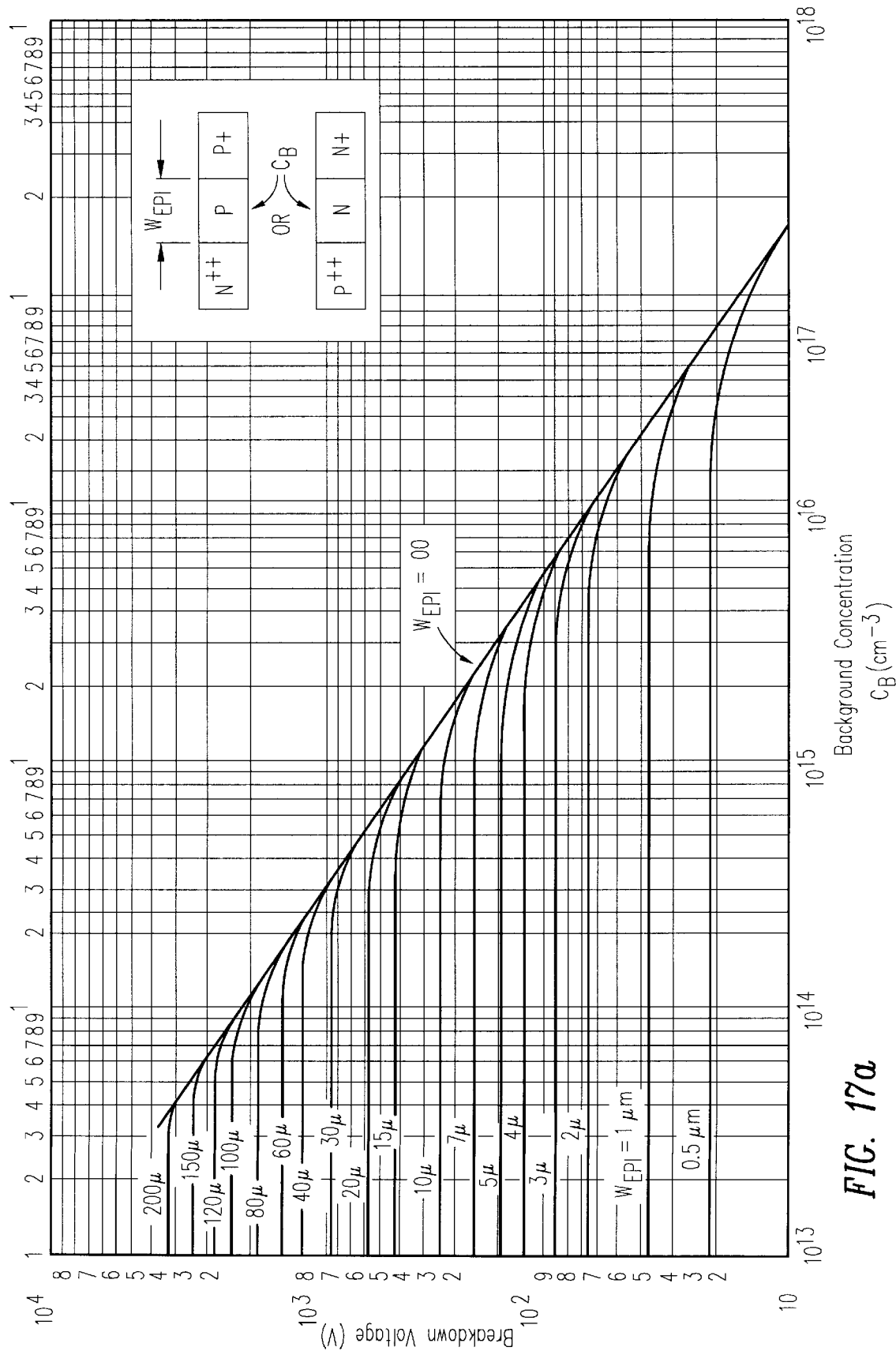
FIG. 17a is a graph showing the breakdown voltage of a PIN diode as a function of its background dopant concentration and the width of its intermediate layer.

The breakdown can be further optimized without adversely affecting the trench using a graded or stepped epi as shown in FIG. 16b. In such a process the epi layer comprises two sublayers, with a sublayer of high concentration ($N_{epi1}$) buried beneath a sublayer of lighter doping ($N_{epi2}$) The trench-gated Schottky diode is contained within the more lightly doped sublayer ($N_{epi2}$) while the deep P+ diffusion 118 extends well into the more heavily doped sublayer ($N_{epi1}$). The doping of the $N_{epi1}$ layer sets the diode breakdown voltage. The doping of the $N_{epi2}$ layer is to optimize the properties of the Schottky diode. The doping concentrations may be constant within a given layer or may vary with depth to provide a graded doping profile. The concentration of the graded doping profile should ideally decrease near the surface of the epi layer.

Figure 16C:
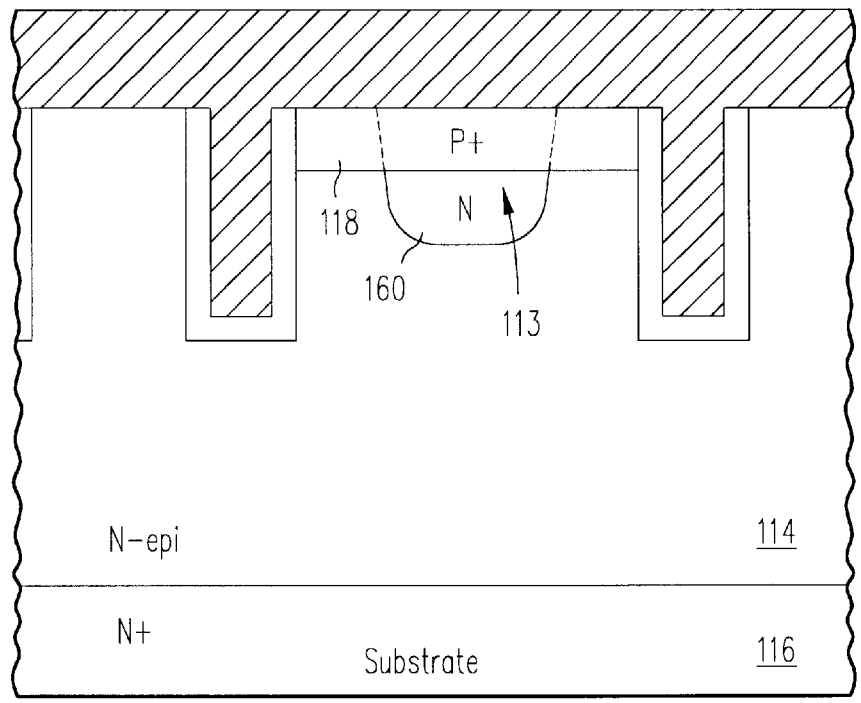
Figure 16D:
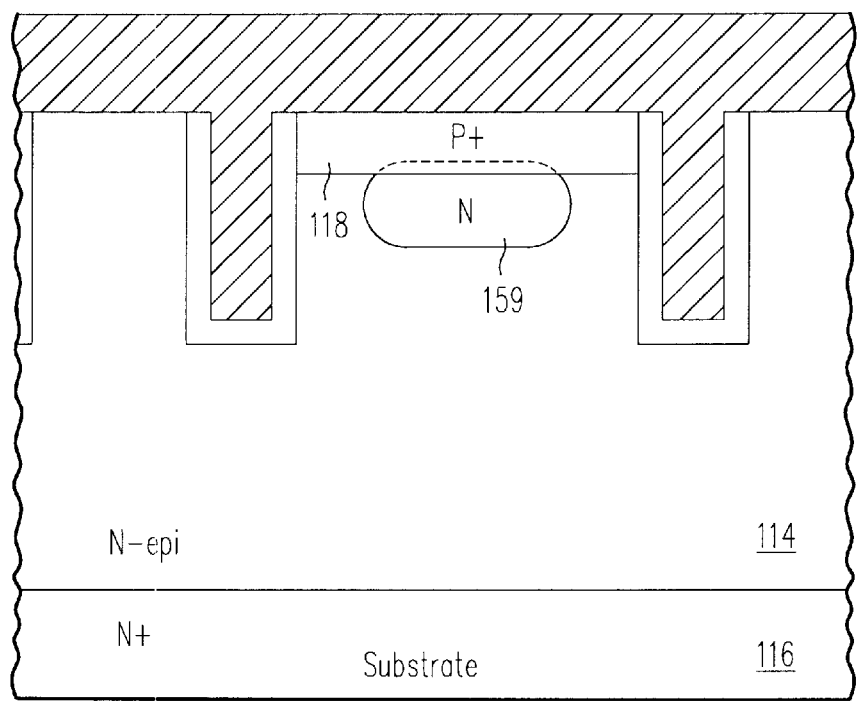
Figure 16E:
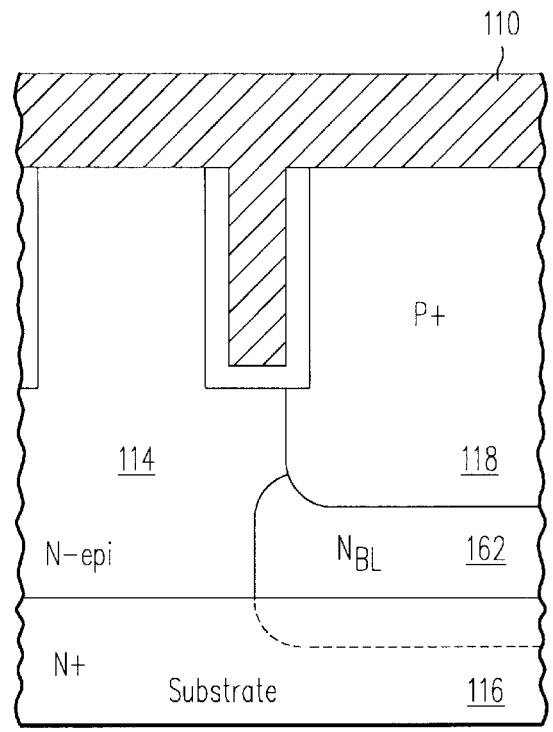

In FIG. 16c, the clamping diode 113 is simply a PN avalanche diode. The breakdown is controlled by an N-type diffusion 160 which is of the same conductivity type as the background (epi layer 114) but with a higher concentration. Selection of the background doping can be chosen from the diagonal line of the graph shown in FIG. 17a. Typically, for a clamp with a breakdown of 20V, 40V, 60V and 100V, the background concentration should be $2 \cdot 10^{18}$ cm$^{-3}$, $8 \cdot 10^{17}$ cm$^{-3}$, $5 \cdot 10^{17}$ cm$^{-3}$, and $2 \cdot 10^{17}$ cm$^{-3}$, respectively. The localized doping required to form the N-diffusion 160 involves a masking step with an added implant and drive-in diffusion. The lateral extent of the N-type diffusion 160 is held within the shallow junction implant, forming a type of buried zener diode, since the breakdown is not at the surface. In FIG. 16d, a similar buried zener diode is implemented as a PN avalanche diode with implanted localized doping which forms an N buried layer 159. (Note: The term "zener diode" is used herein to mean a diode that is intended to operate as a voltage clamp in breakdown, not to imply nor limit the interpretation of the breakdown mechanism to the zener, avalanche or tunneling effects.) The implant is performed at high energies to avoid long diffusion cycles. Alternatively, as shown in FIG. 16e, the avalanche breakdown of the PN diode can be set using localized doping from a N-type masked buried layer 162. The background doping of the epi layer 114 can be selected from the concentrations described previously for various voltage values.

Figure 16F:
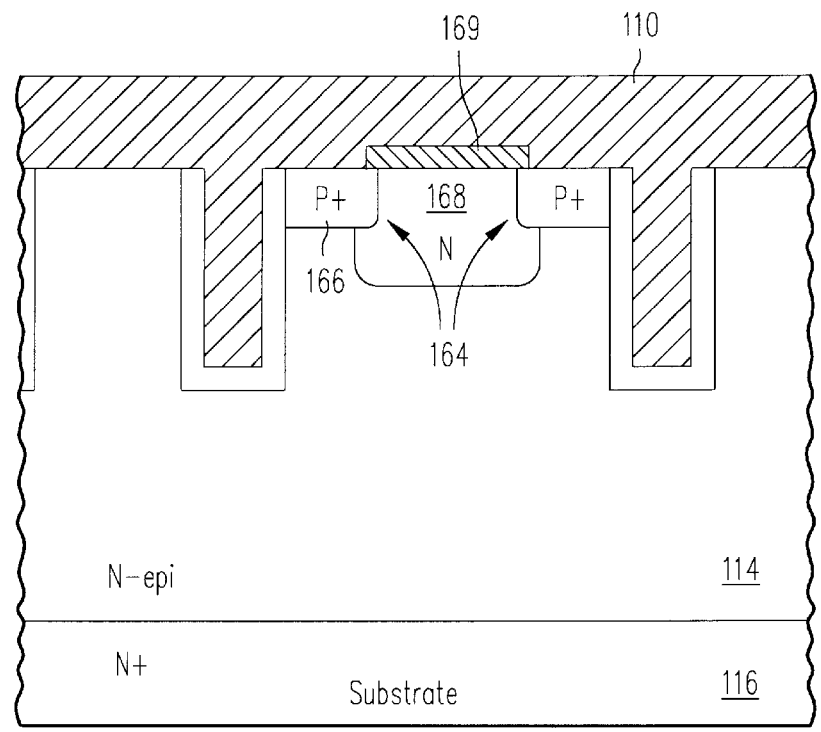
Figure 16G:
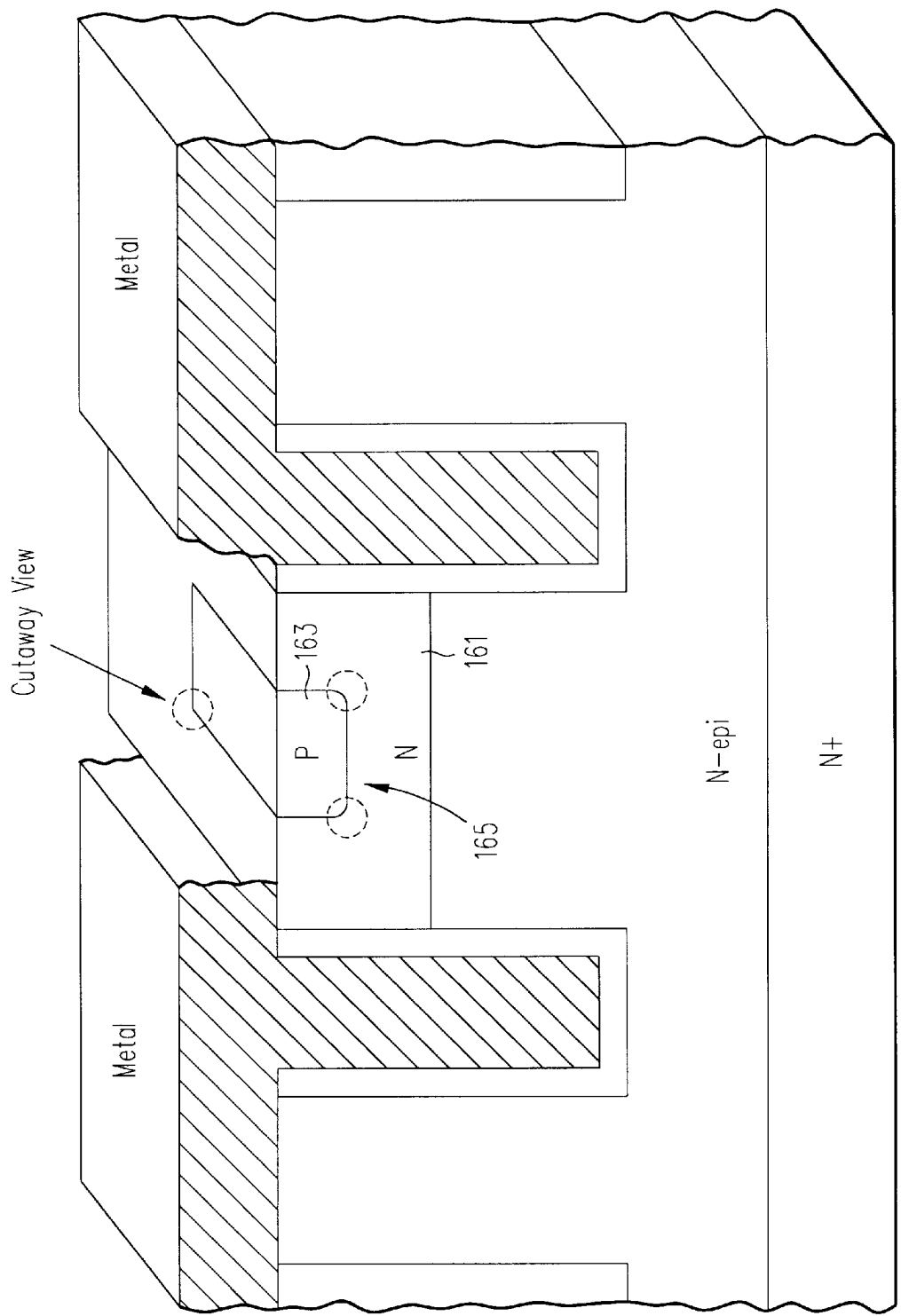
Figure 17B:
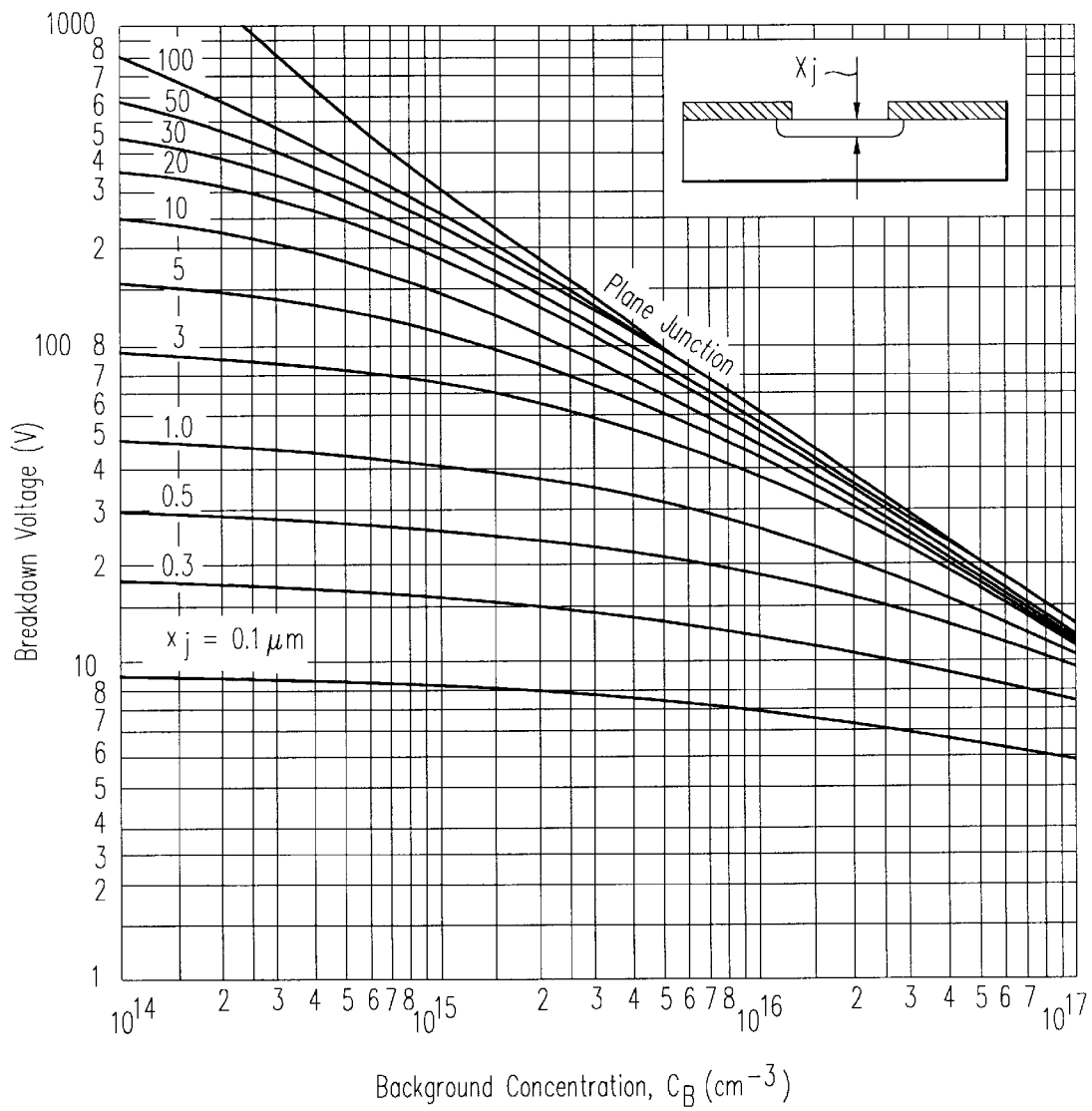
FIG. 17b is a graph showing the breakdown voltage of a PN diode including a single diffusion as a function of its background dopant concentration and the depth of the diffusion (which determines the maximum radius of curvature of the PN junction).

In FIG. 16f, a PN avalanche clamping diode 164 is created by localized doping laterally along the surface. Diode 164 is formed at the junction of a P+ region 166 and a central N region 168 (which is isolated from the metal 110 by an oxide layer 169). This approach wastes more area and may exhibit some breakdown shifts due to oxide charging (walkout) in non-active device regions. The method does, however, avoid avalanche at the trench edge. Finally, in the cutaway view of FIG. 16g, the breakdown voltage of PN clamping diode 165 is determined by the radius of curvature of the PN junction between P diffusion 163 and N region 161. Radius-of-curvature breakdown occurs at the sharp edges or "points" of a diffusion where the PN junction curves (see circled areas). The radius-limited breakdown may occur below the surface as a function of the junction depth or at the corner of a drawn feature. FIG. 17b illustrates how to select the breakdown diode clamping voltage for radius-of-curvature avalanche, using the junction depth ($x_j$) as the design criterion. A typical value of 20V, for example, requires a junction depth of 1.0 $\mu$m for a concentration of $2.4 \times 10^{16}$ cm$^3$.

Figure 18:
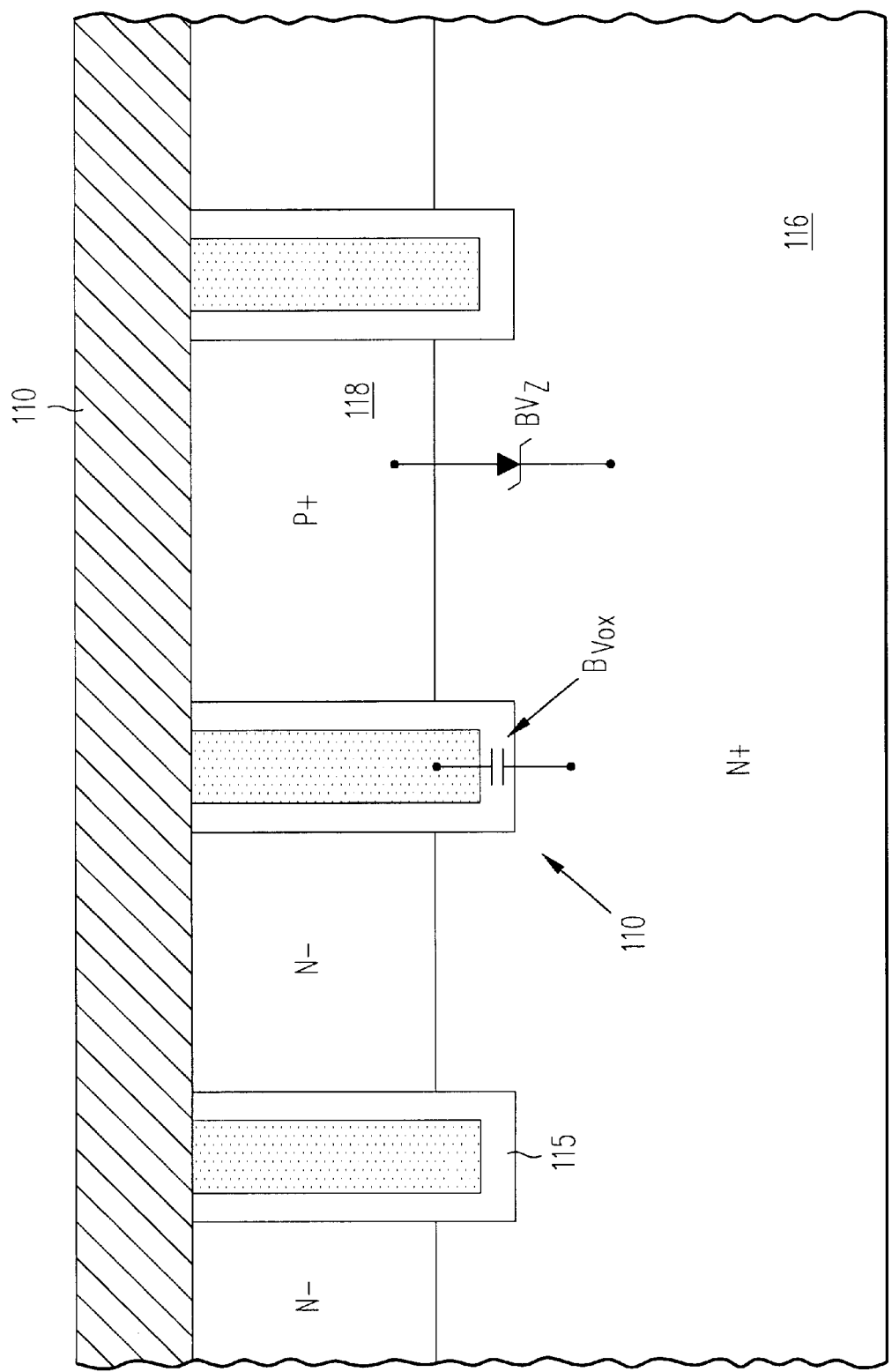
FIG. 18 is a cross-sectional view showing how a clamping diode may be used to prevent gate oxide rupture may be prevented in a low-voltage trench-gated Schottky diode.

In the event that the trench gate extends into heavily doped material, such as a buried layer or the updiffusing substrate, the gate oxide must survive the entire reverse-voltage. In FIG. 18, for example, the trenches 111 extend into the N+ substrate 116. The voltage of the clamping diode must meet a second criterion in such cases, namely that the electric field in the gate oxide layer 115 should not exceed around 4 to 5 MV/cm, which is roughly half of the electric field strength required to cause silicon dioxide to go into avalanche breakdown. This means that $BV_z \leq 50\% \cdot BV_{ox} = x_{ox} \cdot (4\ MV/cm)$.

The 4 MV/cm benchmark is for thick gate oxides (e.g., over 200 Å). Below this thickness the oxide tunneling current increases which helps protect the gate from the onset of destructive avalanche, so a maximum field greater than 5 MV/cm may be acceptable for reliable device operation (especially for limited periods of time).

Figure 19A:
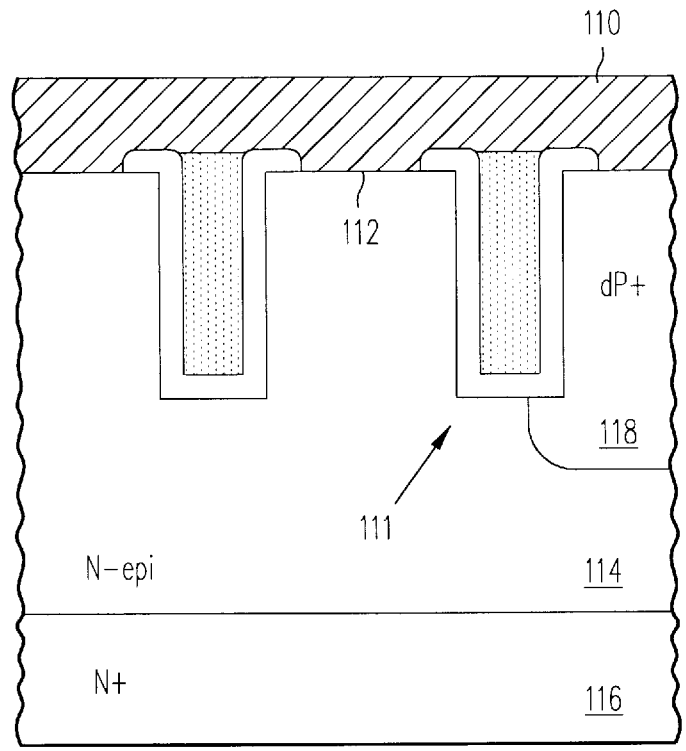
FIGS. 19a and 19b are cross-sectional views showing trench-gated Schottky diodes in which the Schottky interface is formed using a contact mask and is self-aligned with the trench, respectively.
Figure 19B:
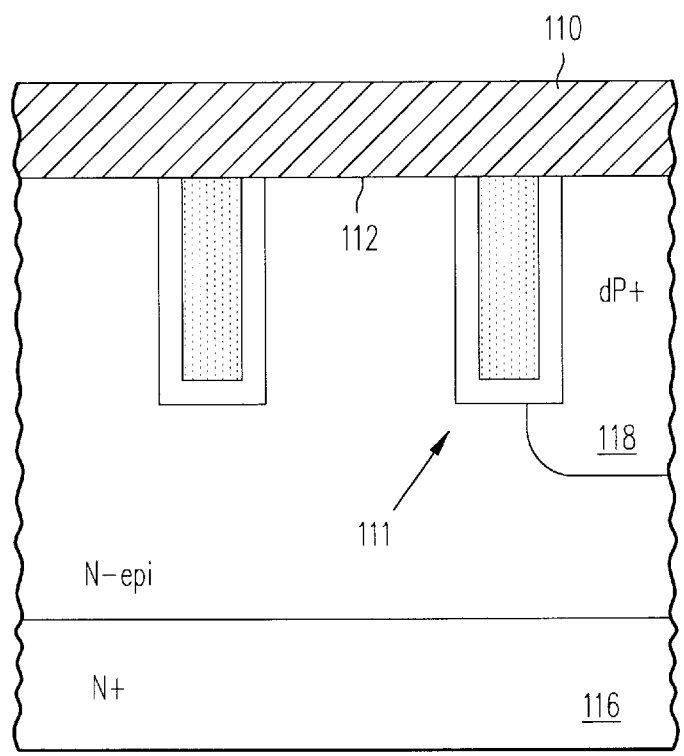

For completeness, it should be noted that the Schottky interface may be smaller than the width of the mesa between trenches or may extend the entire distance from trench to trench. In FIG. 19a, the Schottky interface 112 does not extend to the trench 111 because it is defined by a mask which must spaced from the trench to avoid etching the gate oxide away. This "contact" mask is spaced from the trench for misalignment purposes. In FIG. 19b, the Schottky interface 112 is defined by the trench since it is self-aligned. Self-alignment increases the Schottky area utilization giving a lower on-state voltage drop than non-Schottky devices.

Figure 20A:
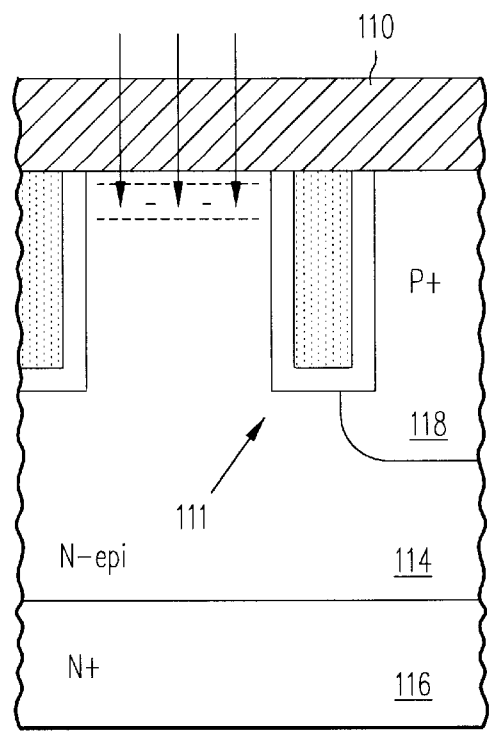
FIGS. 20a–20c are cross-sectional views illustrating various methods of controlling the barrier height in a trench-gated Schottky diode, including: using a barrier adjust implant (FIG. 20a), varying the gate material (FIG. 20b) and introducing a charge into the gate oxide (FIG. 20c).

FIG. 20a illustrates a method of independently adjusting the barrier height using an ion implantation that we here refer to as a "Schottky implant", performed either immediately before or after the Schottky metal is formed. The implant may be concentrated at the Schottky interface or diffused down into the mesa region between the trenches. The barrier height for a Schottky junction with a shallow implantation can be estimated by the expression $$\phi_b = \frac{kT}{q}\ln\left(\frac{A_p** T^2 Q_{imp}}{qn_i^2 D_p}\right)$$

where $A_p**$ is the effective Richardson constant for holes (for the case of N-type epi) and $D_p$ is the hole diffusivity. The implant $Q_{imp}$ has units of atoms/cm$^2$. Refer to S. Liang, W. T. Ng and C. A. T. Salama, "Schottky barrier diode characteristics under high level injection", Solid State Electronics, 33:39–46, 1990.

Figure 20B:
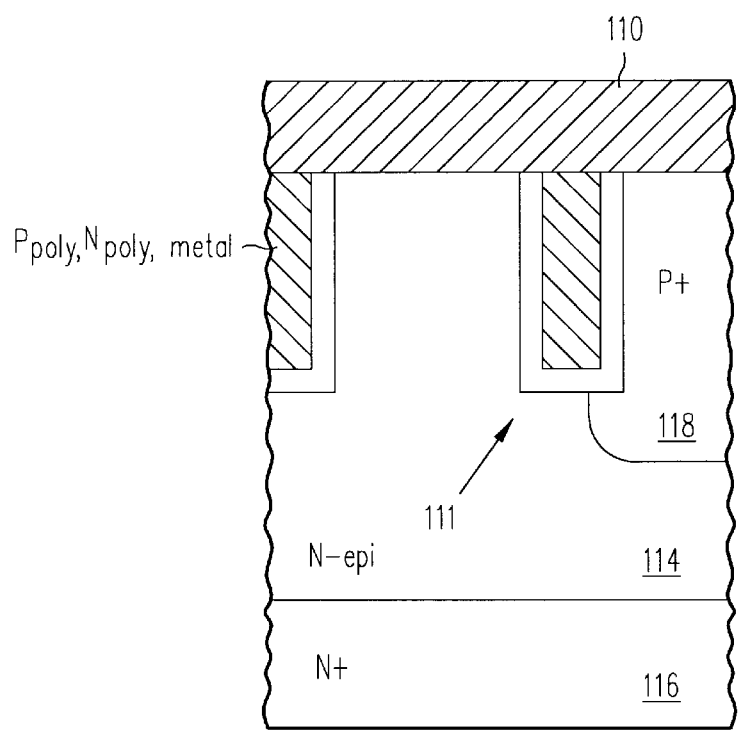

As indicated in FIG. 20b, the gate material can be changed by choosing different materials such as tungsten, aluminum, P- or N-type polysilicon, platinum, titanium, etc. Likewise, the gate oxide charge can be changed to affect the band bending and pinchoff (see FIG. 16c). Specifically, the oxide charge can be adjusted by implanting a large immobile element, such as cesium, with a high electronegativity or electropositivity. Any adjustment to the Schottky interface or to the gate work function changes the IV characteristic of the trench Schottky.

Figure 21A:
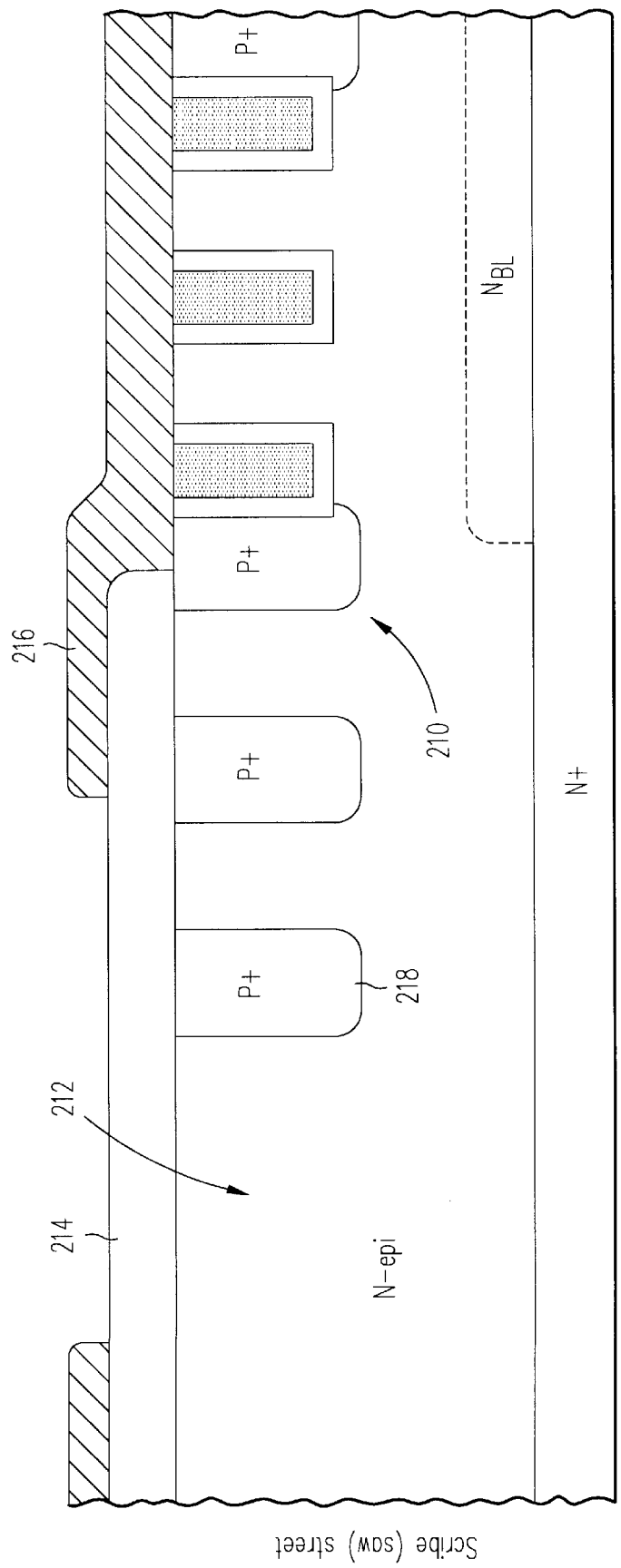
FIGS. 21a and 21b are cross-sectional views showing how the edge termination of a trench-gated Schottky diode can be formed using a clamping diffusion and a field plate, respectively.
Figure 21B:
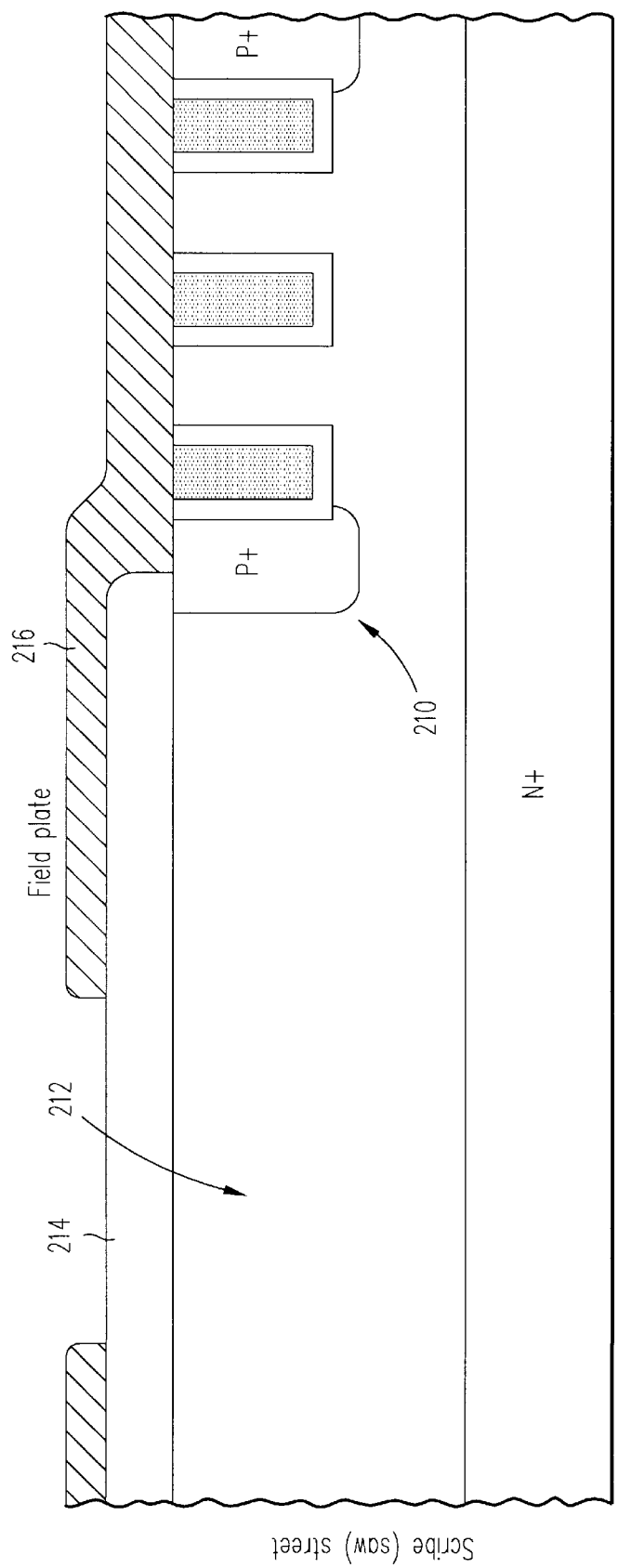

FIGS. 21a and 21b illustrate the use of a clamping diode 210 in an edge termination 212 to improve the device reliability by avoiding avalanche conduction in the termination. In FIG. 21a the termination 212 comprises a field oxide 214 ranging in thickness from 1000 Å to 2 μm (typically around 5000 Å) with a metal field plate 216 extending onto the field oxide 214 and with one or more "floating" diffused field rings 218 to aid in relaxing the electric fields along the surface. In FIG. 21b, only the field plate 216 is used to shape the field. If extra dopant is used in the clamping diodes to further lower their breakdown, this extra doping should be left out of the termination region. The other benefit of this junction is to reduce the electric field which could give rise to ionic migration along the termination.

Figure 22E:
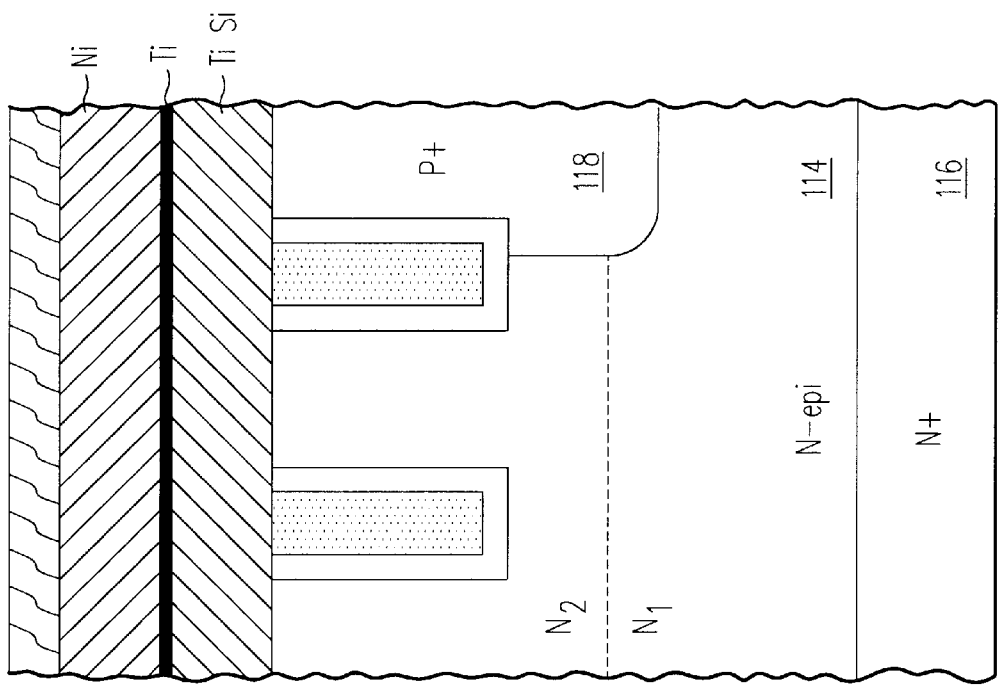
FIGS. 22a–22e illustrate various structures for the metal in the Schottky diode.
Figure 20C:
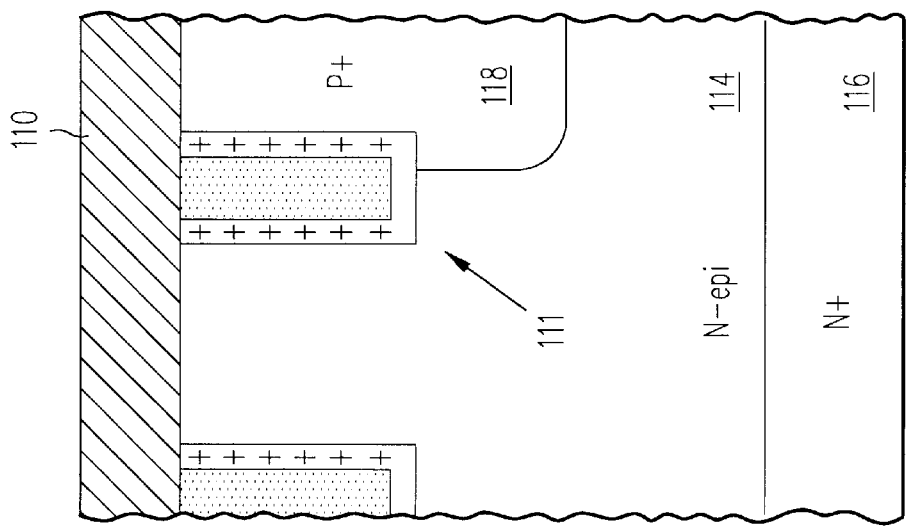
Figure 22B:
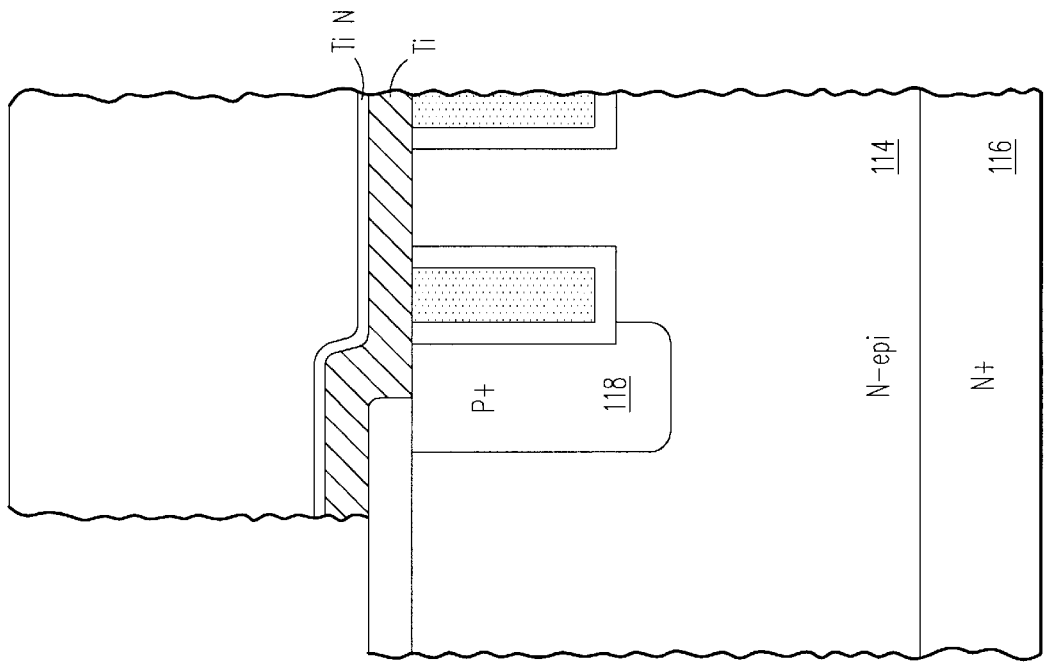
Figure 22A:
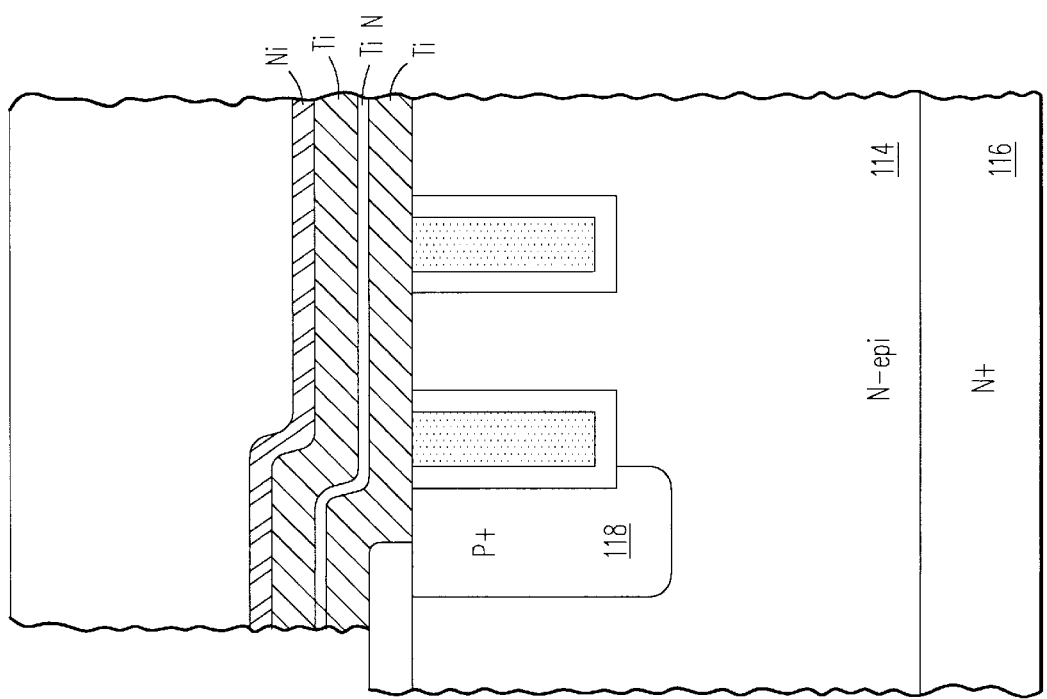
Figure 22D:
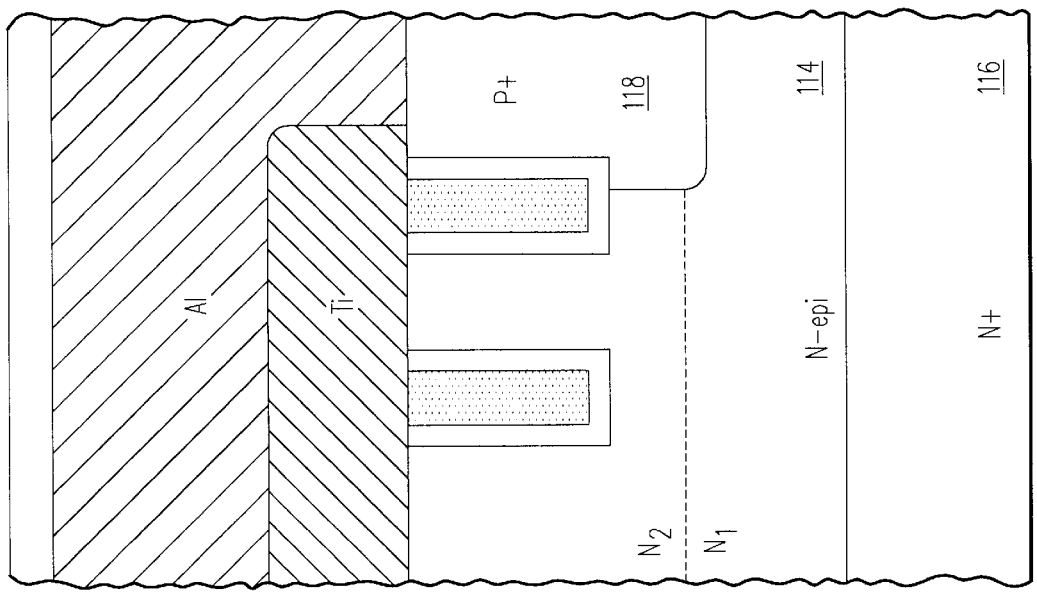
Figure 22C:
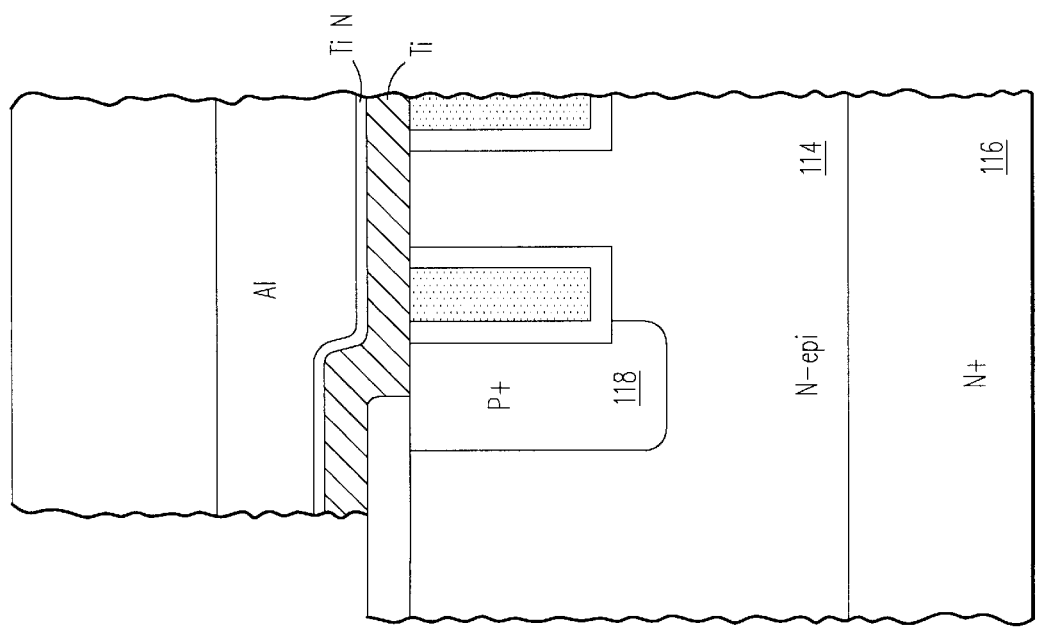

FIGS. 22a–22e illustrate various metal structures in a voltage-clamped trench-gated Schottky diode. In FIG. 22a a sandwich of titanium followed by nickel and then by a thin layer of a top side metal is deposited on the trench-gated Schottky diode. The Schottky metal is itself shown as a layer of titanium with an overlying layer of titanium nitride. This approach is particularly advantageous if the Schottky metal itself is titanium or titanium disilicide since it involves an all titanium interface. Of course, as shown in FIG. 22b, another metal may be deposited directly on the Schottky metal depending on the metallurgy. The other metal may be sputtered, evaporated or plated on the device. In FIG. 22c, a layer of a top side metal is deposited over an aluminum layer formed on top of the Schottky metal. FIG. 22d shows the same structure but where the aluminum contacts the diode directly. FIG. 22e shows a Schottky metal which comprises a titanium silicide formed by reacting the titanium with the silicon before depositing the top metal.

Methods of Fabrication

Figure 23:
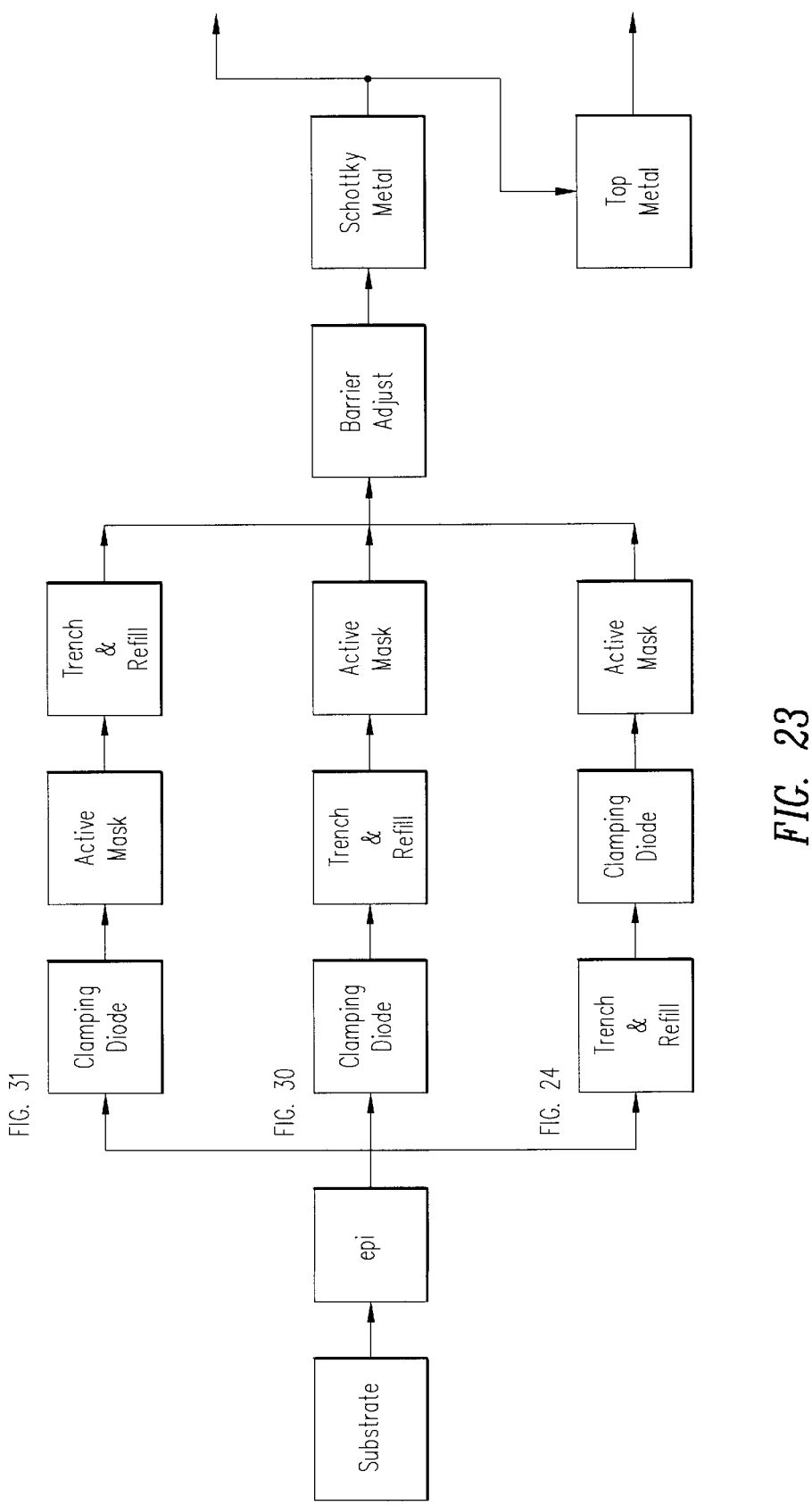
FIG. 23 is a flowchart illustrating several basic fabrication sequences for a voltage-clamped trench-gated Schottky diode.

FIG. 23 illustrates several process flows for fabricating a voltage clamped trench-gated Schottky diode. In general the process involves growing an epi layer on a heavily doped substrate, followed by an interchangeable sequence of forming a clamping diode, etching through an oxide to define active areas where the Schottky will be formed, creating an oxide-lined trench and planarizing with some material such as polysilicon. After this sequence, the remaining steps involve (optionally) adjusting the barrier height of the Schottky interface with an implant, forming the Schottky metal, and then (optionally) forming another interconnect or top metal. The process is described for N-type silicon, but the principles can likewise be applied to P-type silicon.

Figure 24B:
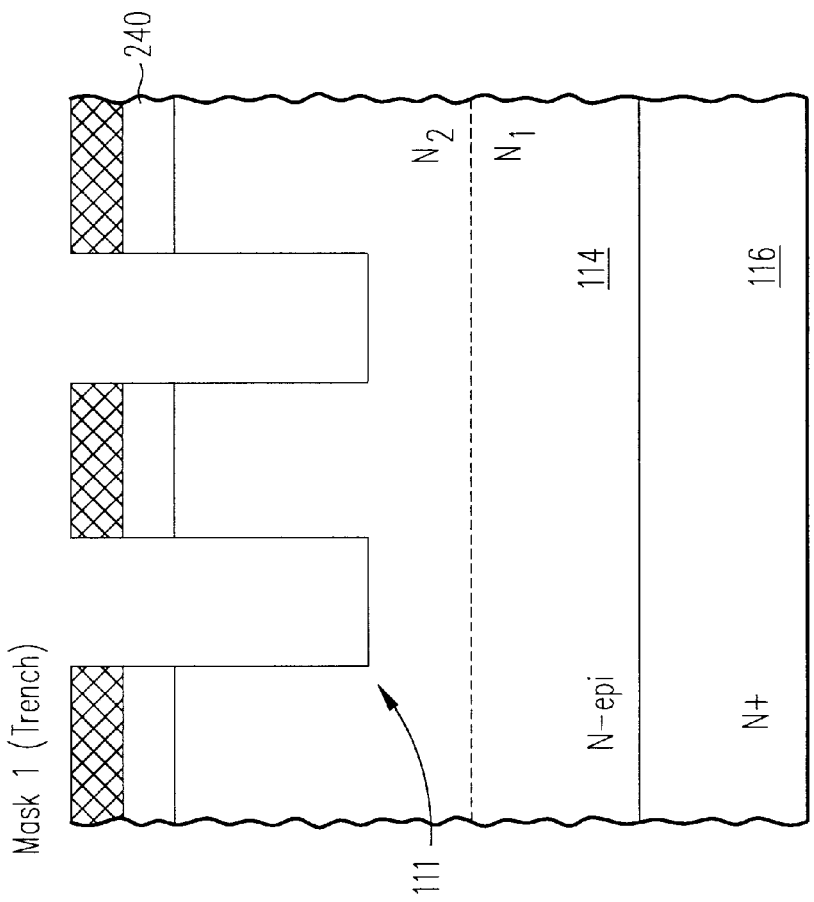
FIGS. 24a–24f are cross-sectional views illustrating the steps of a process of fabricating a voltage-clamped trench-gated Schottky diode in which the gate trench is formed before the clamping diode.
Figure 24A:
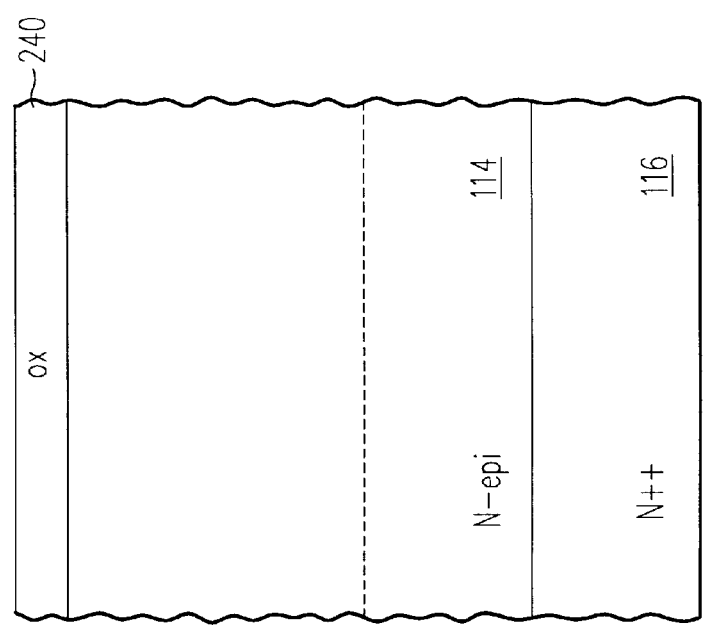
Figure 32:
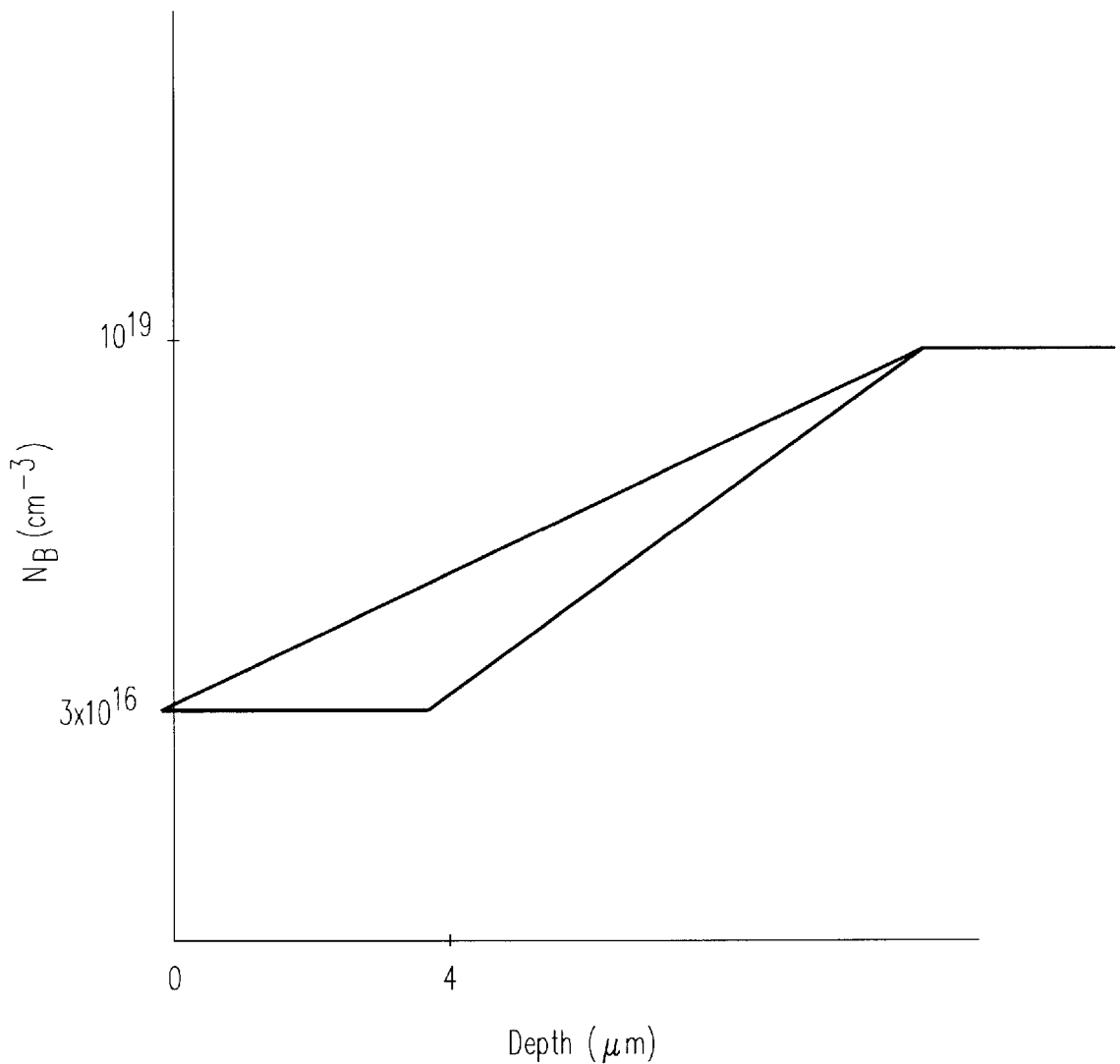

FIG. 24a illustrates a cross section of the wafer after growth of the N-epitaxial layer 114 and a subsequent oxidation. The substrate 116 is N++, doped with arsenic, antimony or phosphorus to a resistivity as low as 1 to 5 ohm-cm. The phosphorus-doped epi layer 114 having a concentration of $10^{16}$ cm$^{-3}$ but as high as $10^{18}$ cm$^{-3}$ is grown to a thickness of 1 to 6 μm. To remain competitive with standard Schottky diode performance, the epi layer 114 generally has a concentration in the range of $3·10^{16}$ cm$^{-3}$ to $3·10^{17}$ cm$^{-3}$ and is targeted for a net thickness of 4 μm. Alternatively, epi layer 114 can be grown at a dopant concentration of $3·10^{17}$ to $3·10^{18}$ to a thickness of 2 to 4 μm, followed by a 1 to 2 μm thick layer having a dopant concentration of $3·10^{16}$ to $3·10^{17}$ cm$^{-3}$ (the two sublayers being represented by the dashed line in FIG. 24a). Or the epi layer 114 can be graded in doping from a starting concentration of $10^{19}$ cm$^{-3}$ to a final surface concentration of $3·10^{16}$ cm$^{-3}$. As shown in FIG. 32, the gradient may be continuous or may include a flat portion of lower concentration 1 to 4 μm deep (preferably below the trench). After growth of the epi layer 114, the surface is oxidized to a thickness of 1000 Å to 5000 Å using dry oxygen or steam at a temperature of 900 to 1100° C., forming oxide layer 240.

The oxide layer 240 is then photomasked and etched to define the trench gate regions, as shown in FIG. 24b. Using the oxide and possibly photoresist as a mask trenches 111 are then etched into the silicon using a reactive ion etcher. The gas composition involves a fluorocarbon and some oxygen. The mix of gasses controls the anisotropy of the etching process. The trench is etched to a depth of 1 to 5 μm with a width of 2 to 0.4 μm and a spacing between trenches (mesa width) of 2 to 0.3 μm, but preferably a depth in the range of 2 to 3 μm with a 0.6 μm width and a 0.6 μm spacing. The trenches should not extend into the higher concentration layer of the stepped epi layer or should stay in material having a concentration below $3·10^{17}$ cm$^{-3}$ in the graded-epi version.

Next the trench is oxidized to form a sacrificial oxide, typically to a thickness of 200 to 1000 Å, stripped of its oxide and reoxidized to form a gate oxide 115 having a thickness which may range from 100 Å to 1500 Å, depending on the diode design criteria. The gate oxide is typically formed in dry oxygen at 900 to 1050° C. for 20 to 200 min. with a chlorine source such as TCA present for mobile charge immunity. Polysilicon 242 is then deposited to a thickness of 3000 to 8000 Å and preferably around 5000 Å using CVD, as shown in FIG. 24c, followed by doping using POCL$_3$ to a sheet resistance of 20 to 160 ohms/square. Next the polysilicon is etched back level with the silicon surface, thereby exposing the gate oxide 115 at the silicon surface.

Figure 24D:
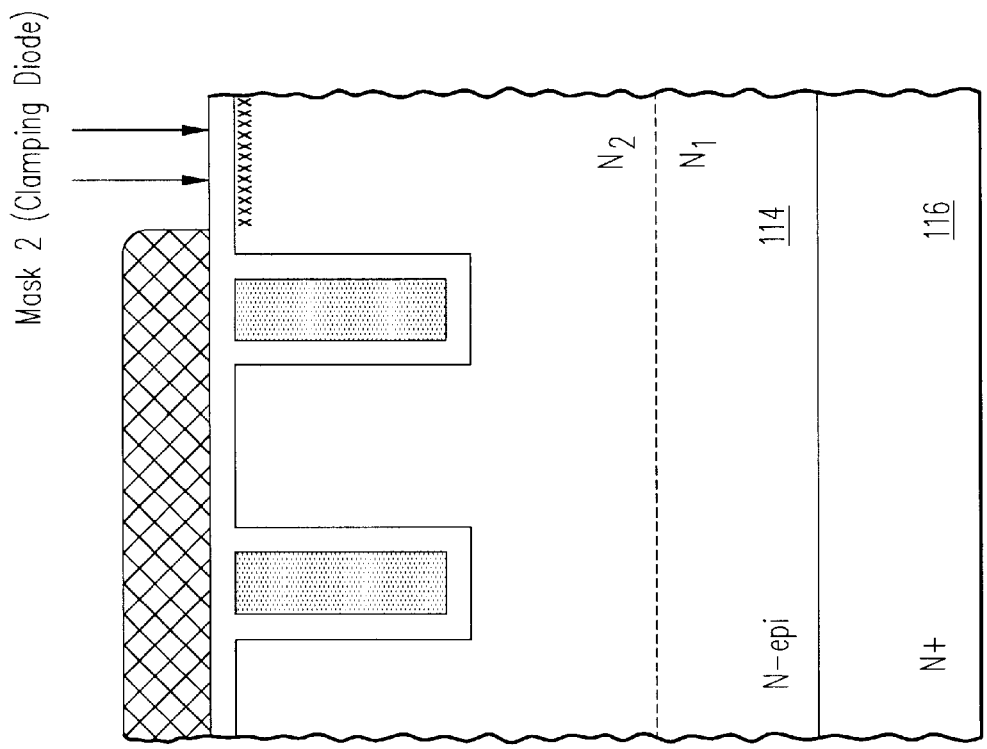
Figure 24C:
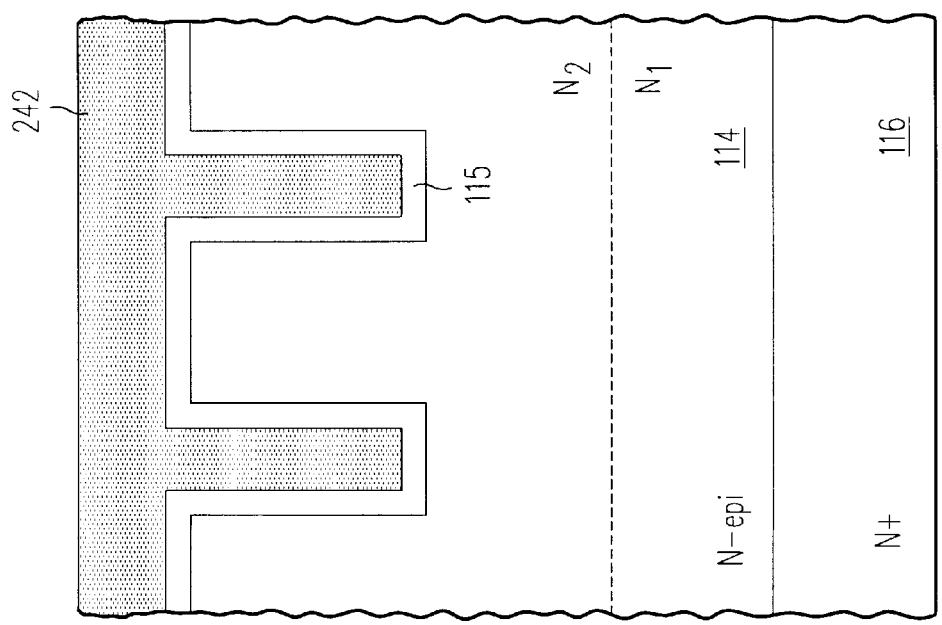

As shown in FIG. 24d, the anode of the clamping diode is then formed by implanting boron via a photomask (mask #2) at a dose ranging from $2·10^{14}$ to $8·10^{15}$ cm$^{-2}$ and at an energy of 40 to 300 keV. The P+ diffusion (anode) is subsequently driven deep by a 950 to 1100° C. diffusion for 1 to 8 hrs to a junction depth desired but preferably deeper than the trench (see FIG. 24e). In the stepped epitaxy version, the junction should be driven into the underlying higher concentration epi layer ($N_1$). An oxide layer 1000 Å to 1 μm thick can be grown during this drive-in and subsequently masked to expose the active areas where the Schottky interface is to be formed. The thick oxide layer is left in place in the field oxide region of the device.

Figure 25:
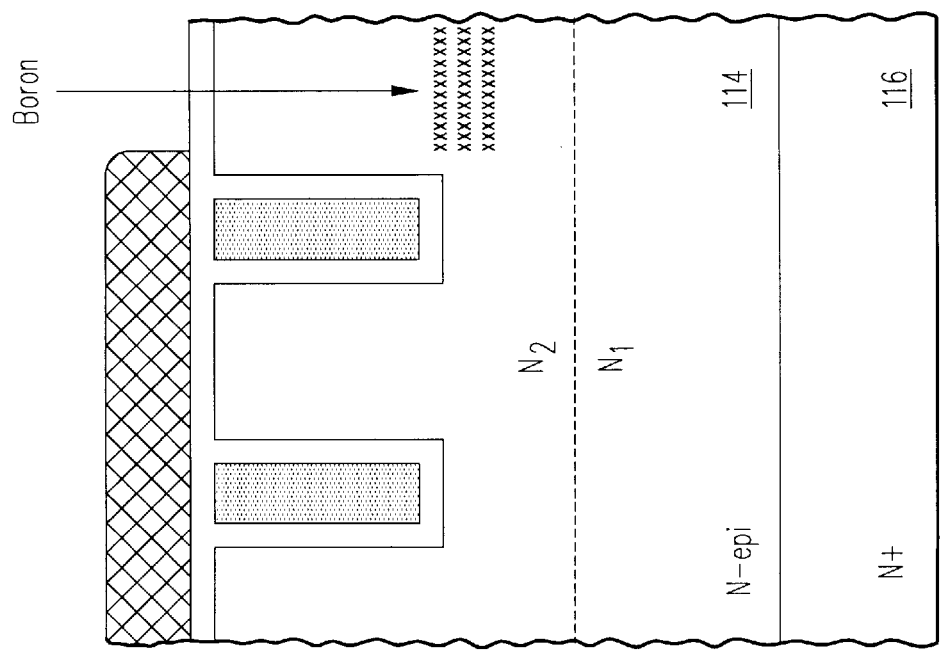
FIG. 25 is a cross-sectional view showing an optional way of forming a clamping diode by using a high energy implant to minimize the diffusion time.

The ion implantation can be replaced by a boron predeposition at 900 to 1100° C. for 15 min to 3 hr resulting in a sheet resistance of 30 to 300 ohms/square, but this requires the formation of an photomasked oxide layer prior to predeposition having a thickness of 2000 Å to 2 μm to prevent doping of the polysilicon in the trenches. Another method to form the deep P+ diffusion 118 involves a high energy ion implantation of boron from 1 MeV up to 3 MeV at a dose from $2 \cdot 10^{13}$ cm$^{-2}$ to $5 \cdot 10^{14}$ cm$^{-2}$, as shown in FIG. 25.

Figure 24F:
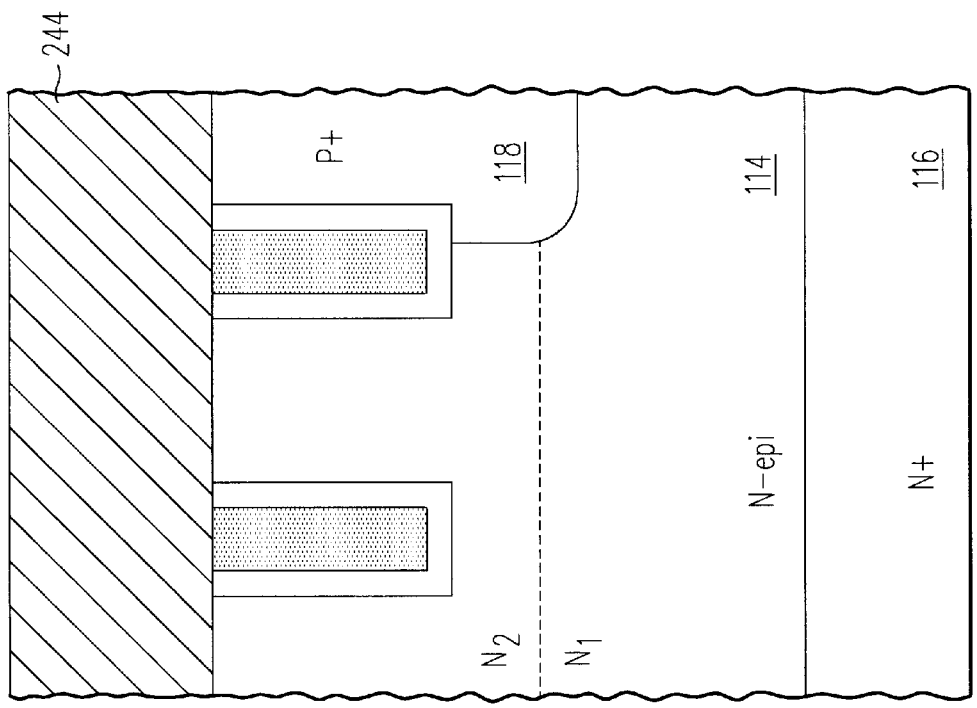
Figure 24E:
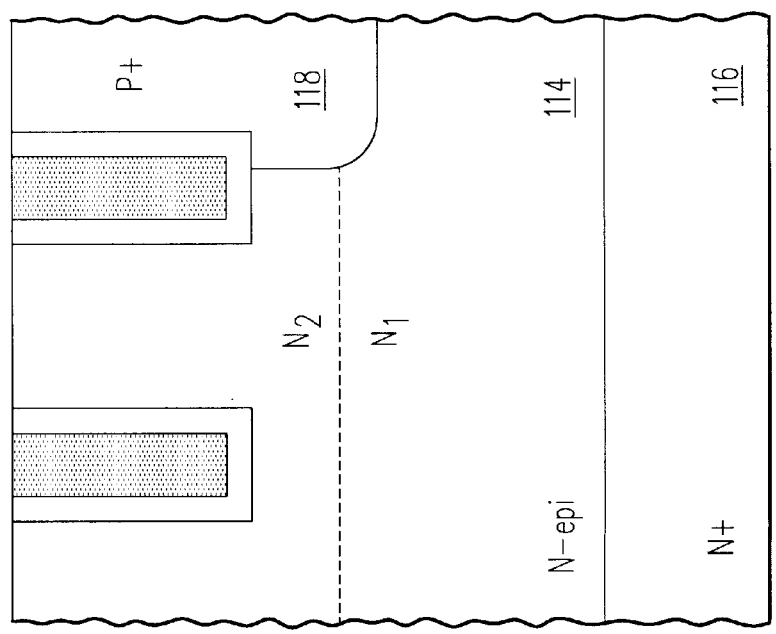
Figure 26:
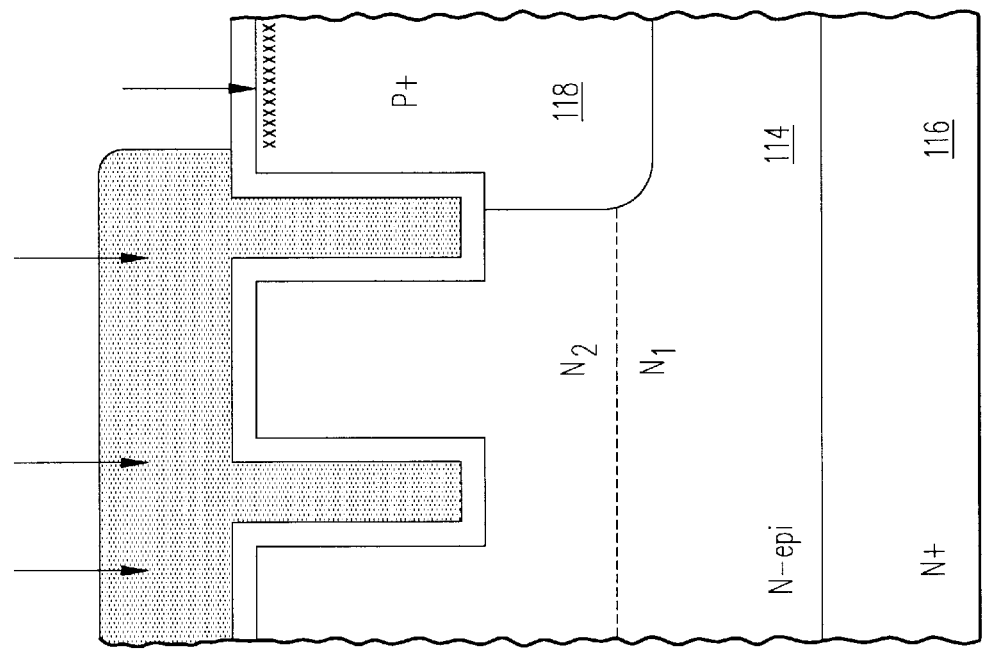
FIG. 26 is a cross-sectional view showing an optional way of forming a clamping diode by using a patterned polysilicon trench refill to mask the diode implant.

FIGS. 24c–24e describe a sequence where the poly is formed and doped and then the clamping diode is formed in a subsequent operation. In this manner, the doping of the polysilicon gate and the clamping diode diffusion 118 need not be of the same concentration or conductivity type. An alternative approach, illustrated in FIG. 26, involves etching the polysilicon after deposition to define the diode areas and subsequently doping the polysilicon with the same implant or predeposition as the diode diffusion. In this process flow, if the diode diffusion 118 is an anode the polysilicon gate will also be doped with P-type material, e.g. boron.

As another variant, if the background doping of the cathode of the Schottky is to be selectively raised prior to forming the anode, the cathode can receive an ion implantation or predeposition to a concentration desired to give the target breakdown.

Figure 27B:
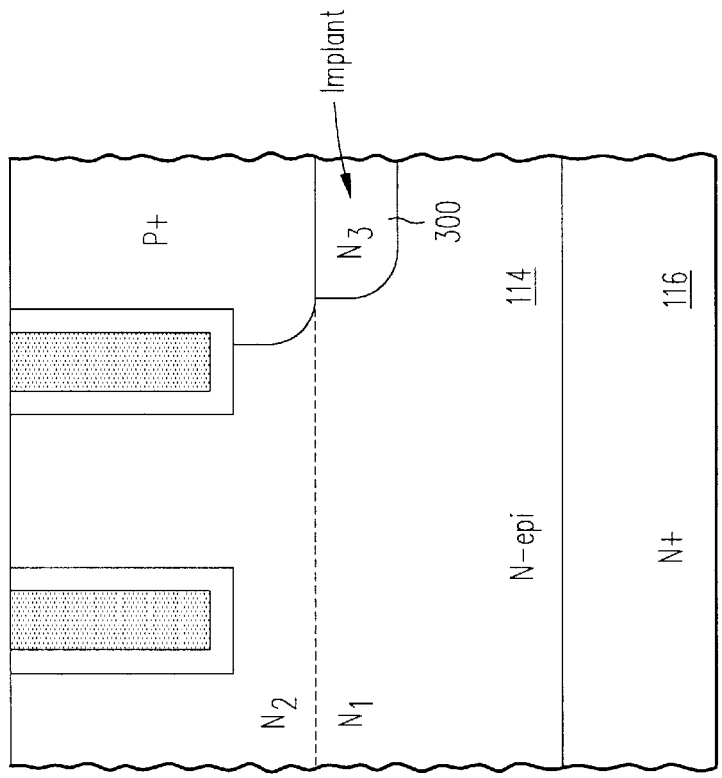
FIG. 27b is a cross-sectional view showing the process of FIG. 27a after a diffusion or annealing step.
Figure 27A:
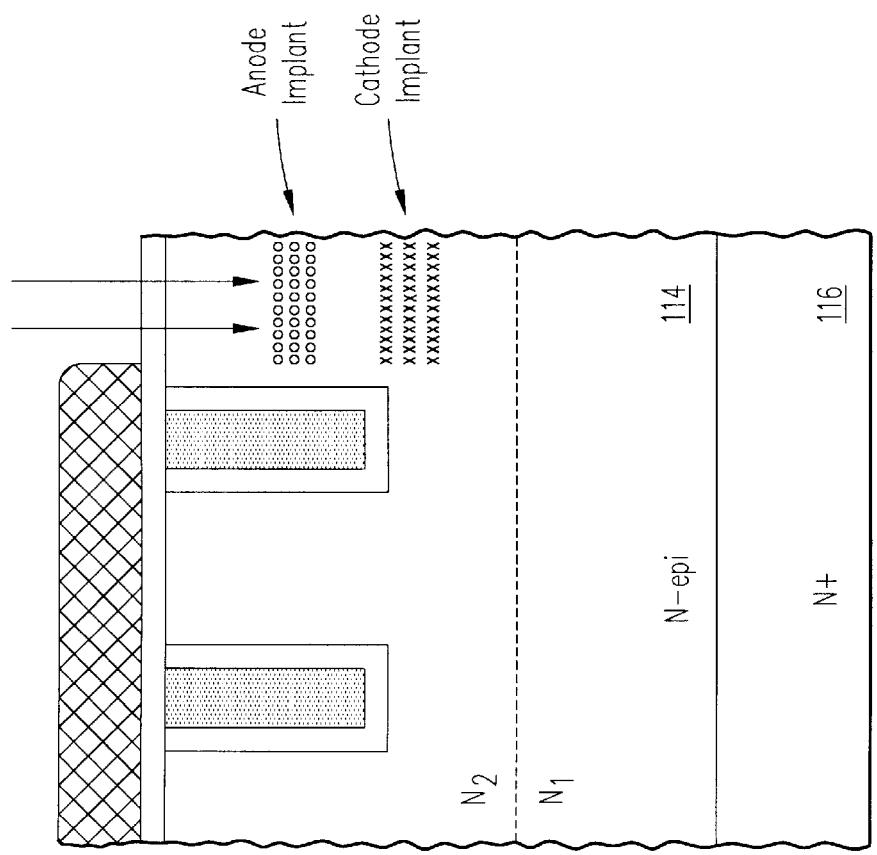
FIG. 27a is a cross-sectional view showing a process for forming a graded clamping diode using high energy implant profiling, the process being showing during ion implantation.
Figure 27C:
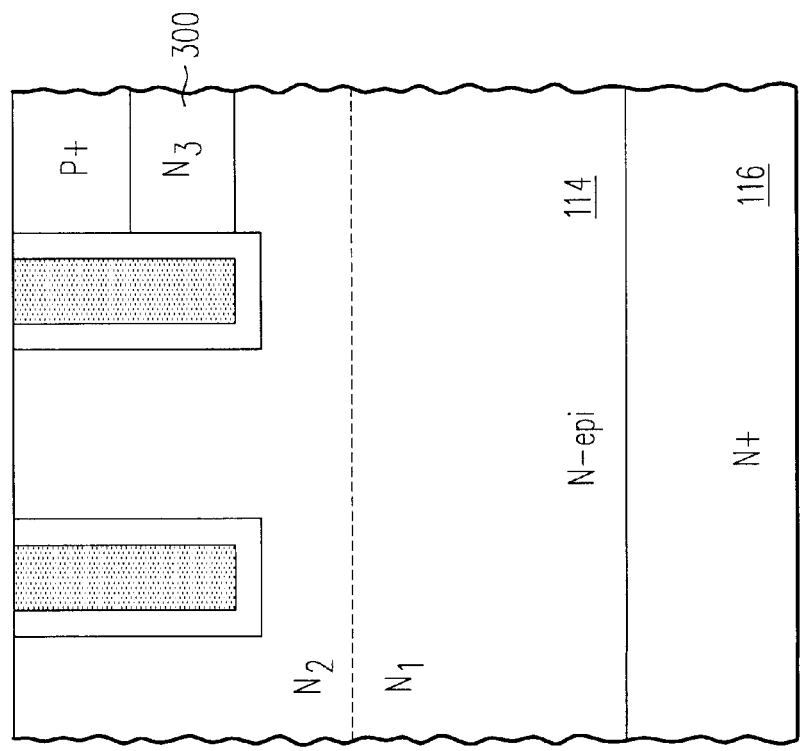
FIGS. 27c and 32 are cross-sectional views of the process of FIG. 27a performed using lower energy implants to form the clamping diode at a shallow depth.

In one such method an implant to form the underlayer precedes the P+ anode implant. Implant doses range from $10^{12}$ to $10^{14}$ cm$^{-2}$ and require additional diffusion time to remain deeper than the anode. For example, the cathode implant can be performed at lower energies, e.g. 20 to 150 keV and then driven in at 900 to 1150° C. for 30 min to 12 hrs to a desired depth deeper than that of the final anode depth. Or, as shown in FIG. 27a, the cathode implant can be implanted at a high energy, from 150 keV to 3 MeV, to position the dopant below the intended anode junction depth. The resulting structure, shown in FIG. 27b, has an N-buried layer 300 with a breakdown determined by the concentration $N_3$ established by the cathode implant. The high energy ion implanted version can also be performed after the anode drive in since the dopant can be positioned by the implant profile. Alternatively, as shown in FIG. 27c, the entire diode can be made more shallow using lower implant energies.

Figure 28B:
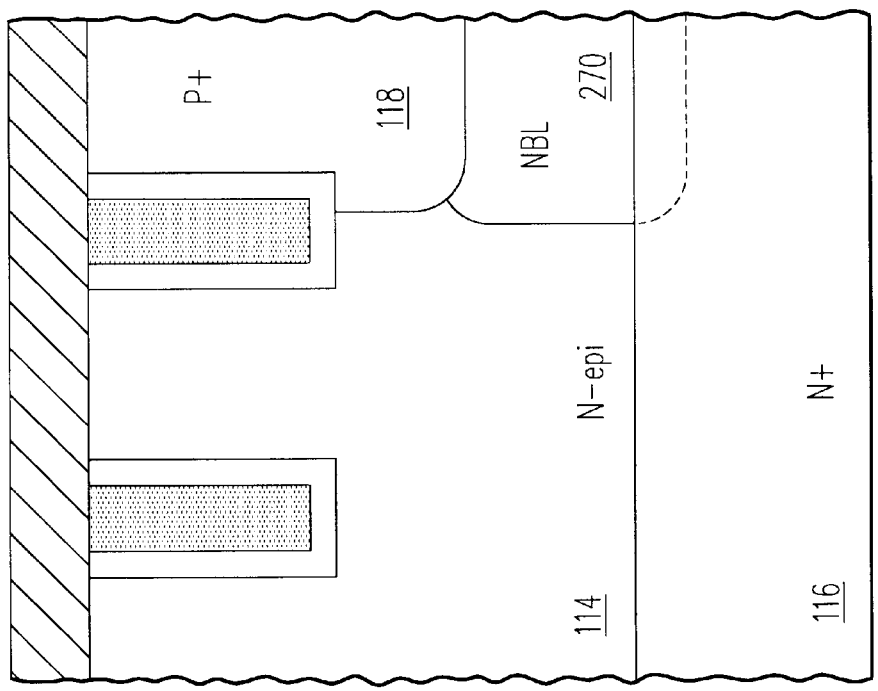
FIGS. 28a and 28b are cross-sectional views showing a process of forming a clamping diode using a buried layer.
Figure 28A:
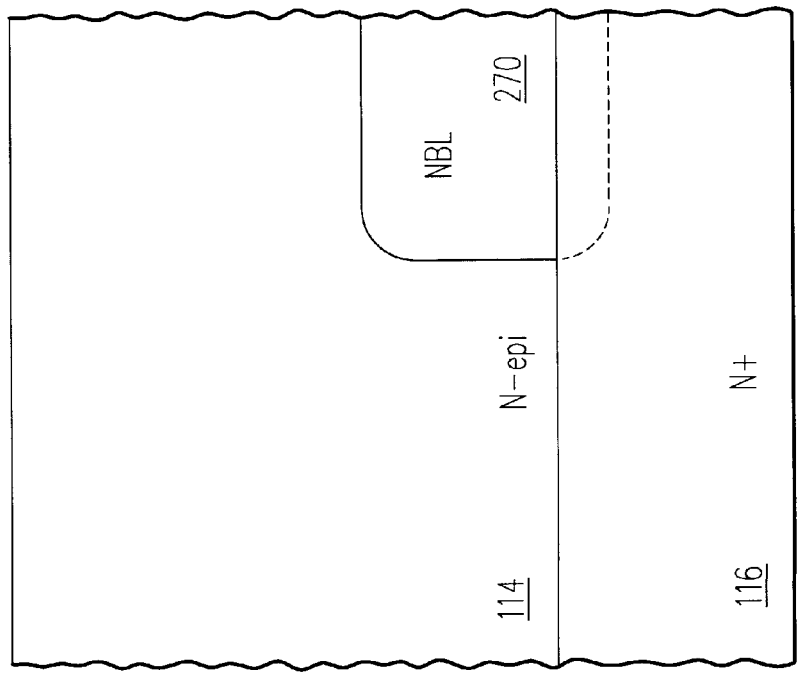

Another way to lower the breakdown of the clamping diode is by implanting a N+ buried layer 270 prior to forming the epi layer, as shown in FIG. 28a. The final structure, shown in FIG. 28b, results from the meeting of the down-diffusing P+ diffusion 118 and the up-diffusing N+ buried layer 270.

After the clamping diode and gate are formed, any surface oxide in the active areas can be removed (without removing the field oxide), and the Schottky metal be deposited. Such a metal may be evaporated, sputtered or deposited by organometallic CVD methods. A layer 200 A to 2 μm thick may be used. One version is shown in FIG. 24f, where the Schottky metal 244 covers the mesa regions between the trenches (where the Schottky interface 112 is to be formed) and likewise ohmically contacts the exposed anodes of the clamping diodes and the polysilicon gate. The doping of the anode and the polysilicon must be high enough to form a non-rectifying, ohmic contact with the Schottky metal 244. The Schottky metal 244 may then be masked and removed selectively at the die perimeter if an edge short is a concern during die scribing and sawing.

Figure 29C:
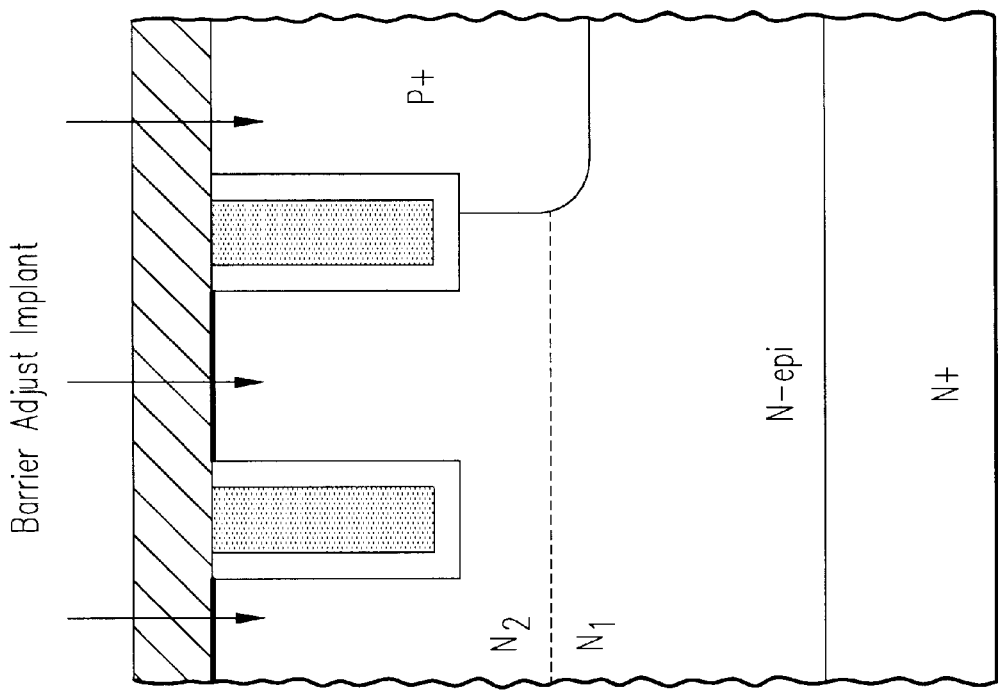
FIGS. 29a–29c are cross-sectional views showing a process for altering the barrier height of a voltage-clamped trench-gated Schottky diode by implanting ions prior to Schottky metallization (FIGS. 28a and 28b) or implanting ions through the Schottky metal (FIG. 28c).
Figure 29B:
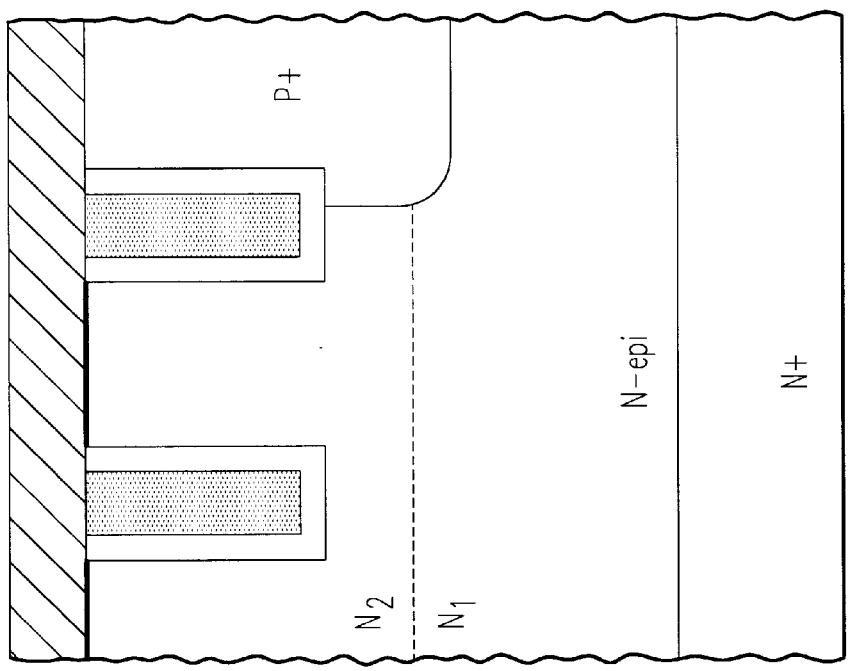
Figure 29A:
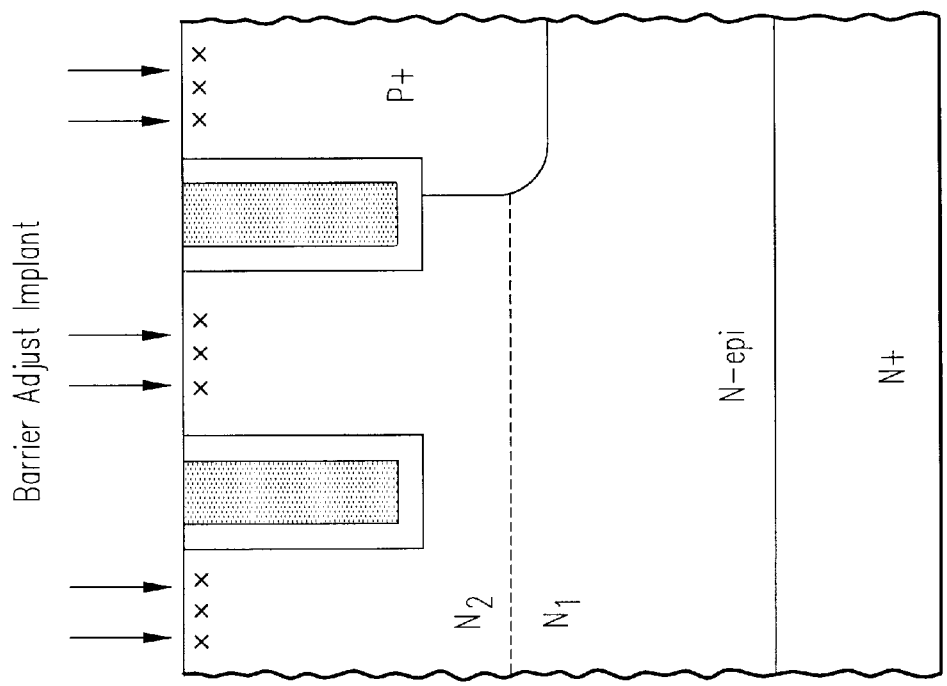

As another option, the Schottky metal 244 may then be masked and removed over the clamping diodes, and a subsequent ohmic metal layer such as aluminum may be deposited over the entire diode. The aluminum should provide a good ohmic contact to the Schottky metal as well as the clamping diode. The polysilicon can also be exposed in regions outside the diode stripes or cells themselves and allowed to contact the aluminum directly. The aluminum metal may then be removed around the die edge to prevent edge shorts. The barrier height may be adjusted up or down by either a boron or phosphorus implant in the range of $10^{11}$ cm$^{-2}$ to $10^{13}$ cm$^{-2}$ at energies of 20 to 300 keV. The implant may precede the Schottky metal deposition, as shown in FIG. 29a to form the structure of FIG. 29b. Alternatively, as shown in FIG. 29c, the barrier adjustment implant may be performed after the Schottky metal deposition by increasing the energy to compensate for the thick metal.

As a final interconnect layer, a surface of metal can be formed on top of the Schottky metal or on top of the Schottky-aluminum sandwich.

Figure 30B:
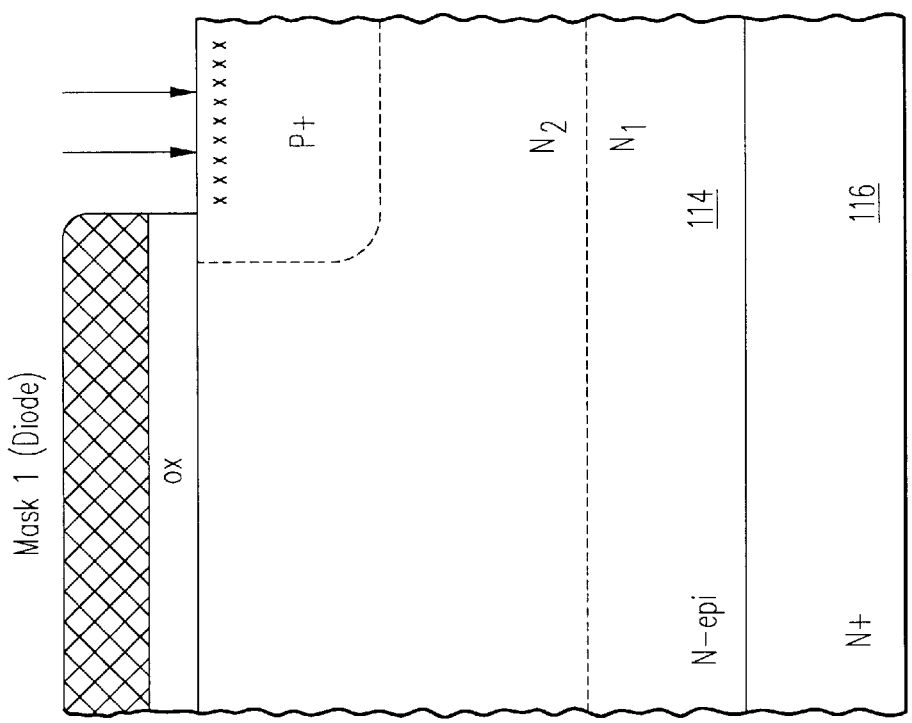
FIGS. 30a–30e are cross-sectional views illustrating the steps of a process of fabricating a voltage-clamped trench-gated Schottky diode in which the clamping diode is formed before the trench.
Figure 30A:
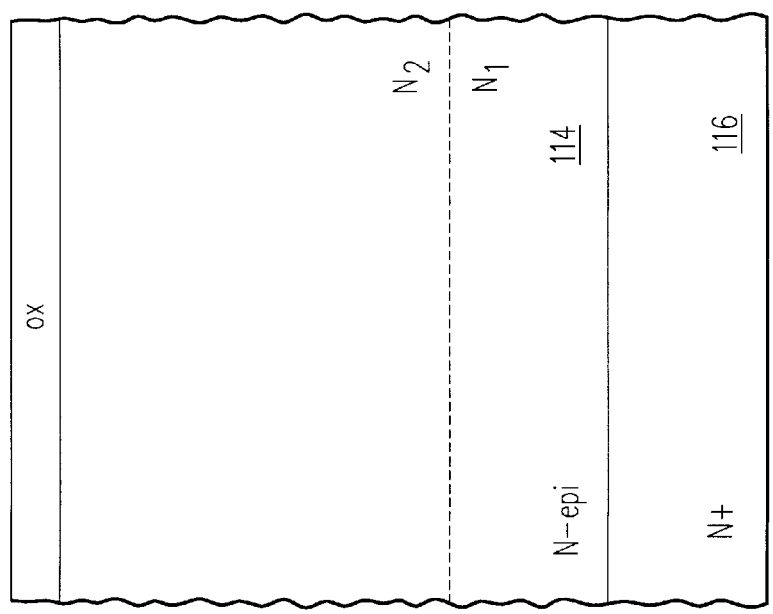

An alternate process flow, shown in FIG. 30a–30e, involves forming the clamping diode prior to forming the trench so that only low temperature processing can be employed after the gate oxide is grown. In FIG. 30a, epi is grown on the substrate using the doping concentrations described above. After the growth of epi layer 114, oxide layer 240 is grown to a thickness of 2000 Å to 2 μm, patterned with a mask photolithography (mask #1), and implanted with the clamping diode implant (FIG. 30b). The implant dose may range from $10^{18}$ to $8 \cdot 10^{19}$ cm$^{-3}$ at energies ranging from 20 to 300 keV. An alternative process forms the diode by predeposition using boron nitride for P-type diffusions (or POCL$_3$ for N-type diffusions) to a sheet resistance of typically 20 to 150 ohms/square.

Figure 30D:
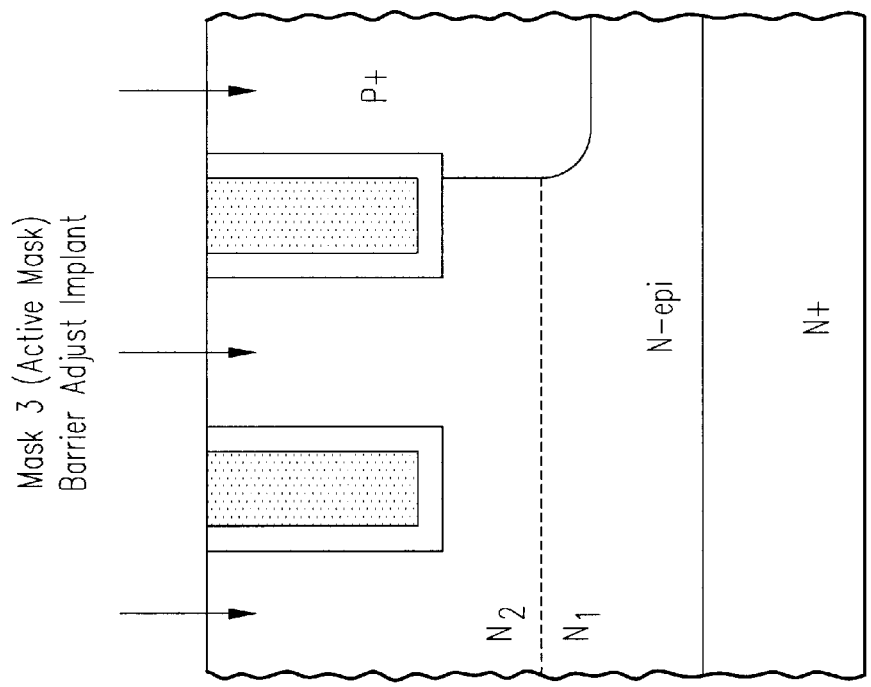
Figure 30C:
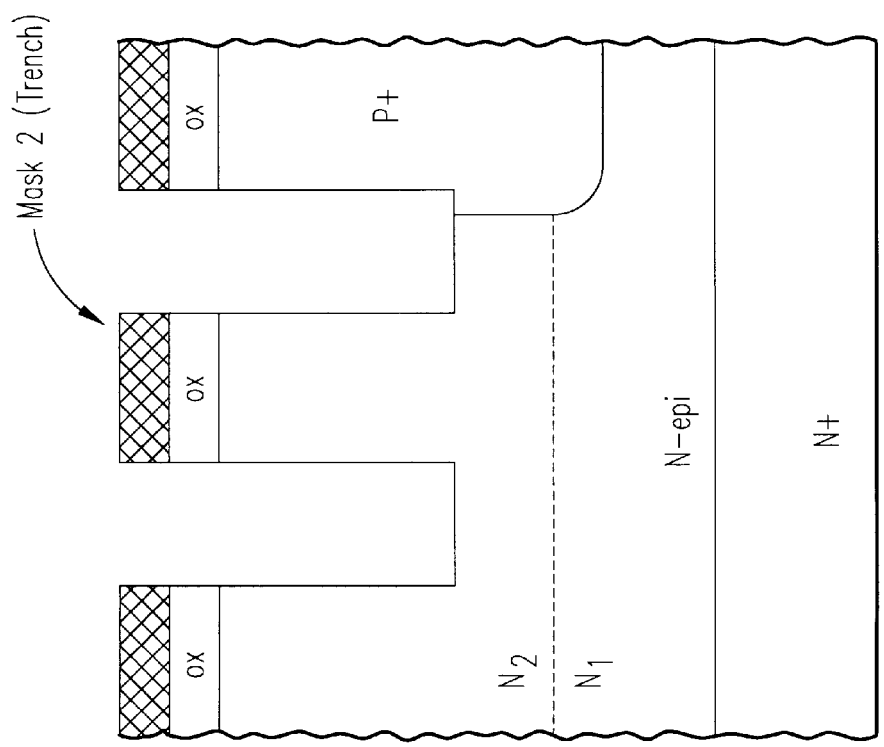
Figure 30E:
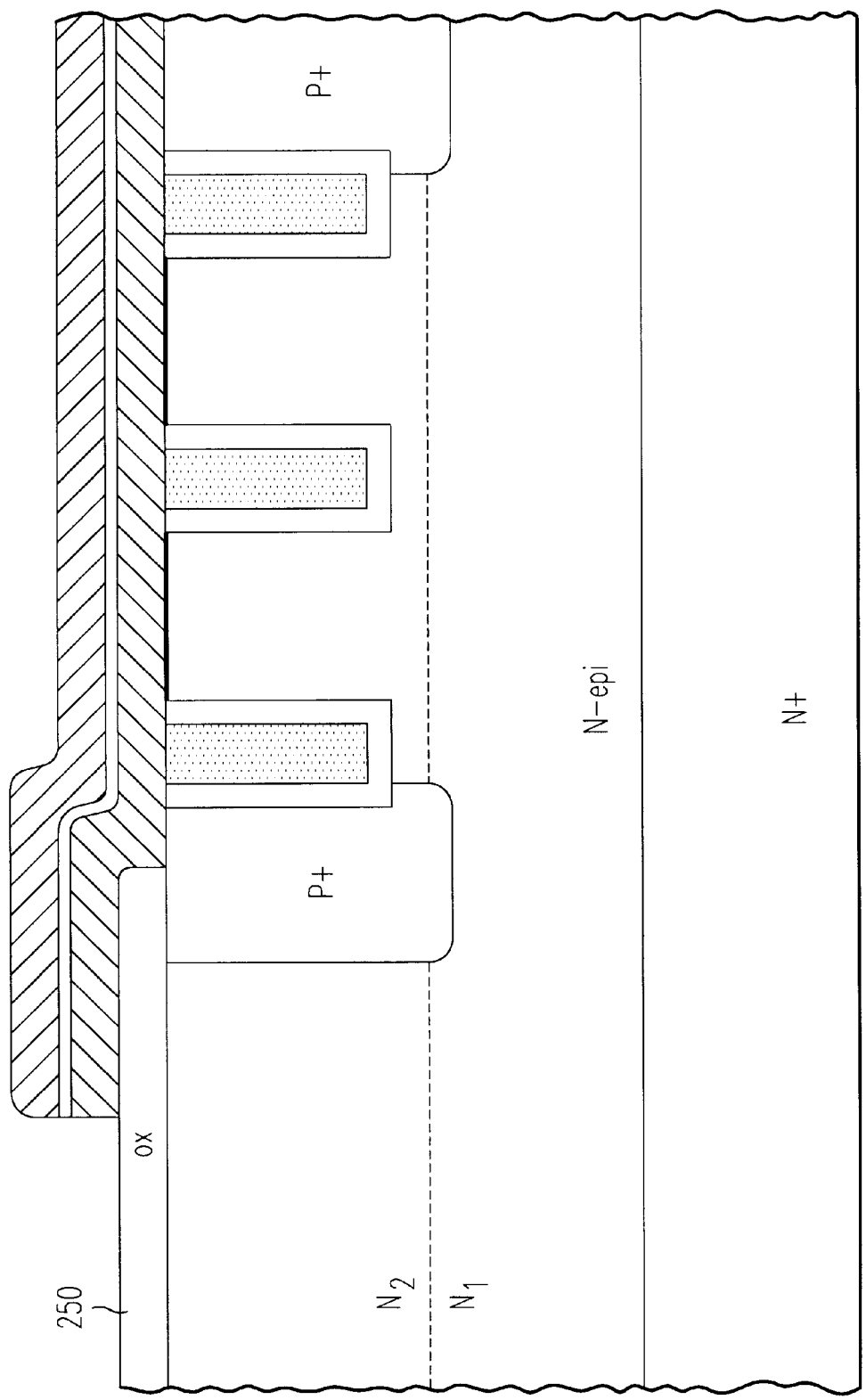

Next the trench is masked (mask #2) and etched as shown in FIG. 30c, followed by a sacrificial oxidation, sacrificial oxide removal, gate oxide formation, polysilicon deposition, doping, etchback planarization, oxidation to form a field oxide, and active mask oxide etch to remove oxide in all active areas but not in the field oxide regions. Next the barrier adjust implant is performed, as shown in FIG. 30d, followed by the Schottky and top metal depositions and photomasking (mask #4), as shown in FIG. 30e (which also shows the Schottky and top metal layers extending onto the field oxide 250 in a termination region of the device.

Figure 31B:
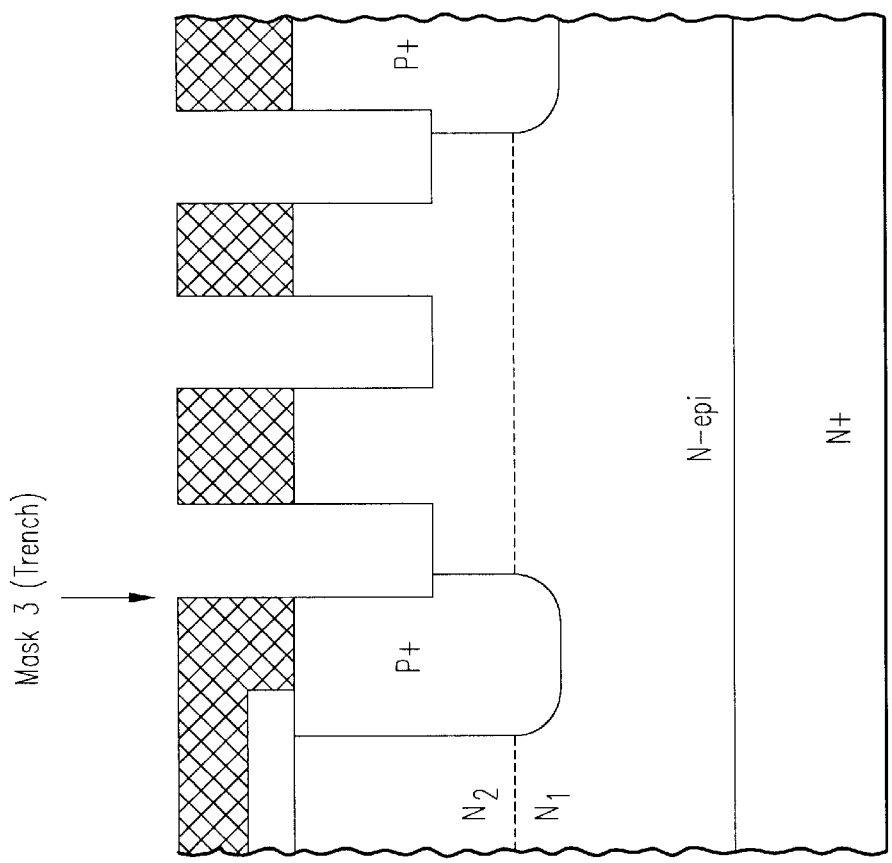
FIGS. 31a and 31b and 33a and 33b are cross-sectional views illustrating the steps of a process of fabricating a voltage-clamped trench-gated Schottky diode in which the clamping diode is formed a mask defining the active areas of the device.
Figure 31A:
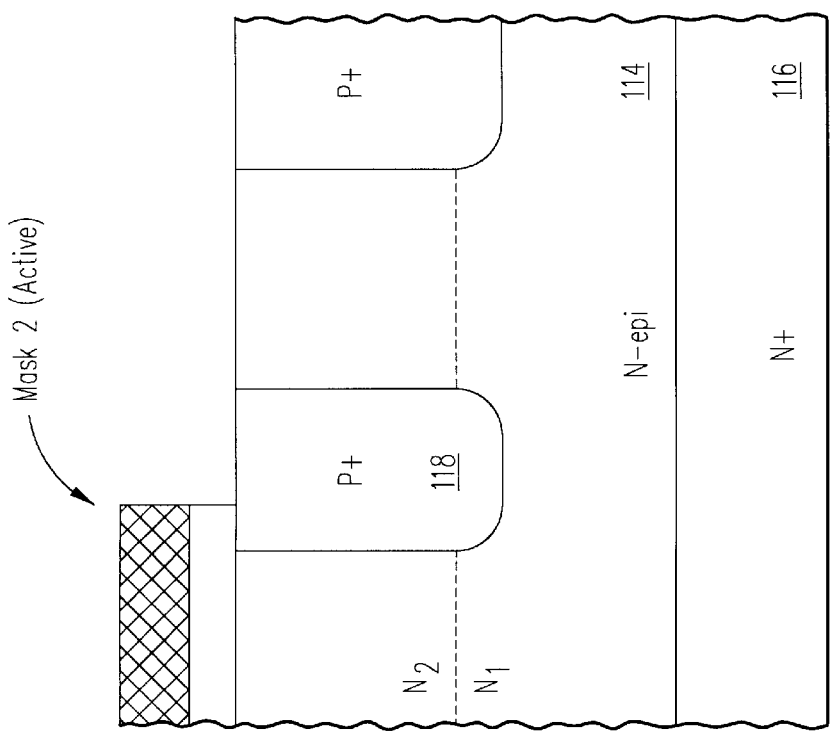

In the sequence of FIGS. 31a and 31b, the active mask etch is performed in the oxide present after the deep P+ diffusion but prior to trench etch. After the trenches are etched, the process sequence proceeds as shown in FIGS. 24b, 24c, 24e and 24f. This sequence represents the preferred process flow because it minimizes the risk of P+ outgassing into other device regions.

In another version, the mask for the trench is silicon nitride. After the trench is etched, it is oxidized and then the nitride is removed. Instead of using polysilicon to planarize the device, the Schottky metal is then deposited into the trench as well as onto the top of the mesa. In this manner no contact mask is required. Numerous variants of this process exist where the sequence is changed but the device still produces a voltage clamped trench Schottky diode.

Figure 33A:
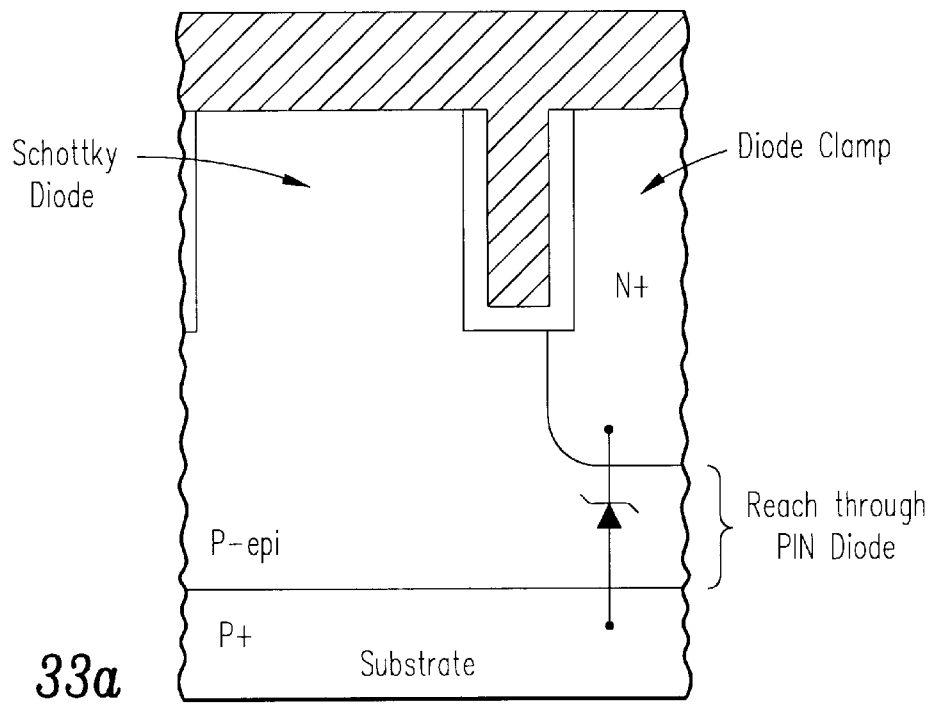
Figure 33B:
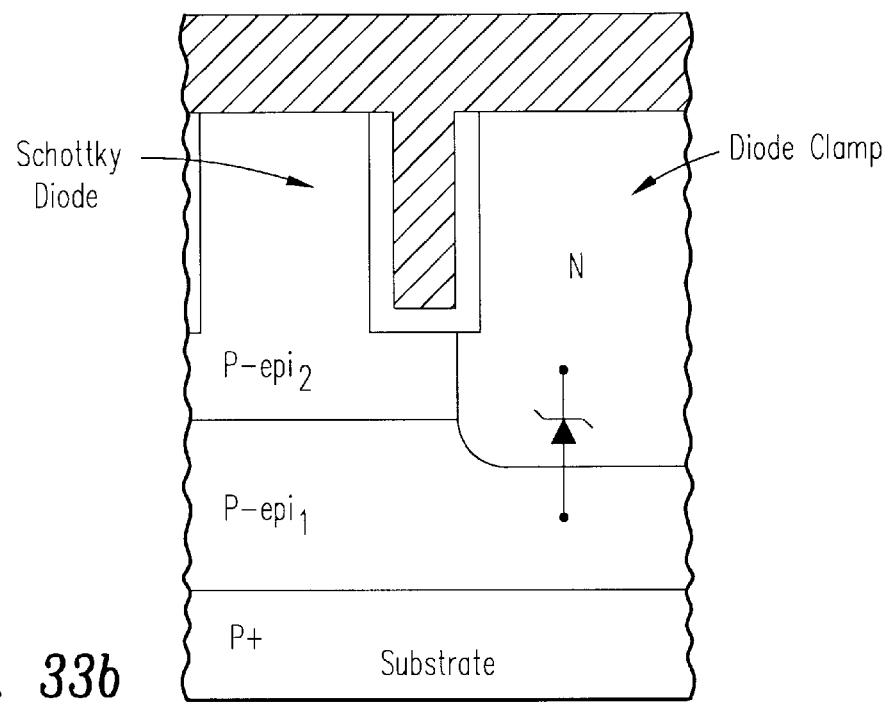

While numerous embodiments and variants thereof in accordance with this invention have been described, it is to be understood that all such embodiments and variants are illustrative and not limiting. For example, while the embodiments described above generally use N-type material at the metal-semiconductor interface, it will be understood that embodiments may also be fabricated using P-type material at the metal-semiconductor interface, as shown in FIGS. 33a and 33b. In that event, the clamping diode is formed by an N-type diffusion. Many other embodiments consistent with the broad principles of this invention will be apparent to those skilled in the art.

We claim:

1. A trench-gated Schottky barrier diode comprising:
   a semiconductor body having first and second trenches formed at a surface thereof, said trenches being separated by a mesa, said mesa being doped with atoms of a first conductivity type;
   a metal layer in contact with at least a portion of a surface of said mesa, said metal layer being selected and said mesa being doped such that a rectifying Schottky interface is formed between said metal layer and said surface of said mesa;
   a gate electrode disposed within said trenches, said trenches being lined with a dielectric material such that said gate electrode is electrically insulated from said mesa; and
   a PN junction clamping diode formed in said semiconductor body, said clamping diode being fabricated in parallel with a current path through said mesa, wherein said PN junction is between a diffusion of a second conductivity type opposite to said first conductivity type and a region of the first conductivity type in said semiconductor body, said diffusion extending to a level deeper than said trenches.

2. The trench-gated Schottky barrier diode of claim 1 wherein said gate electrode is in ohmic contact with said metal layer.

3. The trench-gated Schottky barrier diode of claim 1 wherein said clamping diode has a breakdown voltage which is lower in terms of absolute value than a breakdown voltage of said Schottky interface.

4. The trench-gated Schottky barrier diode of claim 3 wherein the breakdown voltage of said clamping diode is in the range of 80–100 V and the breakdown voltage of said Schottky interface is greater than 100 V.

5. The trench-gated Schottky barrier diode of claim 3 wherein the breakdown voltage of said clamping diode is in the range of 60–80 V and the breakdown voltage of said Schottky interface is greater than 80 V.

6. The trench-gated Schottky barrier diode of claim 3 wherein the breakdown voltage of said clamping diode is in the range of 30–60 V and the breakdown voltage of said Schottky interface is greater than 60 V.

7. The trench-gated Schottky barrier diode of claim 3 wherein the breakdown voltage of said clamping diode is in the range of 60–80 V and said mesa is doped with atoms of said first conductivity type to a concentration of $1 \cdot 10^{15}$ cm$^{-3}$ to $1 \cdot 10^{16}$ cm$^{-3}$.

8. The trench-gated Schottky barrier diode of claim 3 wherein the breakdown voltage of said clamping diode is in the range of 30–60 V and said mesa is doped with atoms of said first conductivity type to a concentration of $1 \cdot 10^{16}$ cm$^{-3}$ to $1 \cdot 10^{17}$ cm$^{-3}$.

9. The trench-gated Schottky barrier diode of claim 1 wherein said semiconductor body comprises an epitaxial layer overlying a substrate.

10. The trench-gated Schottky barrier diode of claim 9 wherein a net epi layer thickness between said PN junction and said substrate is between 1 and 4 μm.

11. The trench-gated Schottky barrier diode of claim 9 wherein a portion of said epitaxial layer below the said diffusion is fully depleted when said clamping diode undergoes avalanche breakdown.

12. The trench-gated Schottky barrier diode of claim 9 wherein a background dopant concentration in the vicinity of said clamping diode is higher than a background dopant concentration in said mesa.

13. The trench-gated Schottky barrier diode of claim 9 wherein said epitaxial layer has a stepped or graded dopant concentration profile and said diffusion penetrates into a region of said epitaxial layer where the dopant concentration is higher than the dopant concentration of said epitaxial layer in the vicinity of a bottom of said trench.

14. The trench-gated Schottky barrier diode of claim 9 further comprising a buried layer of said first conductivity type, said buried layer being located generally beneath said diffusion.

15. The trench-gated Schottky barrier diode of claim 14 wherein said buried layer has a peak dopant concentration at an interface between said epitaxial layer and said substrate.

16. The trench-gated Schottky barrier diode of claim 9 further comprising an implanted or diffused region of said first conductivity type, said implanted or diffused region having a dopant concentration generally higher than a background dopant concentration of said epitaxial layer and extending laterally beyond said diffusion.

17. A trench-gated Schottky barrier diode comprising:
   a semiconductor body having first and second trenches formed at a surface thereof, said trenches being separated by a mesa, said mesa being doped with atoms of a first conductivity type;
   a metal layer in contact with at least a portion of a surface of said mesa, said metal layer being selected and said mesa being doped such that a rectifying Schottky interface is formed between said metal layer and said surface of said mesa;
   a gate electrode disposed within said trenches, said trenches being lined with a dielectric material such that said gate electrode is electrically insulated from said mesa; and
   a PN junction clamping diode formed in said semiconductor body, said clamping diode being fabricated in parallel with a current path through said mesa, wherein said PN junction is between a diffusion of a second conductivity type opposite to said first conductivity type and a region of the first conductivity type in said semiconductor body, said semiconductor body comprises an epitaxial layer overlying a substrate, and said trenches extend to a level deeper than said diffusion.

18. The trench-gated Schottky barrier diode of claim 17 further comprising a buried layer of said first conductivity type, said buried layer being located generally beneath said diffusion and having a dopant concentration generally higher than a background dopant concentration of said epitaxial layer.

19. The trench-gated Schottky barrier diode of claim 17 further comprising an implanted or diffused region of said first conductivity type, said implanted or diffused region having a dopant concentration generally higher than a background dopant concentration of said epitaxial layer and extending laterally beyond said diffusion.

20. The trench-gated Schottky barrier diode of claim 17 further comprising an implanted or diffused region of said first conductivity type, wherein said implanted or diffused region has a dopant concentration generally higher than a background dopant concentration of said epitaxial layer, and said implanted or diffused region is between two regions of said second conductivity type.

21. A trench-gated Schottky barrier diode comprising:
a semiconductor body having first and second trenches formed at a surface thereof, said trenches being separated by a mesa, said mesa being doped with atoms of a first conductivity type;
a metal layer in contact with at least a portion of a surface of said mesa, said metal layer being selected and said mesa being doped such that a rectifying Schottky interface is formed between said metal layer and said surface of said mesa;
a gate electrode disposed within said trenches, said trenches being lined with a dielectric material such that said gate electrode is electrically insulated from said mesa; and
a PN junction clamping diode formed in said semiconductor body, said clamping diode being fabricated in parallel with a current path through said mesa, wherein said PN junction is between a diffusion of a second conductivity type opposite to said first conductivity type and a region of the first conductivity type in said semiconductor body, and said PN junction has a radius of junction curvature where $r \leq 2 \mu m$.

22. The trench-gated Schottky barrier diode of claim 21 wherein said radius of curvature is determined by the depth of said diffusion.

23. The trench-gated Schottky barrier diode of claim 21 wherein said radius of curvature is determined by at least one sharp corner of said diffusion.

24. The trench-gated Schottky barrier diode of claim 1 comprising a plurality of said Schottky interfaces, each of said Schottky interfaces being located in a Schottky cell, and a plurality of said clamping diodes, said clamping diodes being positioned in clamping diode cells at predetermined intervals throughout said Schottky barrier diode.

25. The trench-gated Schottky barrier diode of claim 24 wherein said Schottky cells and said clamping diode cells are in the form of stripes.

26. The trench-gated Schottky barrier diode of claim 24 wherein said Schottky cells and said clamping diode cells are in the form of closed polygons.

27. The trench-gated Schottky barrier diode of claim 24 wherein said Schottky cells are in the form of stripes and said clamping diode cells are in the form of closed polygons.

28. The trench-gated Schottky barrier diode of claim 24 wherein said Schottky cells are in the form of closed polygons and said clamping diode cells are in the form of stripes.

29. The trench-gated Schottky barrier diode of claim 1 wherein said diffusion is located in a junction termination at a periphery of said Schottky barrier diode.

30. The trench-gated Schottky barrier diode of claim 1 wherein said dielectric material comprises an oxide layer.

31. The trench-gated Schottky barrier diode of claim 30 wherein said clamping diode has a breakdown voltage in the range of 4 to 5 MV/cm times a thickness of said oxide layer.

32. The trench-gated Schottky barrier diode of claim 31 wherein said trenches extend into a heavily doped substrate.

33. The trench-gated Schottky barrier diode of claim 31 wherein said trenches extend into a relatively heavily doped portion of an epitaxial layer having a stepped or graded dopant concentration.

34. The trench-gated Schottky barrier diode of claim 1 wherein said metal layer forms an anode of the Schottky barrier diode and wherein a diffused P-type region forms an anode of said clamping diode.

35. The trench-gated Schottky barrier diode of claim 34 wherein said semiconductor body comprises N-type silicon, said N-type silicon forming a cathode of said Schottky barrier diode.

36. The trench-gated Schottky barrier diode of claim 1 wherein said metal layer forms a cathode of the Schottky barrier diode and wherein a diffused N-type region forms an cathode of said clamping diode.

37. The trench-gated Schottky barrier diode of claim 36 wherein said semiconductor body comprises P-type silicon, said P-type silicon forming a cathode of said Schottky barrier diode.

38. The trench-gated Schottky barrier diode of claim 1 wherein said metal layer is in contact with substantially the entire top surface of said mesa.

39. The trench-gated Schottky barrier diode of claim 1 wherein said metal layer is in contact with a portion of the top surface of said mesa.

40. The trench-gated Schottky barrier diode of claim 1 wherein the Schottky barrier height is adjusted by an ion implanted layer of dopant atoms.

41. The trench-gated Schottky barrier diode of claim 1 comprising a barrier adjust implant at said surface of said mesa.

42. The trench-gated Schottky barrier diode of claim 1 wherein said metal layer comprises platinum silicide.

43. The trench-gated Schottky barrier diode of claim 1 wherein said metal layer comprises titanium disilicide.

44. The trench-gated Schottky barrier diode of claim 1 wherein said metal layer makes a non-rectifying contact with said diffusion.

45. The trench-gated Schottky barrier diode of claim 44 wherein said metal layer covers substantially the entire Schottky barrier diode.

46. The trench-gated Schottky barrier diode of claim 1 further comprising a second metal layer overlying said metal layer.

47. The trench-gated Schottky barrier diode of claim 46 wherein said second metal layer is aluminum.

48. The trench-gated Schottky barrier diode of claim 46 wherein said second metal layer is gold.

49. The trench-gated Schottky barrier diode of claim 46 wherein said second metal layer is a sandwich comprising titanium, nickel and silver.

50. The trench-gated Schottky barrier diode of claim 46 wherein said second metal layer is a sandwich comprising titanium, nickel and gold.

51. The trench-gated Schottky barrier diode of claim 17 further comprising a second metal layer overlying said metal layer.

52. The trench-gated Schottky barrier diode of claim 51 wherein said second metal layer extends laterally beyond said metal layer and makes a non-rectifying contact with said diffusion.

53. The trench-gated Schottky barrier diode of claim 52 wherein said second metal layer is aluminum.

54. The trench-gated Schottky barrier diode of claim 52 wherein said second metal layer is gold.

55. The trench-gated Schottky barrier diode of claim 52 wherein said second metal layer is a sandwich comprising titanium, nickel and silver.

56. The trench-gated Schottky barrier diode of claim 52 wherein said second metal layer is a sandwich comprising titanium, nickel and gold.

57. The trench-gated Schottky barrier diode of claim 1 wherein said gate electrode and said metal layer are formed of the same material.

58. A trench-gated Schottky barrier diode comprising:

a semiconductor body having first and second trenches formed at a surface thereof, said trenches being separated by a mesa, said mesa being doped with atoms of a first conductivity type;

a metal layer in contact with at least a portion of a surface of said mesa, said metal layer being selected and said mesa being doped such that a rectifying Schottky interface is formed between said metal layer and said surface of said mesa;

a gate electrode disposed within said trenches, said trenches being lined with a dielectric material such that said gate electrode is electrically insulated from said mesa; and a PN junction clamping diode formed in said semiconductor body, said clamping diode being fabricated in parallel with a current path through said mesa, wherein said metal layer is formed of a first metal and said gate electrode is formed of a second metal different from said first metal.

59. A trench-gated Schottky barrier diode comprising:

a semiconductor body having first and second trenches formed at a surface thereof, said trenches being separated by a mesa, said mesa being doped with atoms of a first conductivity type;

a metal layer in contact with at least a portion of a surface of said mesa, said metal layer being selected and said mesa being doped such that a rectifying Schottky interface is formed between said metal layer and said surface of said mesa;

a gate electrode disposed within said trenches, said trenches being lined with a dielectric material such that said gate electrode is electrically insulated from said mesa; and a PN junction clamping diode formed in said semiconductor body, said clamping diode being fabricated in parallel with a current path through said mesa, wherein said gate electrode is formed of doped polysilicon.

60. A trench-gated Schottky barrier diode comprising:

a semiconductor body having first and second trenches formed at a surface thereof, said trenches being separated by a mesa, said mesa being doped with atoms of a first conductivity type;

a metal layer in contact with at least a portion of a surface of said mesa, said metal layer being selected and said mesa being doped such that a rectifying Schottky interface is formed between said metal layer and said surface of said mesa;

a gate electrode disposed within said trenches, said trenches being lined with a dielectric material such that said gate electrode is electrically insulated from said mesa; and a PN junction clamping diode formed in said semiconductor body, said clamping diode being fabricated in parallel with a current path through said mesa, said PN junction formed such that an avalanche breakdown is located away from said trenches.

61. The trench-gated Schottky barrier diode of claim 60 wherein said clamping diode has a breakdown voltage which is lower in terms of absolute value than a breakdown voltage of said Schottky interface.

62. The trench-gated Schottky barrier diode of claim 61 wherein the breakdown voltage of said clamping diode is in the range of 80–100 V and the breakdown voltage of said Schottky interface is greater than 100 V.

63. The trench-gated Schottky barrier diode of claim 61 wherein the breakdown voltage of said clamping diode is in the range of 60–80 V and the breakdown voltage of said Schottky interface is greater than 80 V.

64. The trench-gated Schottky barrier diode of claim 61 wherein the breakdown voltage of said clamping diode is in the range of 30–60 V and the breakdown voltage of said Schottky interface is greater than 60 V.

65. The trench-gated Schottky barrier diode of claim 61 wherein the breakdown voltage of said clamping diode is in the range of 60–80 V and said mesa is doped with atoms of said first conductivity type to a concentration of $1 \cdot 10^{15}$ cm$^{-3}$ to $1 \cdot 10^{17}$ cm$^{-3}$.

66. The trench-gated Schottky barrier diode of claim 61 wherein the breakdown voltage of said clamping diode is in the range of 30–60 V and said mesa is doped with atoms of said first conductivity type to a concentration of $1 \cdot 10^{16}$ cm$^{-3}$ to $1 \cdot 10^{17}$ cm$^{-3}$.

* * * * *